(12) United States Patent
Nikipelov et al.

(10) Patent No.: US 11,673,169 B2
(45) Date of Patent: Jun. 13, 2023

(54) MEMBRANE CLEANING APPARATUS

(71) Applicant: ASML NETHERLANDS B.V., Veldhoven (NL)

(72) Inventors: Andrey Nikipelov, Eindhoven (NL); Dmitry Kurilovich, Hertogenbosch (NL); Fabio Sbrizzai, Heeze (NL); Marcus Adrianus Van de Kerkhof, Helmond (NL); Ties Wouter Van der Woord, Eindhoven (NL); Willem Joan Van der Zande, Bussum (NL); Jeroen Van Duivenbode, Veldhoven (NL); David Ferdinand Vles, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/294,013

(22) PCT Filed: Nov. 22, 2019

(86) PCT No.: PCT/EP2019/082184
§ 371 (c)(1),
(2) Date: May 14, 2021

(87) PCT Pub. No.: WO2020/109152
PCT Pub. Date: Jun. 4, 2020

(65) Prior Publication Data
US 2022/0008963 A1    Jan. 13, 2022

(30) Foreign Application Priority Data

Nov. 27, 2018 (EP) ..................................... 18208555
May 10, 2019 (EP) ..................................... 19173742
Jun. 14, 2019 (EP) ..................................... 19180219

(51) Int. Cl.
*B08B 6/00* (2006.01)
*B08B 7/02* (2006.01)
(Continued)

(52) U.S. Cl.
CPC .................. *B08B 6/00* (2013.01); *B08B 7/02* (2013.01); *B08B 7/04* (2013.01); *G03F 1/62* (2013.01); *G03F 1/82* (2013.01)

(58) Field of Classification Search
CPC .... B08B 6/00; B08B 7/02; B08B 7/04; G03F 1/62; G03F 1/82
See application file for complete search history.

(56) References Cited

U.S. PATENT DOCUMENTS

2001/0005944 A1    7/2001  Dao et al.
2002/0096647 A1    7/2002  Moors et al.
(Continued)

FOREIGN PATENT DOCUMENTS

JP       S6057841       4/1985
JP       2011141361     7/2011
(Continued)

OTHER PUBLICATIONS

Machine translation of KR 20090122647 (Year: 2009).*
(Continued)

*Primary Examiner* — Erin F Bergner
(74) *Attorney, Agent, or Firm* — Pillsbury Winthrop Shaw Pittman, LLP

(57) ABSTRACT

A membrane cleaning apparatus for removing particles from a membrane, the apparatus including a membrane support and an electric field generating mechanism. The membrane support is for supporting the membrane. The electric field generating mechanism is for generating an electric field in the vicinity of the membrane when supported by the membrane support. The electric field generating mechanism may (Continued)

include: one or more collector electrodes; and a mechanism for applying a voltage across a membrane supported by the membrane support and the or each of the one or more collector electrodes.

20 Claims, 14 Drawing Sheets

(51) Int. Cl.
*B08B 7/04* (2006.01)
*G03F 1/62* (2012.01)
*G03F 1/82* (2012.01)

(56) References Cited

U.S. PATENT DOCUMENTS

| | | |
|---|---|---|
| 2011/0037960 A1 | 2/2011 | Scaccabarozzi et al. |
| 2013/0070218 A1 | 3/2013 | Ivanov et al. |
| 2014/0014138 A1 | 1/2014 | Spiegelman et al. |
| 2016/0274471 A1 | 9/2016 | Lee et al. |

FOREIGN PATENT DOCUMENTS

| | | |
|---|---|---|
| KR | 20020087165 | 11/2002 |
| KR | 20090122647 | 12/2009 |
| WO | 2009129960 | 10/2009 |

OTHER PUBLICATIONS

International Search Report and Written Opinion issued in corresponding PCT Patent Application No. PCT/EP2019/082184, dated Feb. 11, 2020.
"Research Disclosure", Kenneth Mason Publications, vol. 628, No. 29, p. 603 (Aug. 1, 2016).

* cited by examiner

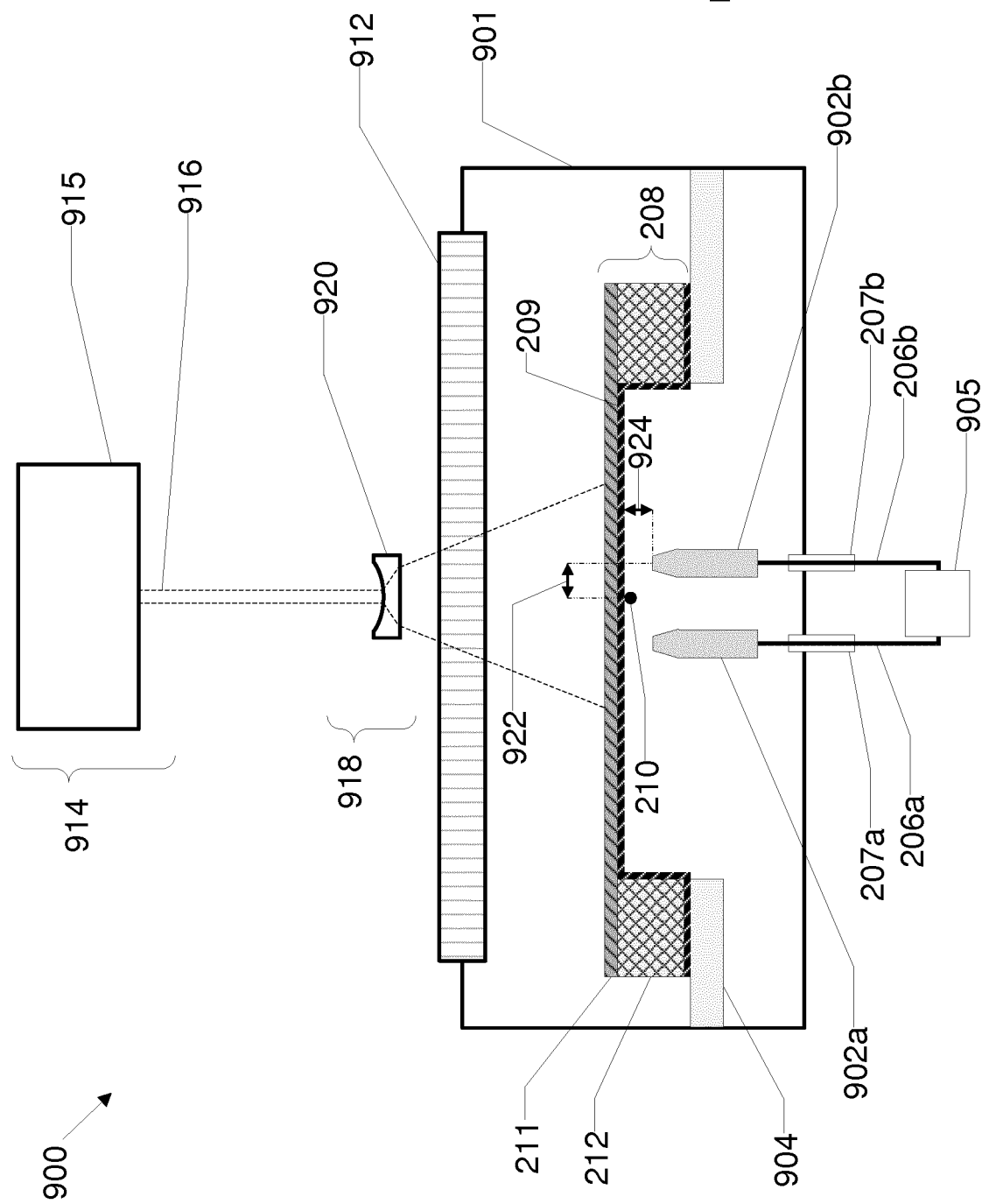

MEMBRANE CLEANING APPARATUS

CROSS-REFERENCE TO RELATED APPLICATIONS

This application is the U.S. national phase entry of PCT Patent Application No. PCT/EP2019/082184 which was filed on Nov. 22, 2019, which claims the benefit of priority of European Patent Application No. 18208555.5 which was filed on Nov. 27, 2018, of European Patent Application No. 19173742.8 which was filed on May 10, 2019, of European Patent Application No. 19180219.8 which was filed on Jun. 14, 2019, each of which is incorporated herein in its entirety by reference.

FIELD

The present invention relates to a membrane cleaning apparatus and an associated method. The apparatus and method have particular application for cleaning a pellicle used in a lithographic apparatus.

BACKGROUND

A lithographic apparatus is a machine constructed to apply a desired pattern onto a substrate. A lithographic apparatus may, for example, project a pattern provided on a patterning device (e.g., a mask) onto a layer of radiation-sensitive material provided on a substrate (e.g., a silicon wafer). A lithographic apparatus can be used in the manufacture of integrated circuits.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Unwanted particles present on a patterning device may contribute to a pattern imparted to a beam of radiation. In a lithographic apparatus, this can lead to errors in the pattern applied to the substrate. It is therefore important to prevent particles from reaching, and thereby contaminating, the patterning device. It is known to provide a membrane between a patterning device and sources of particles in a lithographic apparatus to prevent particles from reaching the patterning device. A membrane used for such a purpose is known in the art as a pellicle.

The pellicle is spaced from the patterning device such that it is not in a field plane and therefore any particles disposed on the pellicle should not be imaged (and therefore should not contribute to errors in the pattern applied to the substrate). However, particles on the pellicle may result in increased absorption of the radiation during exposure of a substrate and therefore result in local hot spots on the pellicle that may lead to failure of the pellicle. In addition, particles on a surface of the pellicle which faces the patterning device may be transferred to the patterning device whereby they can cause errors in the pattern applied to the substrate.

It may be desirable to provide an apparatus and associated method for cleaning a membrane (e.g., a pellicle).

SUMMARY

According to a first aspect of the invention there is provided a membrane cleaning apparatus for removing particles from a membrane, the apparatus comprising: a membrane support for supporting the membrane; and an electric field generating mechanism for generating an electric field in the vicinity of the membrane when supported by the membrane support.

The apparatus according to the first aspect of the invention provides an arrangement wherein particles can be removed from a membrane using an electric field. In use, a membrane can be supported by the membrane support. The electric field generating mechanism can be used to generate an electric field in the vicinity of the membrane when supported by the membrane support so as to dislodge particles from a surface of the membrane. Additionally or alternatively, the electric field generating mechanism can be used to generate an electric field in the vicinity of the membrane when supported by the membrane support so as to transport particles away from a surface of the membrane.

It will be appreciated that as used here, electric field generating mechanism is intended to mean any arrangement of apparatus which can generate an electric field. In particular the term electric field generating mechanism is not intended to imply any mechanical moving parts.

The electric field generating mechanism may comprise: one or more collector electrodes; and a mechanism for applying a voltage across a membrane supported by the membrane support and the or each of the one or more collector electrodes.

This provides a convenient mechanism for generating an electric field in the vicinity of the membrane.

The apparatus may comprise a mechanism for inducing mechanical oscillations in the membrane when supported by the membrane support.

Advantageously, such an arrangement is particularly suitable for cleaning of a membrane, which may be relatively thin and flexible, as now discussed.

The mechanism for inducing mechanical oscillations in the membrane will, in turn, also induce mechanical oscillations in particles situated on the membrane. This oscillation of such particles situated on the membrane may be sufficiently large to remove particles from the membrane. In turn, any such particles which are removed by the mechanism for inducing mechanical oscillations may be transported away from the membrane by the electric field generated by the electric field generating mechanism.

The mechanism for inducing mechanical oscillations may induce the mechanical oscillations via pulsed electrostatic pressure.

The mechanism for inducing mechanical oscillations in the membrane when supported by the membrane support may comprise: an excitation electrode; and a mechanism for applying a time-varying voltage across the excitation electrode and the membrane supported by the membrane support.

When a time-varying voltage is applied across the excitation electrode and the membrane supported by the membrane support, a time-varying electrostatic force will be exerted between the excitation electrode and the membrane. Since the membrane is flexible, this will cause the membrane to distort in a time-varying manner, and undergo mechanical oscillation.

In some embodiments, the excitation electrode of the mechanism for inducing mechanical oscillations in the membrane may also function as a collection electrode of the electric field generating mechanism.

The mechanism for inducing mechanical oscillations in the membrane when supported by the membrane support may comprise: two electrodes positionable proximate to a surface of the membrane when supported by the membrane support; and a mechanism for applying a time-varying voltage across the two electrodes.

When the time-varying voltage is applied across the two electrodes, time-varying surface charges will be induced in the membrane. In turn, this will result in a time-varying electrostatic force acting on the membrane (as a result of the induced surface charge). Such an arrangement therefore allows for mechanical oscillations to be induced in the membrane via induced surface charge.

The two electrodes may be adjacent to each other. The two electrodes may be movable relative to the membrane support such that they can scan across the surface of the membrane when supported by the membrane support.

When the mechanism applies a time-varying voltage across the two electrodes an electric potential of the membrane may be floating (i.e. not fixed) or, alternatively, may be fixed (either at ground or with a DC biasing voltage).

The mechanism for inducing mechanical oscillations in the membrane when supported by the membrane support may comprise: two electrodes, each electrode positionable proximate to different one of two opposed surfaces of the membrane when supported by the membrane support; and a mechanism for applying a time-varying voltage to each of the two electrodes.

For such embodiments, the electric field generating mechanism is operable (via the two electrodes on opposite sides of the membrane) to generate an electric field in the vicinity of two opposed surfaces of the membrane when supported by the membrane support. The electric field in the vicinity of the two opposed surfaces of the membrane may be in opposite directions. It will be appreciated that in order to induce mechanical oscillations in the membrane the electric field generated in the vicinity of one of the two opposed surfaces of the membrane may be different to the electric field generated in the vicinity of the other one of the two opposed surfaces of the membrane.

The two electrodes and the mechanism for applying a time-varying voltage to each of the two electrodes may be arranged such that a time-averaged pressure exerted on one of the two opposed surfaces by the two electrodes is substantially equal in magnitude and opposite in direction to a time-averaged pressure exerted on the other one of the two opposed surfaces by the two electrodes.

For example, a magnitude of the time-averaged pressure exerted on the two opposed surfaces by the two electrodes may be equal to within 50%, for example within 10%. For example, a time-averaged electrostatic pressure applied to the membrane may be substantially zero. The time-averaged electrostatic pressure may be averaged over a time period of between 10 us and 10 ms.

The mechanism for applying a time-varying voltage to each of the two electrodes may be arranged such that: a waveform of the voltage applied to one of the two electrodes is substantially equal to a waveform of the time-varying voltage applied to the other one of the two electrodes; and a magnitude of the voltage applied to one of the two electrodes is substantially equal to a magnitude of the time-varying voltage applied to the other one of the two electrodes.

With such an arrangement, a capacitive coupling of the membrane and each of the two electrodes may be substantially the same. For example, the two electrodes may have substantially the same area and may be disposed at substantially the same distance from the membrane. A polarity of the voltage applied to one of the two electrodes may be either the same as, or opposite to, a polarity of the time-varying voltage applied to the other one of the two electrodes.

Even for embodiments wherein a time-averaged electrostatic pressure across the membrane is zero and/or wherein the waveform and magnitude of the voltages applied to the two electrodes are substantially the same, it will be appreciated that in order to induce mechanical oscillations in the membrane the electric field generated in the vicinity of two opposed surfaces of the membrane may be different. Therefore, two electrodes and/or the mechanism for applying a time-varying voltage to each of the two electrodes may be arranged to ensure that the electric field generated in the vicinity of two opposed surfaces of the membrane is different.

In some embodiments, it may be that a position of one of the electrodes, in a plane parallel to the plane of the membrane, does not align with a position of the other electrode.

That is, although on opposite sides of the membrane the two collector electrodes may be described as being laterally offset from each other. With such an arrangement, the electric fields generated on opposite sides of the membrane will also be offset. As such, each electrode will exert an attractive force on different portions of the membrane and mechanical oscillations in the membrane will be induced (even when identical voltages are applied to the two electrodes).

For such embodiments, the time-varying voltage applied to one of the two electrodes may be substantially in phase with the time-varying voltage applied to the other one of the two electrodes.

The two electrodes may be positioned such that a maximum distance between the two collector electrodes in a plane parallel to the plane of the membrane is 1 cm. This distance may be referred to as a lateral offset. The two electrodes may be positioned such that a maximum distance between the two electrodes, in a plane parallel to the plane of the membrane, is 1 mm.

The mechanism for applying a time-varying voltage to the two electrodes may be configured such that the two electrodes are held at voltages which are substantially equal in magnitude and opposite in polarity.

In some embodiments, there may be a non-zero phase difference between the time-varying voltage applied to one of the two electrodes and the time-varying voltage applied to the other one of the two electrodes.

For such embodiments, a position of one of the electrodes, in a plane parallel to the plane of the membrane, may generally align with a position of the other electrode.

The electric field generating mechanism for generating an electric field in the vicinity of the membrane when supported by the membrane support may be operable to generate an electric field in the vicinity of the two opposed surfaces of the membrane having a magnitude of at least 100 kV/m.

For example, in some embodiments, the electric field in the vicinity of the two opposed surfaces of the membrane may have a magnitude of at least 1 MV/m.

The apparatus may further comprise a mechanism for applying a voltage to a membrane when supported by the membrane support.

The mechanism for applying a voltage to a membrane when supported by the membrane support may be configured such that a polarity of the voltage applied to the membrane is opposite to a polarity of the voltage applied to the two electrodes.

The apparatus may further comprise a mechanism operable to hold the membrane at a voltage close to or equal to ground.

For example, the apparatus may be configured so as to maintain a voltage of the membrane between −100 V and +100 V. For example, the apparatus may be configured so as to maintain a voltage of the membrane between −10 V and +10 V.

The mechanism operable to hold the membrane at a voltage close to or equal to ground may comprise one or more auxiliary electrodes positionable proximate to of the two opposed surfaces of a membrane when supported by the membrane support, and a mechanism arranged to maintain the one or more auxiliary electrodes at a voltage close to or equal to ground.

The apparatus may be configured such that the magnitude of an electric field between the membrane and an electrode is at least a factor of ten greater than the magnitude of an electric field between the membrane and an auxiliary electrode.

For example, the apparatus may be configured such that the magnitude of an electric field between the membrane and an electrode is at least a factor of one hundred greater than the magnitude of an electric field between the membrane and an auxiliary electrode.

An area of a surface of each of the electrodes closest to the membrane may be smaller than the area of the membrane.

An area of a surface of each of the electrodes closest to the membrane may be less than or equal to 1 cm$^2$. For example, the area of the surface of each of the two electrodes closest to the membrane may be less than or equal to 10 mm$^2$.

A largest dimension of each of the electrodes may be aligned perpendicular to the plane of the membrane.

The or each electrode may be positioned such that, in use, a maximum distance between an electrode and the membrane supported by the membrane support is 5 mm. For example, the or each electrode may be positioned such that, in use, a maximum distance between an electrode and the membrane supported by the membrane support is 0.5 mm.

The time-varying voltage may comprise a plurality of temporally spaced pulses.

Advantageously, this arrangement will excite oscillations with a range of different frequencies. By controlling the repetition rate of the pulses and/or the shape of the pulses, the range of different frequencies of oscillations that are excited may be controlled.

The application of a pulsed voltage across the excitation electrode and the membrane can create a pulsed electric field in between the excitation electrode and membrane. The pulsed electric field can exert a force that acts to bring the electrode and membrane towards each other. The electrode and membrane support may be generally disposed so that they are fixed within the apparatus as a whole. In use, the membrane may be generally disposed so that it is supported by the membrane support only at the periphery of the membrane. The applied force can therefore cause an acceleration of the portion of the membrane which is not supported by the membrane support in the direction of the electrode. During the portion of the voltage pulse where no electric field is generated, the membrane accelerates in the reverse direction to the acceleration caused by the electric field (for example due to a tension in the membrane). As the on-off nature of the electric field is repeated, this gives rise to mechanical oscillations of the membrane.

A duration of each of the plurality of temporally spaced pulses may be less than 10 us. For example, a duration of each of the plurality of temporally spaced pulses may be less than 1 us.

The or each time-varying voltage may comprise a plurality of sequential trains of temporally spaced pulses. A duration of each train of pulses may be less than 10 ms. For example, a duration of each train of pulses may be less than 1 ms. By providing pulses in such trains of pulses (also referred to as bursts of pulses), undesirable heating of the membrane may be limited or prevented.

Advantageously, this may prevent rupture of the membrane.

A duty cycle of each of the plurality of sequential trains of temporally spaced pulses may be below 50%. For example, the duty cycle of each of the plurality of sequential trains of temporally spaced pulses may be below 10%.

A duty cycle of each of the plurality of sequential trains of temporally spaced pulses may be sufficiently low that power dissipation in the membrane is below 30 W/cm$^2$ on a time scale of the order of 0.1 to 10 ms. For example, the duty cycle of each of the plurality of sequential trains of temporally spaced pulses may be sufficiently low that power dissipation in the membrane is below 0.3 to 30 W/cm$^2$ on a time scale of the order of 0.1 to 10 ms.

The or each time-varying voltage may comprise a voltage waveform having a general shape and having one or more parameters which can be chosen (and varied) to achieve a desired excitation spectrum.

The or each time-varying voltage may comprise two sequential trains of temporally spaced pulses, a polarity of the two trains of pulses being reversed.

This may be useful to remove both negatively charged and positively charged particles from the membrane.

The mechanism for applying a time-varying voltage (either across the excitation electrode and the membrane supported by the membrane support or across the two electrodes) may be operable to generate a time-varying electric field in the vicinity of the membrane having a magnitude of at least 10 kV/m.

For example the time-varying electric field in the vicinity of the membrane may have a magnitude of at least 100 kV/m. For example, the pulsed voltage applied across the excitation electrode and the membrane may have a maximum of between 100 V and 10000 V and the excitation electrode and the membrane assembly may be disposed so that the separation between the excitation electrode and the membrane is between 1 mm and 10 mm.

The or each time-varying voltage may have a duty cycle of less than 50%.

The time-varying voltage (applied either across the excitation electrode and the membrane supported by the membrane support or across the two electrodes) may have a duty cycle of less than 10%.

Advantageously, this limits the amount of heating up of the membrane by the current charging and discharging the capacitor formed by the film and collecting electrode.

The mechanism for inducing mechanical oscillations in the membrane when supported by the membrane support may comprise: a radiation source operable to produce a pulsed radiation beam which is incident on at least a portion of the membrane supported by the membrane support.

The mechanism for inducing mechanical oscillations may be operable to induce oscillations only in a localised portion of the membrane.

Advantageously, by constraining the mechanical oscillations to a localised portion of the membrane a more precise, quicker and more energy efficient cleaning process may be achieved.

For embodiments wherein the mechanism for inducing mechanical oscillations comprises an excitation electrode, this may be achieved by using an electrode with dimensions that are smaller than those of the membrane.

For embodiments wherein the mechanism for inducing mechanical oscillations comprises a radiation source operable to produce a pulsed radiation beam, this may be achieved by focusing the pulsed radiation beam only on a portion of the membrane.

The mechanism for inducing mechanical oscillations may be operable to induce oscillations at a range of frequencies.

The mechanism for inducing mechanical oscillations may be operable to induce oscillations between 30 kHz and 30 MHz.

For example, the mechanism for inducing mechanical oscillations may be operable to induce oscillations between 100 kHz and 10 MHz.

Advantageously, this can induce resonant oscillation for particles with a range of different sizes, typically in the range 0.5 um to 5 um. The lower limit of the range of frequencies (for example 100 kHz) may be selected to ensure that the frequency range does not approach the resonant frequency of the membrane, where the fundamental mode of the typical EUV full size pellicle is in the range 1-10 kHz.

The mechanism for inducing mechanical oscillations may be operable to remove particles with a dimension between 0.5 and 5 um from the membrane.

The apparatus may further comprise a mechanism for controlling a temperature of at least a portion of the membrane.

By controlling a temperature of a portion of the membrane, a tension of that portion can be controlled. In particular, if the temperature of at least a portion of the membrane can be controlled independently of a frame tensioning the membrane, tension within the membrane can be controlled.

This is particularly advantageous for embodiments comprising a mechanism for inducing mechanical oscillations in the membrane when supported by the membrane support. As explained above the mechanism for inducing mechanical oscillations in the membrane will, in turn, also induce mechanical oscillations in particles situated on the membrane. This oscillation of such particles situated on the membrane may be sufficiently large to remove particles from the membrane. In turn, any such particles which are removed by the mechanism for inducing mechanical oscillations may be transported away from the membrane by the electric field generated by the electric field generating mechanism. In particular, if the mechanism for inducing mechanical oscillations can induce resonant oscillation for particles on the membrane then they may be removed from the membrane. The resonant frequency for oscillations of a particle on a substantially massless membrane is dependent on the tension of the membrane and the mass of the particle. In particular, the resonant frequency for oscillations of a particle on a substantially massless membrane is proportional to a square root of the tension of the membrane and proportional to the inverse of the square root of the mass of the particle. As the tension increases, so too does the resonant frequency which may be desired to provide so as to remove a particle of a given size.

By controlling the temperature of a portion of the membrane, the tension of the membrane can be controlled and so too can the range of particle sizes that can be removed from the membrane for a particular range of oscillation frequencies.

The mechanism for controlling a temperature of the at least a portion of the membrane may comprise a radiation source which is operable to provide radiation to the membrane. The radiation source may comprise a focused light source.

Alternatively, the mechanism for controlling a temperature of the at least a portion of the membrane may comprise an induction heater which is operable to heat the membrane.

The membrane may comprise a material which is electrically and thermally conductive.

The electric field generating mechanism may be operable to generate an electric field in the vicinity of two opposed surfaces of the membrane when supported by the membrane support, the electric field in the vicinity of the two opposed surfaces of the membrane being in opposite directions.

Advantageously, such an arrangement is particularly suitable for cleaning of a membrane, which may be sufficiently thin that it may be liable to rupture under sufficient lateral (out of the plane of the membrane) loading. By applying an electric field in the vicinity of two opposed surfaces of the membrane, the electric field in the vicinity of the two opposed surfaces of the membrane being in opposite directions the pressure on the two sides of the membrane may be at least partially equalised. In turn, this allows larger electric fields to be used, which can provide a greater level of cleaning.

The electric field may be created by two collector electrodes disposed on opposite sides of the plane of the membrane.

An area of a surface of each of the collector electrodes closest to the membrane may be smaller than the area of the membrane.

An area of a surface of each of the collector electrodes closest to the membrane may be less than or equal to 1 cm$^2$. For example, the area of the surface of each of the collector electrodes closest to the membrane may be less than or equal to 10 mm$^2$.

In some embodiments, it may be that a position of one of the collector electrodes, in a plane parallel to the plane of the membrane, does not align with a position of the other collector electrode.

That is, although on opposite sides of the membrane the two collector electrodes may be described as being laterally offset from each other. The two collector electrodes may be positioned such that a maximum distance between the two collector electrodes in a plane parallel to the plane of the membrane is 1 cm. This distance may be referred to as a lateral offset. The two collector electrodes may be positioned such that a maximum distance between the two collector electrodes, in a plane parallel to the plane of the membrane, is 1 mm.

Each of the collector electrodes may be held at a substantially equal voltage, and the apparatus may be configured so as to hold the membrane at a voltage the polarity of which is opposite the polarity of the voltage at which the collector electrodes are held.

The two collector electrodes may be connected together (i.e. they may be at the same potential).

The magnitude of the electric field may be substantially equal on both sides of the membrane.

The electric field in the vicinity of the two opposed surfaces of the membrane may have a magnitude of at least 100 kV/m.

For example, the electric field in the vicinity of the two opposed surfaces of the membrane may have a magnitude of at least 1 MV/m.

The electric field in the vicinity of the two opposed surfaces of the membrane may be a DC (i.e. time invariant) electric field.

At least a portion of one or more collector electrodes may be provided with an insulating coating.

The insulating coatings prevent charge transfer between the collector electrodes and any particles that have been attracted to the collector electrodes from the membrane. This can prevent particles from being transported from the collector electrodes to the membrane. The insulating coatings may have a breakdown strength exceeding the electric fields that will be generated by the voltage supply during use of the membrane cleaning apparatus. Once particles have been transferred electrostatically to the collector electrodes, the insulating coatings prevent charge leaking and reduces the risk of reverse transfer of particles from the collector electrodes to the membrane.

The apparatus may further comprise a plasma generating mechanism.

The plasma generating mechanism may be operable to generate a plasma between a membrane supported by the membrane support and the or each of the one or more collector electrodes.

The plasma between the membrane supported by the membrane support and the or each of the one or more collector electrodes provides a mechanism by which particles on the membrane can become charged. In addition, in the presence of a biasing voltage applied by the mechanism for applying the voltage, oppositely charge carriers in the plasma will be subject to opposed electrostatic forces. When such a biasing voltage is applied, the plasma may be considered to form a virtual electrode adjacent to one or both surfaces of the membrane. This virtual electrode is provided by a plasma sheath adjacent to the surface of the membrane and it has the same polarity as the collector electrode which is facing that surface of the membrane. Under such conditions (of a plasma and an applied voltage), since this virtual electrode is significantly closer to the membrane than the collector electrode (for example of the order of 100 um rather than of the order of 30-300 mm), for a given biasing voltage, the plasma results in a significantly greater electric field strength in the vicinity of the surface of the membrane. In turn, this may result in significantly better cleaning of the membrane.

Under conditions whereby there is a plasma and an applied voltage there will be a current that flows through the membrane. The magnitude of the current will be dependent on both the applied voltage and the density of the plasma. In turn, this current will result in Joule heating of the membrane. The membrane may have dimensions of the order of 10 cm by 10 cm and may have a thickness of the order of 100 nm. The membrane may have a resistance of the order of 100Ω. The temporal extent of these conditions (having a plasma and an applied voltage), may be limited such that the heat created by the current flowing through the membrane can be dissipated without heating the membrane to a temperature at which the membrane will fail. This can be controlled by controlling the temporal extent of the applied voltage and/or the controlling when the plasma is switched on. It may be desirable to ensure that the temperature of the membrane does not exceed 500° C.

The mechanism for applying a voltage across the membrane supported by the membrane support and the or each of the one or more collector electrodes may be arranged to apply a pulsed voltage across the membrane supported by the membrane support and the or each of the one or more collector electrodes.

Applying a pulsed voltage across the membrane supported by the membrane support and the or each of the one or more collector electrodes limits the time during which current flows through the membrane. It will be appreciated that the duty cycle may be limited to ensure that the heat created by the current flowing through the membrane can be dissipated without heating the membrane to a temperature at which the membrane will fail. For example, the duty cycle may be 10% or less, for example 1% or less.

The pulsed voltage may have a duty cycle of 1% of less.

The pulsed voltage may have a frequency of between 1 Hz and 10 kHz.

The pulse duration of the pulsed voltage may be less than 1 ms.

For example, the pulse duration of the pulsed voltage may be less than 10 us.

In some embodiments, to provide sufficient cleaning the electric field strength in the vicinity of the membrane is at least 10 kV/m, more preferably at least 100 kV/m. It will be appreciated that the electric field strength is dependent on the biasing voltage applied and the distance between the membrane and the collector electrodes. However, the electric field strength is also dependent on the plasma (for example the type of plasma, the density of the plasma and so on) and the plasma will, in general, reduce the voltage that should be applied to achieve a desired target electric field strength.

The magnitude of the pulsed voltage may be at least 100 V.

For example, the magnitude of the pulsed voltage may be at least 1000 V.

Each pulse of the pulsed voltage may comprise a first portion having a first polarity and a second portion having a second, opposite polarity.

Advantageously, with such an arrangement, during the first portion the plasma will charge particles with, the charge corresponding to the polarity of the potential of the electrode facing that particle. In the second portion the polarity of the biasing voltage is reversed. If this is done sufficiently quickly then any particles disposed on the membrane which have acquired a charge via the plasma will be acted on by an electrostatic force that is directed away from the membrane and towards the electrode which that particle is facing. For a sufficiently large biasing voltage, these forces will exceed the binding forces (for example Van de Waals forces) between the particles and the membrane and the particles will accelerate away from the membrane and towards the collector electrode facing the surface of the membrane on which the particles are disposed. It will be appreciated that the bias voltage polarity should be switched (between the first and second portions) quickly, for example on a timescale of <0.1 ms.

The plasma generating mechanism may be arranged such that the plasma is switched on between subsequent pulses of the pulsed voltage and is switched off during pulses of the pulsed voltage.

By synchronising the plasma generating mechanism with the pulsed voltage in this way, in particular having the plasma switched off during pulses of the pulsed voltage, the amount of current which flows through the membrane can be limited. With such an arrangement any limitation on the magnitude and the temporal extent of the voltage pulses can be relaxed. It may be that with this arrangement there is no limitation on the magnitude and the temporal extent of the voltage pulses (for example, if the voltage is applied in a manner that ensures that the electrostatic pressure on opposite sides of the membrane is substantially balanced).

The apparatus may further comprise a chamber and a pump apparatus operable to control a pressure of the interior of the chamber. The membrane support may be disposed within the chamber.

The chamber may be a vacuum chamber. For embodiments wherein the electric field generating mechanism comprises one or more collector electrodes, the one or more collector electrodes may also be disposed within the chamber. The pump apparatus may be operable to lower the pressure of the chamber to near vacuum conditions. During operation of the membrane cleaning apparatus, the pressure of the interior of the chamber may be maintained at less than 10 mBar, for example less than 0.01 mBar.

The pump apparatus may be operable to maintain the pressure of the interior of the chamber below $10^{-3}$ mBar. For example, a pressure of the interior of the chamber may be below $10^{-5}$ mBar.

According to a second aspect of the invention there is provided a method for removing particles from a membrane, the method comprising: inducing mechanical oscillations in the membrane; and generating an electric field in the vicinity of the membrane using a collector electrode so as to exert an electrostatic force between the particles on the membrane and the collector electrode.

Advantageously, such a method is particularly suitable for cleaning of a membrane, which may be relatively thin and flexible, as now discussed.

Inducing mechanical oscillations in the membrane will, in turn, also induce mechanical oscillations in particles situated on the membrane. This oscillation of such particles situated on the membrane may be sufficiently large to remove particles from the membrane. In turn, any such particles which are removed by the mechanism for inducing mechanical oscillations may be transported away from the membrane by the electric field.

Inducing mechanical oscillations in the membrane may comprise: applying a time-varying voltage across the membrane supported and an excitation electrode.

Inducing mechanical oscillations in the membrane may comprise: applying a time-varying voltage across two electrodes positioned proximate to a surface of the membrane.

Inducing mechanical oscillations in the membrane may comprise: applying a time-varying voltage to each of two electrodes positioned proximate to opposed surfaces of the membrane.

A time-averaged pressure exerted on one of the two opposed surfaces by the two electrodes may be substantially equal in magnitude and opposite in direction to a time-averaged pressure exerted on the other one of the two opposed surfaces by the two electrodes.

In some embodiments, it may be that a position of one of the electrodes, in a plane parallel to the plane of the membrane, does not align with a position of the other electrode.

In some embodiments, there may be a non-zero phase difference between the time-varying voltage applied to one of the two electrodes and the time-varying voltage applied to the other one of the two electrodes.

The or each time-varying voltage (applied either: across the excitation electrode and the membrane supported by the membrane support; across the two electrodes positioned proximate to a surface of the membrane; or to each of two electrodes positioned proximate to opposed surfaces of the membrane) may have a duty cycle of less than 10%.

Inducing mechanical oscillations in the membrane may comprise: irradiating a at least a portion of the membrane with a pulsed radiation beam.

The mechanical oscillations induced may comprise oscillations at a range of frequencies.

The mechanical oscillations induced may comprise oscillations between 30 kHz and 30 MHz.

For example, the mechanical oscillations induced may comprise oscillations between 100 kHz and 10 MHz.

The mechanical oscillations induced may be suitable for removing particles with a dimension between 0.5 and 5 um from the membrane.

The method may further comprise controlling a temperature of at least a portion of the membrane.

By controlling a temperature of a portion of the membrane, a tension of that portion can be controlled. In turn, this provides control over the resonant frequencies for oscillations of particles on the membrane. In particular, it provides control over a range of particle sizes that can be removed from the membrane for a particular range of oscillation frequencies (as defined, for example, by the time-varying voltage).

The method may further comprise varying a temperature of at least a portion of the membrane over time.

By varying a temperature (i.e. sweeping or scanning the temperature) of at least a portion of the membrane over time, the range of particle sizes that can be removed from the membrane can be varied (for example, while a range of oscillation frequencies remains fixed).

Controlling the temperature of the at least a portion of the membrane may be achieved by irradiating the at least a portion using radiation.

The method according to the second aspect of the invention may use the apparatus according to the first aspect of the invention.

According to a third aspect of the invention there is provided a method for removing particles from a membrane, the method comprising: generating an electric field in the vicinity of two opposed surfaces of the membrane, the electric field in the vicinity of the two opposed surfaces of the membrane being in opposite directions.

Advantageously, such a method is particularly suitable for cleaning of a membrane, which may be sufficiently thin that it may be liable to rupture under sufficient lateral (out of the plane of the membrane) loading. By applying an electric field in the vicinity of two opposed surfaces of the membrane, the electric field in the vicinity of the two opposed surfaces of the membrane being in opposite directions the pressure on the two sides of the membrane may be at least partially equalised. In turn, this allows larger electric fields to be used, which can provide a greater level of cleaning.

The method according to the third aspect of the invention may use the apparatus according to the first aspect of the invention.

According to a fourth aspect of the invention there is provided method for removing particles from a membrane, the method comprising: providing a plasma adjacent to the at least one surface of the membrane so as to charge the particles; and generating an electric field in the vicinity of at least one surface of the membrane so as to force these charged particles away from the membrane.

The plasma provides a mechanism by which particles on the membrane can become charged.

The electric field may be generated using one or more electrodes and applying a biasing voltage to said one or more electrodes.

Under conditions whereby there is a plasma and an applied voltage there will be a current that flows through the membrane. The magnitude of the current will be dependent on both the applied voltage and the density of the plasma. In turn, this current will result in Joule heating of the membrane. The membrane may have dimensions of the order of 10 cm by 10 cm and may have a thickness of the order of 100 nm. The membrane may have a resistance of the order of 100Ω. The temporal extent of these conditions (having a plasma and an applied voltage), may be limited such that the heat created by the current flowing through the membrane can be dissipated without heating the membrane to a temperature at which the membrane will fail. This can be controlled by controlling the temporal extent of the applied voltage and/or the controlling when the plasma is switched on.

The biasing voltage may be a pulsed biasing voltage.

Each pulse of the pulsed voltage may comprise a first portion having a first polarity and a second portion having a second, opposite polarity.

Advantageously, with such an arrangement, during the first portion the plasma will charge particles with, the charge corresponding to the polarity of the potential of the electrode facing that particle. In the second portion the polarity of the biasing voltage is reversed. If this is done sufficiently quickly then any particles disposed on the membrane which have acquired a charge via the plasma will be acted on by an electrostatic force that is directed away from the membrane and towards the electrode which that particle is facing. For a sufficiently large biasing voltage, these forces will exceed the binding forces (for example Van de Waals forces) between the particles and the membrane and the particles will accelerate away from the membrane and towards the collector electrode facing the surface of the membrane on which the particles are disposed. It will be appreciated that the bias voltage polarity should be switched (between the first and second portions) quickly, for example on a timescale of <0.1 ms.

Providing the plasma adjacent to the at least one surface of the membrane may be such that the plasma is switched on between subsequent pulses of the pulsed voltage and is switched off during pulses of the pulsed voltage.

By synchronising the plasma generating mechanism with the pulsed voltage in this way, in particular having the plasma switched off during pulses of the pulsed voltage, the amount of current which flows through the membrane can be limited. With such an arrangement any limitation on the magnitude and the temporal extent of the voltage pulses can be relaxed. It may be that with this arrangement there is no limitation on the magnitude and the temporal extent of the voltage pulses (for example, if the voltage is applied in a manner that ensures that the electrostatic pressure on opposite sides of the membrane is substantially balanced).

The method according to the fourth aspect of the invention may use the apparatus according to the first aspect of the invention.

BRIEF DESCRIPTION OF THE DRAWINGS

Embodiments of the invention will now be described, by way of example only, with reference to the accompanying schematic drawings, in which:

FIG. 9 shows a portion of a further embodiment of a membrane cleaning apparatus according to the invention, and a membrane;

DETAILED DESCRIPTION

Figure 1:
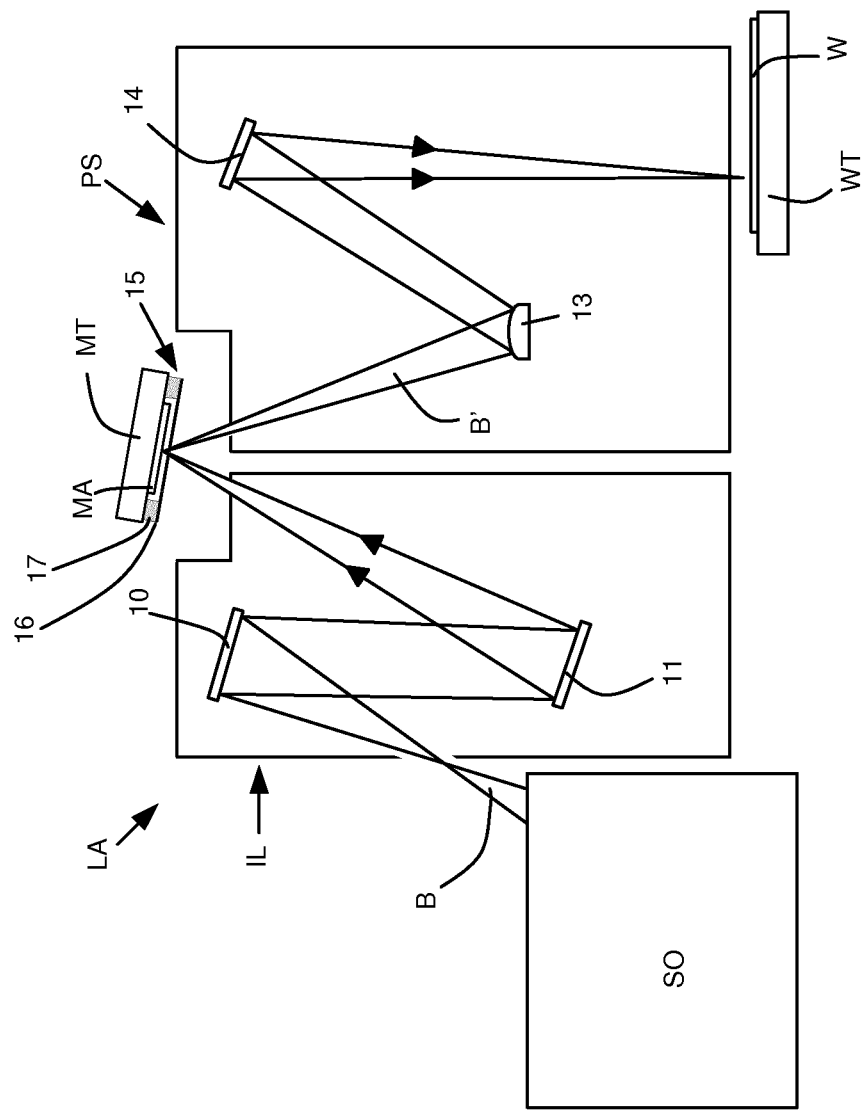
FIG. 1 shows a lithographic system, demonstrating a pellicle in use.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and facetted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e., a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

Some lithographic apparatus (e.g., EUV and DUV lithographic apparatus) comprise a pellicle 15. The pellicle 15 may be attached to the support structure MT or, alternatively, the pellicle 15 may be attached directly to the patterning device MA. The pellicle 15 comprises a thin membrane 16 of transmissive film (typically less than about 70 nm) mounted on a frame 17. The pellicle membrane 16 is spaced a few mm (typically less than 10 mm, for example 2 mm) away from the patterning device MA. A particle which is received on the pellicle membrane 16 is in the far field with respect to the pattern of the patterning device MA, and consequently does not have a significant impact upon the quality of image which is projected by the lithographic apparatus LA on to a substrate W. If the pellicle 15 were not present, such particles may lie on the patterning device MA and would obscure a portion of the pattern on the patterning device MA, thereby preventing the pattern from being projected correctly on to the substrate W. The pellicle 15 thus plays an important role in preventing particles from adversely affecting the image formed on a substrate W by the lithographic apparatus LA.

Before the pellicle 15 is attached to the support structure MT or the patterning device MA for use in a lithographic apparatus LA, the pellicle membrane 16 may become dirty. That is, particles may be incident on the pellicle membrane 16 before the pellicle 15 is used in a lithographic apparatus LA as described above. Activities such as transporting the pellicle 15, packaging the pellicle 15, and mounting the pellicle membrane 16 to a frame 17 may result in particles being incident upon the pellicle membrane 16.

It has been found that some particles that are present on the pellicle membrane 16 detach and travel from the pellicle membrane 16 to the patterning device MA during a lithographic exposure, and thereby negatively affect the pattern projected onto the substrate W. Particles with a dimension between 0.5 um and 5 um have been reported to move. It will be appreciated that, in other setups, particles with one or more dimensions outside of this range may move.

A pellicle 15 may be formed from one or more layers, which may be formed on a support substrate. The support substrate allows the thin membrane 16 of the pellicle 15 to be formed without risking the membrane 16 rupturing. Once the layers of the membrane 16 have been formed, the support substrate can be removed (for example by etching) to form the final thickness of the membrane 16. Pellicles 15 with membranes 16 that are found to be too dirty for use may be discarded. Whilst there exists some methods for cleaning pellicles 15, these are typically used before the final thickness of the membrane 16 has been achieved, that is when the membrane 16 is still disposed on the support substrate. These known methods for pellicle cleaning include wet cleaning or applying heat. However, the known methods are unsuitable for use once the final thickness of the membrane 16 has been achieved since they risk rupturing the thin pellicle membrane 16. Furthermore, cleaning methods that involve applying heat may also contribute to a weakening of the pellicle membrane 16, thereby reducing the operational lifetime of the pellicle 15, mostly due to stress at interfaces of materials with different coefficients of thermal expansion and/or due to temperature inhomogeneity translating to mechanical stress.

Embodiments of the present invention relate to apparatus and associated methods for removing particles from a membrane using an electric field. In particular, some embodiments of the present invention are particularly well suited and adapted to cleaning relatively thin membranes (such as, for example, pellicle membranes), which are fragile.

Some embodiments of the present invention exploit the fact that relatively thin membranes (such as, for example, pellicle membranes) are relatively flexible, by inducing mechanical oscillations in the membrane. In turn, this will also induce mechanical oscillations in particles situated on the membrane. This oscillation of such particles situated on the membrane may be sufficiently large to remove particles from the membrane. In turn, any such particles which are removed by the mechanism for inducing mechanical oscillations may be transported away from the membrane using electric fields. Examples of such embodiments are now described with reference to FIGS. 2 to 5.

A membrane cleaning apparatus 200 according to a first embodiment of the invention is now described with reference to FIGS. 2, 3 and 4.

Figure 2:
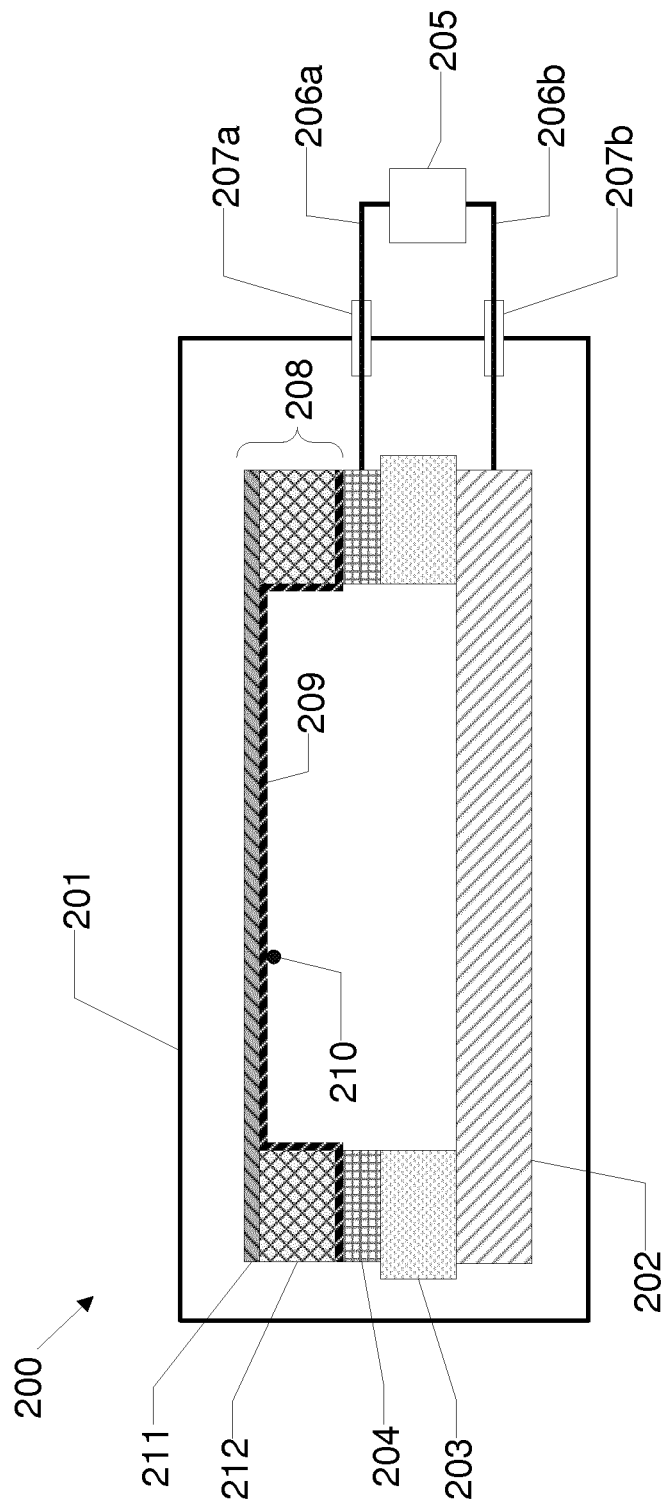
FIG. 2 shows an embodiment of a membrane cleaning apparatus according to the invention, and a membrane.

FIG. 2 shows a cross-section through the membrane cleaning apparatus 200, which comprises: a combined excitation/collector electrode 202; a voltage source 205; and a conducting support 204. The conducting support 204 is an electrical conductor. The combined excitation/collector electrode 202 is of the form of a generally rectangular plate, having a generally cuboidal shape, with one dimension being of substantially shorter length that the other two dimensions. The conducting support 204 is of the form of a generally rectangular plate, having a central rectangular aperture such that the shape of the conducting support 204 may be described as a rectangular frame. The generally rectangular shape formed by the combined excitation/collector electrode 202 and the generally rectangular shape formed by the conducting support 204 are substantially equal in size. The combined excitation/collector electrode 202 and the conducting support 204 are disposed such that the plane of the combined excitation/collector electrode and the plane of the conducting support are substantially parallel.

In the embodiment shown in FIG. 2, the membrane cleaning apparatus 200 further comprises a spacer section 203. The spacer section 203 is an electrical insulator. The spacer section 203 is of substantially the same shape as the conducting support 204 (i.e., a generally rectangular frame). The spacer section is 203 disposed between the combined excitation/collector electrode 202 and the conducting support 204.

In the embodiment shown in FIG. 2, the membrane cleaning apparatus 200 further comprises a vacuum chamber 201. The combined excitation/collector electrode 202, spacer section 203 and conducting support 204 are disposed within the vacuum chamber 201.

Also shown in FIG. 2 is a membrane assembly 208. The membrane assembly 208 comprises a membrane 211 which is in turn supported by a generally rectangular frame 212. In use, the membrane assembly 208 is disposed on the conducting support 204. The conducting support 204 is arranged to support the frame 212 of the membrane assembly 208. The frame 212 and one or more surfaces of the membrane 211 are coated in a conducting (for example metallic) coating 209 so that this conducting coating 209 is in electrical contact with the conducting support 204.

The voltage source 205 is operable to apply a voltage across the combined excitation/collector electrode 202 and the conducting support 204. In the embodiment shown in FIG. 2, this is achieved via the use of wires 206a, 206b and vacuum feedthroughs 207a, 207b. Vacuum feedthroughs 207a, 207b are disposed within a wall of the vacuum chamber 201. The voltage source 205 is disposed external to the vacuum chamber 201. One electrical terminal of the voltage source 205 is electrically connected to the conducting support 204 via wire 206a and vacuum feedthrough 207a. The opposing electrical terminal of the voltage source 205 is electrically connected to the combined excitation/ collector electrode 202 via wire 206b and vacuum feedthrough 207b.

In use, the voltage applied across the combined excitation/collector electrode 202 and the conducting support 204 results in a voltage across the combined excitation/collector electrode 202 and the membrane 211 as the membrane 211 is typically formed from a material with non-zero electrical conductivity, such as doped polycrystalline silicon and/or is provided with a conductive coating 209 on at least one side of the membrane 211. The combined excitation/collector electrode 202 and the membrane 211 are not part of a closed circuit. Therefore, electric charge can build-up on the combined excitation/collector electrode 202 and on the membrane 211. This effect is similar to the charging of opposing plates in a capacitor.

Electric charge build-up on the combined excitation/ collector electrode 202 and the membrane 211 creates an electrostatic attractive force between the combined excitation/collector electrode 202 and the membrane 211. Since the membrane 211 is relatively thin and, therefore, flexible, the membrane 211 will be distorted by this attractive force.

The build-up of electric charge, giving rise to electrostatic forces in the vicinity of a membrane assembly 208, is exploited in some embodiments of the current invention. Specifically, mechanical oscillations are induced in the membrane 211 by configuring temporal characteristics of said electrostatic forces. This is achieved according to the current embodiment of the invention by applying a time-varying voltage across the combined excitation/collector electrode 202 and the membrane 211. The time-varying voltage utilised for this purpose comprises a plurality of temporally spaced pulses. This mechanism is described in detail below.

A vacuum pump apparatus (not shown in FIG. 2 for simplicity) is operable to control the pressure of the interior of the vacuum chamber 201. For example, the vacuum pump may be operable to lower the pressure of the vacuum chamber 201 to near vacuum conditions. During operation of the membrane cleaning apparatus 200, the pressure of the interior of the vacuum chamber 201 may be maintained at less than 10 mBar. Alternatively, the pressure of the vacuum chamber 201 may be maintained at less than 0.01 mBar. Advantageously, maintaining the interior of the vacuum chamber 201 at a low pressure reduces air resistance experienced by an oscillating membrane 211 when said membrane 211 is being cleaned using the membrane cleaning apparatus 200.

Figure 3:
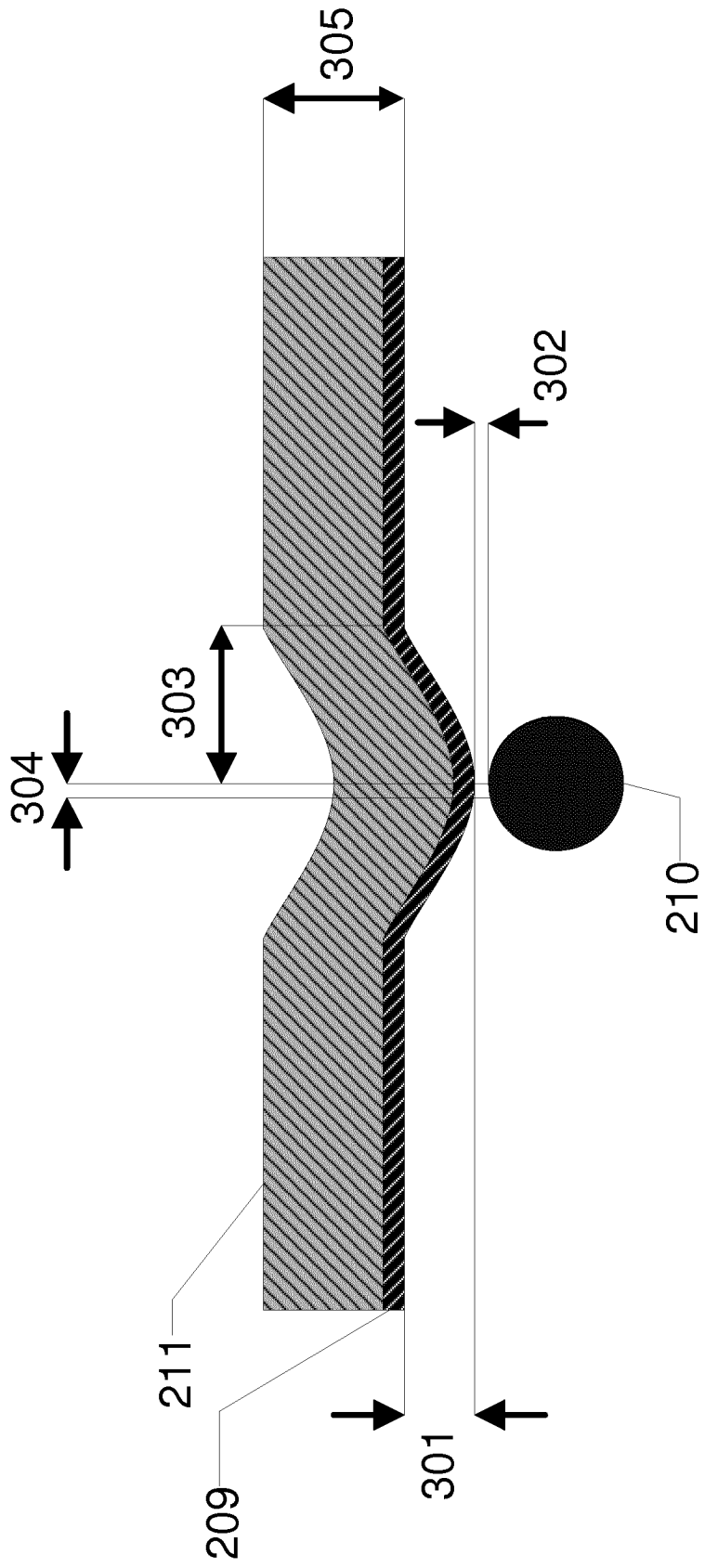
FIG. 3 is a schematic view of part of the membrane shown in FIG. 2, showing a mechanism by which particles may be removed from the membrane using the membrane cleaning apparatus shown in FIG. 2.
Figure 4:
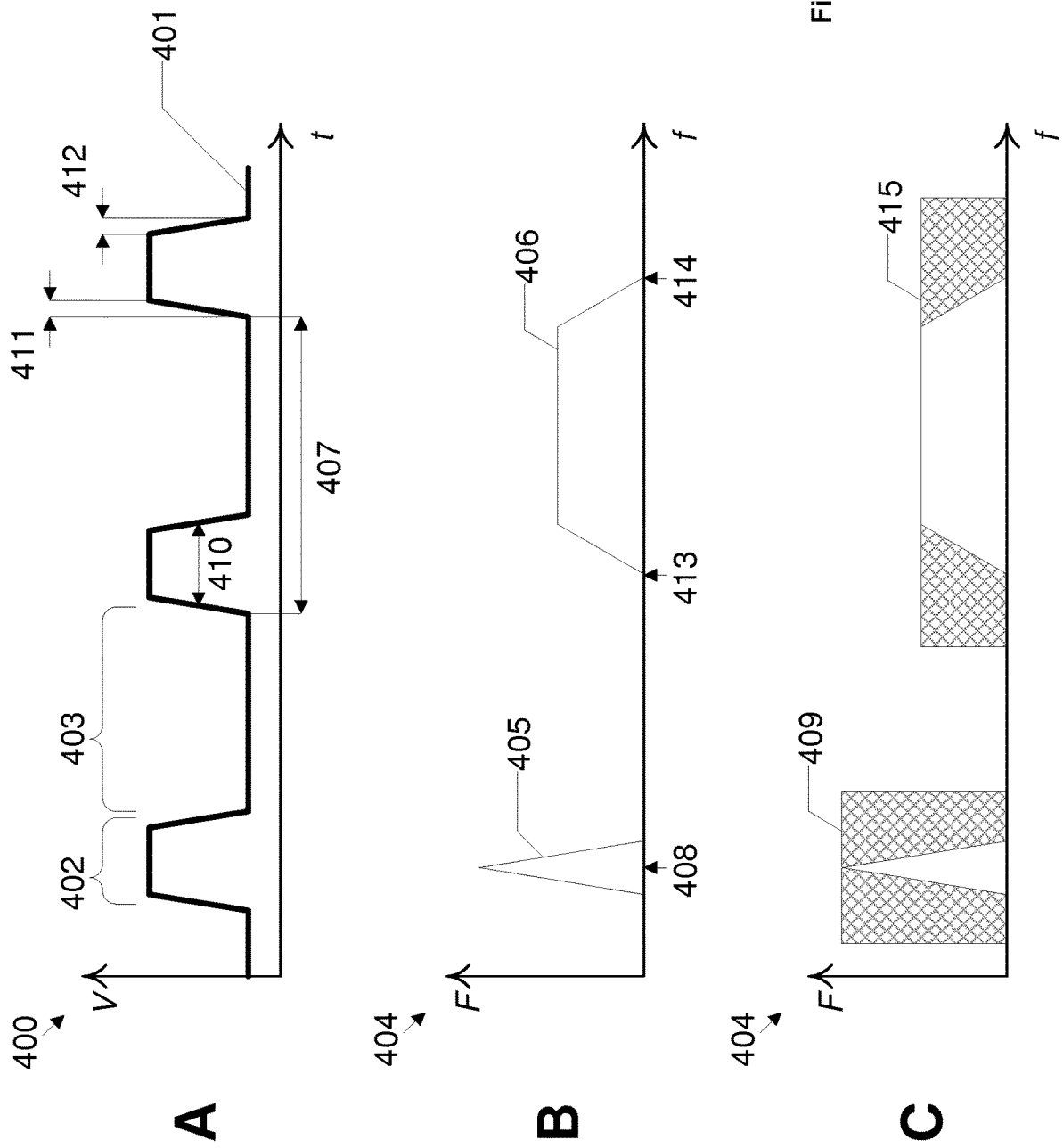
FIG. 4a shows a plot of an example voltage that may be applied across a membrane and an electrode as a function of time using the membrane cleaning apparatus shown in FIG. 2.
FIG. 4b is a first schematic illustration of an excitation spectrum corresponding to an applied voltage of the form shown in FIG. 4a, showing excitation force applied to a membrane as a function of frequency of the excitation force, and schematically indicating a frequency composition of the pulsed voltage, and how this may be varied via modulation of a pulse repetition frequency.
FIG. 4c is a second schematic illustration of an excitation spectrum, schematically indicating a frequency composition of the pulsed voltage shown in FIG. 4a and how this may be varied via modulation of pulse repetition frequency and modulation of pulse shape.

FIG. 3 shows a cross-section through a membrane 211 being cleaned by the membrane cleaning apparatus 200 when a voltage provided by the voltage source 205 is applied across the combined excitation/collector electrode 202 and the conducting support 204. Also shown is a particle 210 disposed on the membrane 211. As the membrane 211 is generally flexible and the combined excitation/collector electrode 202 is generally rigid, the electrostatic attractive force between the combined excitation/collector electrode 202 and the membrane 211 creates mechanical deformations 301 in the membrane 211.

In an embodiment of the invention, the voltage applied across the combined excitation/collector electrode 202 and the conducting support 204 can follow the waveform 400 shown in FIG. 4a, which shows a plot of voltage, V, as a function of time, t. The voltage is time-varying. Specifically, the waveform 400 of the voltage is periodic such that the voltage may be described as a pulsed voltage 401. The pulsed voltage 401 comprises alternating on-portions 402 and off-portions 403. It will be appreciated that the voltage waveform 400 shown in FIG. 4a is only an example of a pulsed voltage 401 that may be generated by the voltage source 205. In other embodiments it is possible to use alternative pulse shapes and pulse repetition frequencies, and/or pulse patterns, such as bursts, trains.

The pulsed voltage 401 shown in FIG. 4a comprises a DC component (where off-portions 403 correspond to a non-zero potential difference between the combined excitation/ collector electrode 202 and the conducting support 204). In an alternative embodiment, a similar waveform 400 but with no DC component (where off-portions 403 correspond to zero potential difference between the combined excitation/ collector electrode 202 and the conducting support 204) may be used. Using the pulsed voltage 401 with a DC component generates a stronger time-averaged electric field between the combined excitation/collector electrode 202 and the membrane assembly 208, which may improve particle 210 transport towards the combined excitation/collector electrode 202, as described below.

The pulsed voltage 401 creates a pulsed electrostatic attractive force between the combined excitation/collector electrode 202 and the membrane 211. During the on-portions 402 of the pulsed voltage 401, there is an electrostatic attractive force between the combined excitation/collector electrode 202 and the membrane 211, resulting in mechanical deformations 301 of the membrane 211 as described above. The pulsed pressure giving rise to such an electric force (charge) may typically be between 0.01 Pa and 100 Pa. Following the applied pressure, all or at least some portions of the membrane are accelerated towards an electrode 202.

During the off-portions 403 of the pulsed voltage 401 with a DC component, there is a reduced electrostatic attractive force between the combined excitation/collector electrode 202 and the membrane 211 compared with during the on-portions 402. For embodiments with no DC component to the pulsed voltage 401, during the off-portions 403 of the pulsed voltage 401, there is no electrostatic attractive force between the combined excitation/collector electrode 202 and the membrane 211. Therefore, during the off-portions 403 of the pulsed voltage 401 (whether comprising a DC component or not), tension of the membrane 211 can result in acceleration of the membrane 211 in the opposite direction of the mechanical deformations 301 caused during the on-portions 402 of the pulsed voltage 401. As the on-portions 402 and off-portions 403 of the pulsed voltage 401 are repeated, mechanical oscillations are induced in the membrane 211.

In an embodiment of the invention, the voltage applied across the combined excitation/collector electrode 202 and the conducting support 204 has a duty cycle of less than 10%. Advantageously, this limits the amount of heating up of the membrane 211 by the current charging and discharging the capacitor formed by the membrane 211 and the combined excitation/collector electrode 202.

Particles 210 may be present on the surface of the membrane 211 that faces the combined excitation/collector electrode 202.

Averaged over time there is a net electric field between the combined excitation/collector electrode 202 and the membrane assembly 208 due to the pulsed voltage 400.

A particle 210 with non-zero surface conductivity disposed on the surface of the membrane 211 that faces the combined excitation/collector electrode 202 may have acquired an electric charge from the membrane 211 due to the pulsed voltage 401. The electric charge of said particle 210 is such that an electrostatic force exists which attracts the particle 210 towards the combined excitation/collector electrode 202.

Additionally or alternatively, a particle 210 may have acquired an electric charge through triboelectric interactions with the surface of the membrane 211 that faces the combined excitation/collector electrode 202. The electric charge of said particle 210 may be either positive or negative. In use, polarity of the voltage pulses 400 may be chosen, so to provide attractive force between tribo-charged particles and electrode 202; to cover the situations of different materials (different sign of tribo-charge) the polarity of voltage pulses (DC component and/or pulse component) may be varied.

Each particle 210 present on a surface of the membrane 211 will generally move with the surface of the membrane 211 as the membrane oscillates, due to van der Waals attractions between the particle 210 and the surface of the membrane 211 on which the particle 210 is situated.

Each particle 210 on a membrane 211 under pre-tension can be treated as an independent oscillator. Resonant frequencies of such oscillators may vary with properties of the particle 210 and of the membrane 211.

For example, resonant frequencies of such particles 210 may vary with mass of the particle 210, M. Resonant frequencies may vary with d: the ratio of the radius of vibration 303 induced in the membrane 211 (defined by the amplitude of oscillations and excitation frequency) to the size of the contact spot 304 (defined by the typical, short range van der Waals interaction) of the particle 210 on the membrane 211. Typically, for a membrane 211 being cleaned using the membrane cleaning apparatus 200, d may be between 100 and 1,000,000. Resonant frequencies of such particles may also vary with the thickness 305 of the membrane 211, h. Typically, for a membrane 211 being cleaned using the membrane cleaning apparatus 200, h may be between 10 nm and 100 nm. Resonant frequencies may also vary with the pre-tension of the membrane 211, $\sigma$. Typically, for a membrane 211 being cleaned using the membrane cleaning apparatus 200, $\sigma$ may be between 50 MPa and 500 MPa.

The fundamental frequency of oscillators, $v_0$, may be described by the following equation:

$$v_0 \cong \sqrt{\sigma \frac{h}{2\pi M \ln(d)}}.$$

For typical particle density and for particle radius between 0.5 um and 5 um, $v_0$ may be between approximately 10 MHz and 0.3 MHz. If an excitation frequency applied to the membrane 211 approaches a resonant frequency of a particle 210, the amplitude 301 of oscillation of the particle 210 can increase. As the amplitude of the oscillation of the particle 210 increases, the membrane-particle separation 302 may likewise increase, since inertia due to particle acceleration may exceed van der Waals force.

The magnitude of van der Waals forces is inversely proportional to the square of the separation 302 between atoms or molecules on which the forces act. At some threshold membrane-particle separation 302, van der Waals attractions between the particle 210 and the surface of the membrane 211 are attenuated to the extent that an electrostatic force that attracts the particle 210 towards the combined excitation/collector electrode 202 (i.e., away from the membrane) overcomes van der Waals forces between the particle 210 and the membrane 211. Above said threshold membrane-particle separation 302, the particle 210 may therefore be removed from the membrane 211. The particle 210 will thereon be disposed within the space between the membrane 211 and the combined excitation/collector electrode 202 and will accelerate towards the combined excitation/collector electrode 202.

Resonant frequencies of a particle 210 vary with the size of the particle 210 due to mass dependency. In order to remove particles 210 that have a range of sizes, the pulsed voltage 401 may be configured to induce a range of frequencies of oscillation of the membrane 211. The range of frequencies of induced oscillation of the membrane 211 may be referred to as an "excitation spectrum". The excitation spectrum is given by a Fourier transform of the waveform 400 of the pulsed voltage 401 applied by the voltage source 205. Components of the excitation spectrum arise from temporal features of the pulsed voltage 401. Features that repeat with a relatively long time period give rise to components of the excitation with at a relatively low frequency, and vice versa.

FIGS. 4b and 4c show schematic plots of an excitation spectrum 404 corresponding to a pulsed voltage 401 of the form shown in FIG. 4a. The excitation spectra 404 schematically show relative electrostatic attractive force exerted on the membrane, F, as a function of the oscillating frequency at which this force is exerted, f. The excitation spectra 404 comprise a first portion 405 and a second portion 406.

The first portion 405 of the excitation spectrum 404 arises from the temporal feature of the pulsed voltage 401 with the longest duration: the time period 407 of pulses of the pulsed voltage 401. The central frequency 408 of the first portion 405 is defined by the inverse of the time period 407 (this central frequency 408 may be referred to as the pulse frequency or repetition rate). In some embodiments, the repetition rate of the pulsed voltage 401 may be in the range 30 kHz to 30 MHz. The shaded region 409 of FIG. 4c corresponds to shifting the central frequency 408 of the first portion 405 via modulating the time period 407. An increase in the time period 407 leads to a reduction in the central frequency 408 of the first portion 405 (and vice versa).

The second portion 406 of the excitation spectrum 404 arises from temporal features of the pulsed voltage 401 with shorter duration than the time period 407. The second portion 406 is defined by: the full width at half maximum (FWHM) 410 of the on-portions 402 of pulses of the pulsed voltage 401; and the rise time 411 and fall time 412 of pulses of the pulsed voltage 401. The lower frequency 413 of the second portion 406 is defined by the inverse of the FWHM 410. The upper frequency 414 of the second portion 406 is defined by the inverse of whichever is the shortest duration out of the rise time 411 and fall time 412. The shaded region 415 of FIG. 4c corresponds to shifting the lower frequency 413 and the upper frequency 414 of the second portion 406 via modulating the FWHM 410 and rise time 411 and fall time 412. An increase in the FWHM 410 leads to a reduction in the lower frequency 413 of the second portion 406 (and vice versa). An increase in whichever is the shortest duration out of the rise time 411 and fall time 412 leads to a reduction in the upper frequency 414 of the second portion 406 (and vice versa).

The pulsed voltage 401 of the form shown in FIG. 4a is relatively simple. It may therefore be implemented easily by a person skilled in the art. Advantageously, though the waveform 400 of the pulsed voltage 401 is simple, it offers several configurable parameters (including time period 407, FWHM 410, rise time 411, and fall time 412), which can be chosen (and varied) to achieve a desired excitation spectrum.

Alternatively to using a pulsed voltage 401 of the form shown in FIG. 4a, an arbitrary function generator connected to a voltage amplifier may be used to generate any desired pulse shape, configurable to induce a desired excitation spectrum.

In this embodiment, the voltage waveform 400 shown in FIG. 4a may be considered to be of a general shape and having one or more parameters (for example any of the time period 407, FWHM 410, rise time 411, and fall time 412), which can be chosen (and varied) to achieve a desired excitation spectrum. It will be appreciated that in other embodiments, different voltage waveforms may be used but which also can be considered to have a general shape and have one or more parameters which can be chosen (and varied) to achieve a desired excitation spectrum.

In an arrangement of the current embodiment, the combined excitation/collector electrode 202 and the membrane assembly 208 are disposed so that the separation between the combined excitation/collector electrode 202 and the membrane 211 is between 1 mm and 10 mm.

In an arrangement of the current embodiment, the pulsed voltage 401 applied across the combined excitation/collector electrode 202 and the conducting support 204 has a maximum potential difference of between 100 V and 10000 V.

In an arrangement of the current embodiment, the net (time-averaged) electric field between the combined excitation/collector electrode 202 and the membrane assembly 208 (due to the pulsed voltage 401) has a field strength greater than 10 V m$^{-1}$ or less than −10 V m$^{-1}$.

In an arrangement of the current embodiment, the pulsed voltage 401 is configured to excite oscillations of the membrane 211 (and thereby particles 210 disposed on the membrane 211) in a frequency range of between 30 kHz and 30 MHz. For example, the pulsed voltage 401 may be configured to excite oscillations of the membrane 211 in a frequency range of between 100 kHz and 10 MHz.

In an arrangement of the current embodiment, the pulsed voltage 401 does not induce frequencies of oscillation of the membrane close to a fundamental frequency of the clean membrane 211 (defined only by frame width and length and film pre-tension, thickness and density). For example, in an arrangement of the current embodiment, the pulsed voltage 401 does not induce oscillations of the membrane 211 below 30 kHz. This is useful as it may help to avoid rupturing the membrane 211.

In an arrangement of the current embodiment, the pulsed voltage 401 is not a sinusoidally varying voltage. By ensuring that appropriate off-sections 403 are incorporated into the shape of the pulse, dissipated power into the conducting coating 209 on the membrane assembly 208 may be kept low. This is useful to allow radiative cooling to maintain the temperature of the membrane 211 within safe limits.

Using the arrangements described above, particles 210 with a dimension between 0.5 and 5 um can be removed from the membrane 211 using the membrane cleaning apparatus 200.

The pulsed voltage 401 may be applied as separate trains of pulses. One train of pulses may immediately follow another train of pulses. Separate trains of pulses may be applied with the polarity of the pulsed voltage reversed in successive trains of pulses. This may be useful to release both negatively charged and positively tribo-charged particles and attract them to the collecting electrode. The duration of each train of pulses may be configured so that particles 210 have enough time to be transported to the combined excitation/collector electrode 202 before the next train of pulses (with reversed voltage polarity) is applied. It will be appreciated that charged particles may generally discharge upon contact with the excitation/collector electrode 202. Therefore, these particles are not transported back to the membrane 211 when the polarity of the voltage is reversed.

A membrane cleaning apparatus 500 according to a second embodiment of the invention is now described with reference to FIG. 5, which shows a cross-section through the membrane cleaning apparatus 500.

Figure 5:
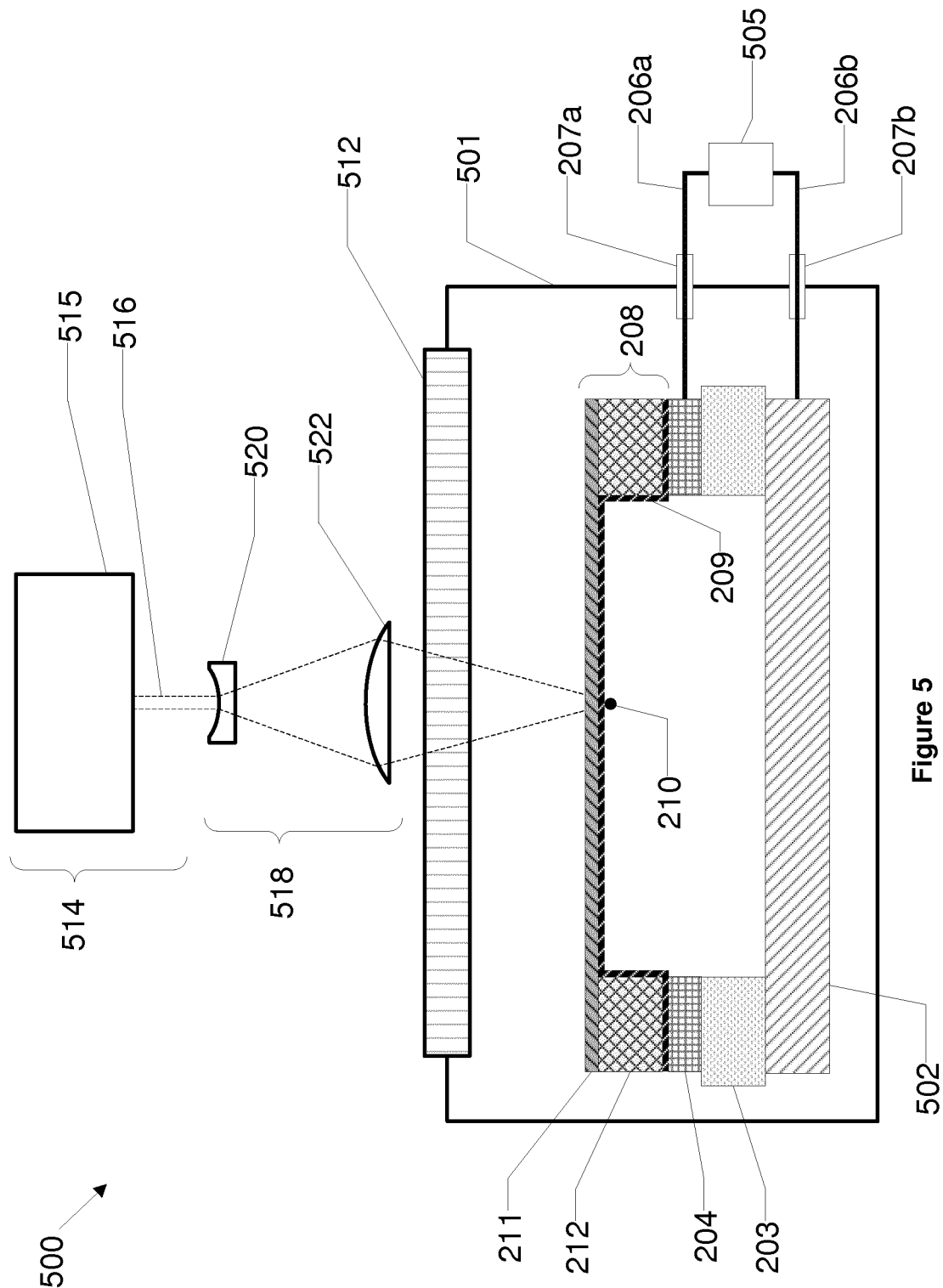
FIG. 5 shows a further embodiment of a membrane cleaning apparatus according to the invention, and a membrane.

The membrane cleaning apparatus 500 shown in FIG. 5 shares several features in common with the membrane cleaning apparatus 200 shown in FIG. 2. Any features of the membrane cleaning apparatus 500 shown in FIG. 5 which generally correspond to, and may be generally the same as, features of the membrane cleaning apparatus 200 shown in FIG. 2 share common reference numerals therewith.

Only the differences between the membrane cleaning apparatus 500 shown in FIG. 5 and the membrane cleaning apparatus 200 shown in FIG. 2 will be discussed in detail below.

In particular, the membrane cleaning apparatus 500 comprises: a conducting support 204, a spacer section 203, wires 206a, 206b and vacuum feedthroughs 207a, 207b. Furthermore, in use, a membrane assembly 208 (comprising a membrane 211 and a generally rectangular frame 212) is disposed on the conducting support 204.

The membrane cleaning apparatus 500 also comprises an electrode 502 and a voltage supply 505. The electrode 502 may be generally of the same form as the combined excitation/collector electrode 202 shown in FIG. 2, although, as will be discussed further below, the electrode 502 of this embodiment only acts as a collector electrode. Similarly, the voltage supply 505 may be generally of the same form as the voltage supply 205 shown in FIG. 2, although, as will be discussed further below, the voltage supply 505 may be arranged to apply a constant or DC voltage (as opposed to a time-varying voltage comprising a plurality of pluses).

One main difference between the membrane cleaning apparatus 500 shown in FIG. 5 and the membrane cleaning apparatus 200 shown in FIG. 2 is that the membrane cleaning apparatus 500 shown in FIG. 5 comprises a different mechanism for inducing mechanical oscillations in the membrane 211, as now discussed.

The membrane cleaning apparatus 500 comprises a mechanism for inducing mechanical oscillations in the membrane 211, the mechanism for inducing mechanical oscillations comprising a radiation source (for example a laser) operable to produce a pulsed radiation beam which is incident on at least a portion of the membrane 211 when supported by the conducting support 204.

In particular, the membrane cleaning apparatus 500 comprises a laser 514 for this purpose. The laser 514 is operable to produce a pulsed laser beam 516.

The membrane cleaning apparatus 500 shown in FIG. 5 comprises a modified vacuum chamber 501 which is similar to the vacuum chamber 201 shown in FIG. 2 but which further comprises a window 512. A laser source 515 is disposed outside the vacuum chamber 501. The window 512 is formed from a light-transmissive material through which the pulsed laser beam 516 can propagate so as to be incident on the membrane 211.

The membrane cleaning apparatus 500 further comprises a beam delivery system 518 comprising optics 520, 522 for guiding and/or shaping the pulsed laser beam 516 as output by the laser 514.

In this embodiment, the beam delivery system 518 is operable to focus the pulsed laser beam 516, through the window 512, onto a localised beam spot portion on the membrane 211. This portion of the membrane 211 receives radiation pressure from the incident laser beam 516. As the membrane 211 is generally flexible, the radiation pressure may create mechanical deformations 301 in the membrane 208. The localised pressure exerted by the laser beam 516 is given by the force exerted by a laser beam pulse on the membrane 211 to the area of the beam spot region. In turn, the force exerted by a laser beam pulse on the membrane 211 is given by the rate of change of momentum of the photons absorbed by the membrane 211. The momentum of each photon is given by the ratio of the energy of that photon to the speed of light and, therefore, the pressure exerted by a laser beam pulse on the membrane 211 is given by ratio of the power density [W/m²] of the absorbed radiation to the speed of light; it will be appreciated that, here, for simplicity, the effect of reflected light on the membrane is omitted.

The laser beam 516 produced by the laser radiation source 515 is a pulsed laser beam 516. In between laser pulses (when no laser radiation is incident on the membrane 211), internal structural forces of the membrane 211 can result in acceleration of the membrane 211 in the opposite direction of the mechanical deformations caused by the radiation pressure. The application of a pulsed laser beam 516 to the membrane 211 may therefore induce mechanical oscillations in the membrane 211.

In this embodiment, the laser beam 516 is operable to induce oscillations only in a localised portion of the membrane 211 (i.e., proximate to the beam spot portion). Advantageously, by constraining the mechanical oscillations to a localised portion of the membrane 211, a more precise, quicker and more energy efficient cleaning process may be achieved.

To allow the cleaning of all parts of the membrane 211, the laser 514 and/or at least a part of the beam delivery system 518 is movable relative to the window 512. The membrane cleaning apparatus 500 may be used to deliver a focused, pulsed laser beam 516 to every critical particle 210 (which it is desired to remove) on the membrane 211 through the window 512. Alternatively, the membrane cleaning apparatus 500 may be used to scan or step the pulsed laser beam 516 over the surface of the membrane 211 so as to clean the entire membrane 211.

The voltage source 505 may apply a voltage across the electrical terminals of the voltage source 505, resulting in a voltage across the electrode 502 and the membrane 208. As discussed above in relation to the membrane cleaning apparatus 200 shown in FIG. 2, this will exert an attractive electrostatic force on at least some particles 210 on the membrane 211. As the mechanical oscillations are induced by the pulsed laser beam 516, the particles 210 (which can be treated as independent oscillators) may move apart from the membrane 211, reducing the binding forces between the particles 210 and the membrane 211. If a frequency at which the membrane 211 oscillates approaches a resonant frequency of a particle 210, the amplitude of oscillation of the particle 210 can increase. As the amplitude of the oscillation of the particle 210 increases, the membrane-particle separation 302 may likewise increase. At some threshold membrane-particle separation 302, the van der Waals attractions between the particle 210 and the surface of the membrane 211 can no longer keep the particle 210 attached to the surface of the membrane 211 (for example, when the membrane 211 accelerates away from the collector electrode 502 in between pulses). The particle 210 is thus removed from the membrane 211 and will accelerate towards the electrode 502.

The use of a conducting support 204 in the first and second embodiments of membrane cleaning apparatus 200, 500 may improve the electric coupling between the voltage source 205, 505 and the membrane 211. However, it will be appreciated that in alternative embodiments, the membrane cleaning apparatus 200, 500 may be constructed without a conducting support 204 and the voltage source 205, 505 may be directly coupled to the membrane 211.

Similarly, the use of the spacer section 203 (formed from an electrical insulator) in the first and second embodiments of membrane cleaning apparatus 200, 500 may provide a convenient arrangement for providing a particular spacing between the membrane 211 and the electrode 202, 502. Furthermore, it may provide a convenient arrangement for supporting the membrane assembly 208 by the electrode 202, 502, via the electrical insulating spacer section 203. However, it will be appreciated that in alternative embodiments, the membrane cleaning apparatus 200, 500 may be constructed without a spacer section 203. For example, in an alternative embodiment the wires 206a, 206b which provide the connection between the voltage source 205 and the membrane 211 and the electrode 202, 502 respectively may be sufficiently strong to support the membrane 211 and electrode 202, 505.

Some embodiments of the present invention utilize an electric field generating mechanism which is operable to generate an electric field in the vicinity of two opposed surfaces of a membrane to be cleaned the electric field in the vicinity of the two opposed surfaces of the membrane being in opposite directions. In some embodiments, the electric field strength may be substantially equal in magnitude on opposite sides of the membrane (although arranged in opposite directions). Advantageously, such an arrangement is particularly suitable for cleaning of a membrane, which may be sufficiently thin that it may be liable to rupture under sufficient lateral (out of the plane of the membrane) loading. By applying an electric field in the vicinity of two opposed surfaces of the membrane, with the electric field in the vicinity of the two opposed surfaces of the membrane being in opposite directions, the electrostatic pressure on the two sides of the membrane may be at least partially equalised. In turn, this allows larger electric fields to be used, which can provide a greater level of cleaning. An example of such an embodiment is now described with reference to FIGS. 6 to 7.

A third embodiment of a membrane cleaning apparatus 600 according to the invention is now described with reference to FIGS. 6, 7a and 7b.

Figure 6:
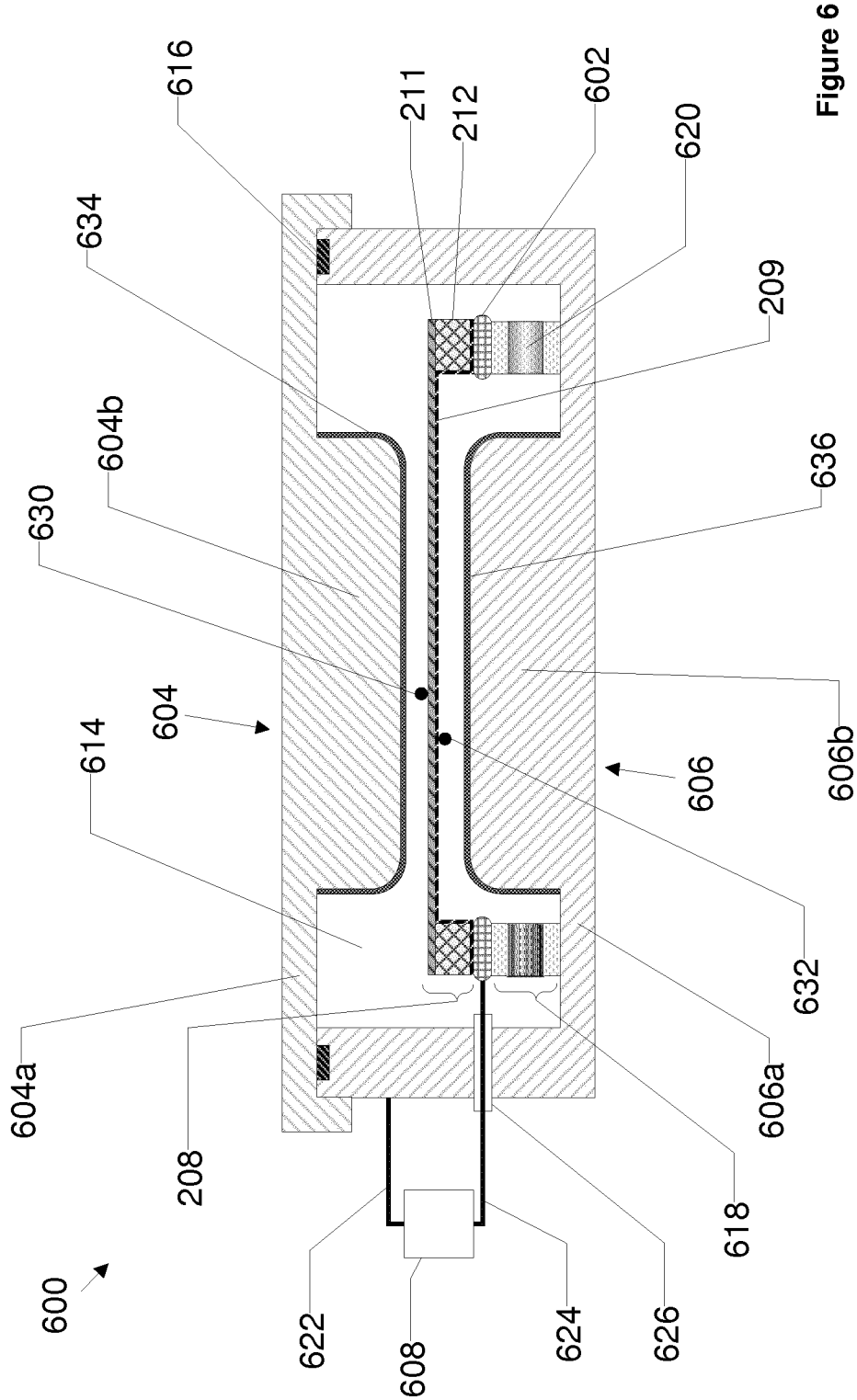
FIG. 6 shows a further embodiment of a membrane cleaning apparatus according to the invention, and a membrane.
Figure 7A:
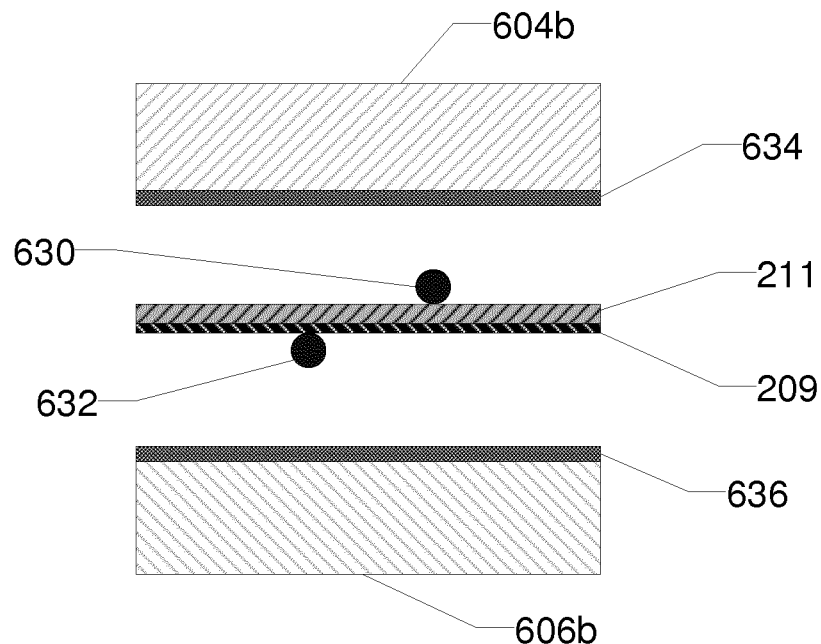
FIGS. 7a and 7b illustrate schematically a mechanism by which particles may be removed from a membrane using the membrane cleaning apparatus shown in FIG. 6.

FIG. 6 shows a cross-section through the cleaning apparatus 600, which comprises: a conducting support 602, two collector electrodes 604, 606 and a voltage source 608.

The conducting support 602 is formed from an electrically conductive material and is for supporting a membrane (for example, a pellicle) to be cleaned with the apparatus 600. Also shown in FIG. 6 is a membrane assembly 208. The membrane assembly 208 comprises a membrane 211 which is supported by a generally rectangular frame 212. The conducting support 602 is arranged to support the frame 212 of the membrane assembly 208.

The two collector electrodes 604, 606 are disposed on opposite sides of the plane of the membrane 211 supported by the conducting support 602. The two collector electrodes 604, 606 are connected together (i.e., they are at the same potential). In the embodiment shown in FIG. 6, each of the two collector electrodes 604, 606 forms one part of a two part assembly which defines an interior chamber 614 in which a membrane 211 may be disposed for cleaning. A first collector electrode 604 may generally form a lid portion of the two part assembly and a second collector electrode 606 may generally form a body portion of the two part assembly. Each of the two collector electrodes 604, 606 comprises a base portion 604a, 606a and a protruding portion 604b, 606b. The base portions 604a, 606a of the two collector electrodes 604, 606 cooperate so as to define the interior chamber 614 in which a membrane 211 may be disposed for cleaning. It will be appreciated that the two collector electrodes 604, 606 may be separated so as to provide access to the interior chamber 614. In particular, this allows for loading a membrane assembly 208 into the interior chamber 614 for cleaning and unloading a membrane assembly 208 from the interior chamber 614 once it has been cleaned.

A seal 616 is disposed between the two collector electrodes 604, 606 so as to seal the interior chamber 614 from an exterior of the interior chamber 614 at a mating surface where the two collector electrodes 604, 606 are in contact. The seal 616 may be arranged so as to hermetically seal the interior chamber 614 such that an air-tight seal is created between the two collector electrodes 604, 606. In such a configuration, the interior chamber 614 can function as a vacuum chamber. One or more vacuum pumps (not shown) may be provided to control a pressure within the interior chamber 614.

The protruding portions 604b, 606b of the two collector electrodes 604, 606 are each of the form of a generally cuboidal protrusion from the base portions 604a, 606a respectively. The protruding portions 604b, 606b of the two collector electrodes 604, 606 protrude into the interior chamber 614 such that, when the two collector electrodes 604, 606 are mutually engaged, the protruding portions 604b, 606b are generally mutually parallel.

The conducting support 602 is connected to the base portion 606a of the second collector electrode 606 via an insulating support 618. The insulating support 618 is formed from an electrically nonconductive material and comprises one or more spacer apertures 620. The conducting support 602 and the insulating support 618 are both of the form of a rectangular frame, i.e. a generally rectangular plate having a central rectangular aperture.

The voltage source 608 is arranged to apply a voltage across a membrane 211 supported by the conducting support 602 and each of the two collector electrodes 604, 606. The voltage source 608 is disposed external to the interior chamber 614 formed by the two collector electrodes 604, 606. A first electrical terminal of the voltage source 608 is electrically connected to the second collector electrode 606 (which is, in turn, in electrical contact with the first collector electrode 604) via a first wire 622. A second electrical terminal of the voltage source 608 is electrically connected to the conducting support 602 via a second wire 624. The second collector electrode 606 is provided with a vacuum feedthrough 626. The second wire 624 passes through the vacuum feedthrough 626.

The conducting support 602 may be considered to be a membrane support for supporting a membrane 211 or membrane assembly 208. The voltage source 608 and the two collector electrodes 604, 606 may be considered to be electric field generating mechanism for generating an electric field in the vicinity of a membrane 211 when supported by the conducting support 602.

The membrane cleaning apparatus may be used for cleaning a membrane 211, as now discussed. The membrane 211 may be a pellicle membrane 16 and may be formed from a material with non-zero electrical conductivity, such as doped polycrystalline silicon. The membrane assembly 208 may also comprise a conducting (for example metallic or electrically conducting ceramic) coating 209 on one or both sides of the plane of the membrane 211.

In use, the membrane assembly 208 is disposed such that the frame 212 is supported by the conducting support 602 so that a conducting surface 209 of the membrane assembly 208 is in electrical contact with the conducting support 602.

As previously described, one or more vacuum pumps (not shown) may be provided to control a pressure within the interior chamber 614. In particular, a vacuum pump apparatus (not shown) may be used to lower the pressure of the interior chamber 614 to near vacuum conditions. For example, the one or more vacuum pumps may be operable to reduce the pressure within the interior chamber 614 to $<10^{-3}$ mBar, preferably to $<10^{-6}$ mBar. Spacer apertures 620 within the insulating support 618 enable the pressure of the interior chamber 614 to be equal on opposite sides of the plane of the membrane 211.

The voltage source 608 is operable apply a voltage across the electrical terminals of the voltage source 608, resulting in a voltage across the electrically conducting surface 209 of the membrane assembly 208 and the collector electrodes 604, 606 (the two collector electrodes 604, 606 being electrically connected to each other). The collector electrodes 604, 606 and the conducting surface 209 of the membrane assembly 208 are not part of a closed circuit. Therefore, electric charge build-up can occur on the collector electrodes 604, 606 and the membrane 211. This build-up of charge creates an electric field in the vicinity of the membrane 211, the electric field having opposite directions on opposite sides of the plane of the membrane 211.

Also shown in FIG. 6 are two particles 630, 632 disposed on opposed surfaces of the membrane 211. FIGS. 7a and 7b show an enlarged portion of the membrane 211 and the protruding portions 604b, 606b of the two collector electrodes 604, 606 at two different times during a cleaning process using the membrane cleaning apparatus 600.

A particle 630, 632 with a non-zero surface conductivity disposed on either surface of the membrane 211 may have acquired an electric charge from the membrane 211 as a result of the voltage applied by the voltage source 608. The electric charge of said particle 630, 632 is such that an electrostatic force exists which attracts the particle 630, 632 towards the collector electrode 604, 606 facing the surface of the membrane 211 on which the particle 630, 632 is disposed. Note that both conducting and dielectric particles 630, 632 on either side of the membrane 211 are subject to such induced charge (even dielectric particles have a finite, non-zero surface conductivity).

Additionally or alternatively, a particle 630, 632 may have acquired an electric charge through triboelectric interactions with the surface of the membrane 211. The electric charge of said particle 630, 632 may be either positive or negative. The electric charge of said particle 630, 632 is such that an electrostatic force exists which either attracts the particle 630, 632 towards the membrane 211 or the collector electrode 604, 606 facing the surface of the membrane 211 on which the particle 630, 632 is disposed (depending on the sign of the electric charge of the particle 210). It will be appreciated that, when a sufficiently large voltage is applied across the membrane 211 and each of the two collector electrodes 604, 606 (by the voltage source 608) an induced charge that is greater than any triboelectric-induces electric charges. Furthermore, as is described further below, by using two collector electrodes 604, 606 provided on opposite sides of a plane of the membrane 211, the embodiment of membrane cleaning apparatus 600 shown in FIG. 6 is capable of generating relatively large electric fields (and therefore induced charges) without rupturing of the membrane 211. Therefore, for the embodiment of membrane cleaning apparatus 600 shown in FIG. 6 triboelectric-induces electric charges may be irrelevant.

Therefore, the application of a voltage across the electrical terminals of the voltage source 608 will result in a force $F_1$, $F_2$ being applied to at least some particles 630, 632 on the membrane 211 which attracts the particles 630, 632 towards the collector electrode 604, 606 facing the surface of the membrane 211 on which the particles 630, 632 are disposed. The magnitude of the electrostatic attractive force $F_1$, $F_2$ is proportional to the square of the strength of the electric field experienced by the particle 630, 632. For a sufficiently large voltage, these forces $F_1$, $F_2$ will exceed the binding forces (for example Van de Waals forces) between the particles 630, 632 and the membrane 211 and the particles 630, 632 will accelerate away from the membrane 211 and towards the collector electrode 604, 606 facing the surface of the membrane 211 on which the particles 630, 632 are disposed.

The protruding portions 604b, 606b of each of the two collector electrodes 604, 606 are provided with an insulating coating 634, 636. The insulating coatings 634, 636 prevent charge transfer between the collector electrodes 604, 606 and any particles 630, 632 that have been attracted to the collector electrodes 604, 606 via the above-mentioned electric fields. This can prevent particles 630, 632 from being transported from the collector electrodes 604, 606 to the membrane 211. The insulating coatings 634, 636 may have a breakdown strength exceeding the electric fields that will be generated by the voltage supply 608 during use of the membrane cleaning apparatus 600.

The strength of the electric field experienced by a particle 630, 632 may be controlled by controlling the voltage applied across the membrane 211 and the collector electrodes 604, 606. Additionally, the strength of the electric field experienced by a particle 630, 632 may be controlled by controlling: a separation distance 638, 640 between the membrane 211 and each of the collector electrodes 604, 606; and/or controlling the electromagnetic properties and/or thicknesses 642, 644 of the insulating coatings 634, 636.

The membrane cleaning apparatus 600 is configured such that, in use, the distances 638, 640 between the membrane 211 and each of the collector electrodes 604, 606; and thickness 642, 644 of each of the insulating coatings 634, 636 are chosen so as to generally balance the electric field strength on the two opposed surfaces of the membrane 211. By balancing the electric field strength on the two opposed surfaces of the membrane 211, the electrostatic pressure applied to both sides of the membrane 211 (schematically represented by arrows 646, 648) is also balanced.

Figure 7B:
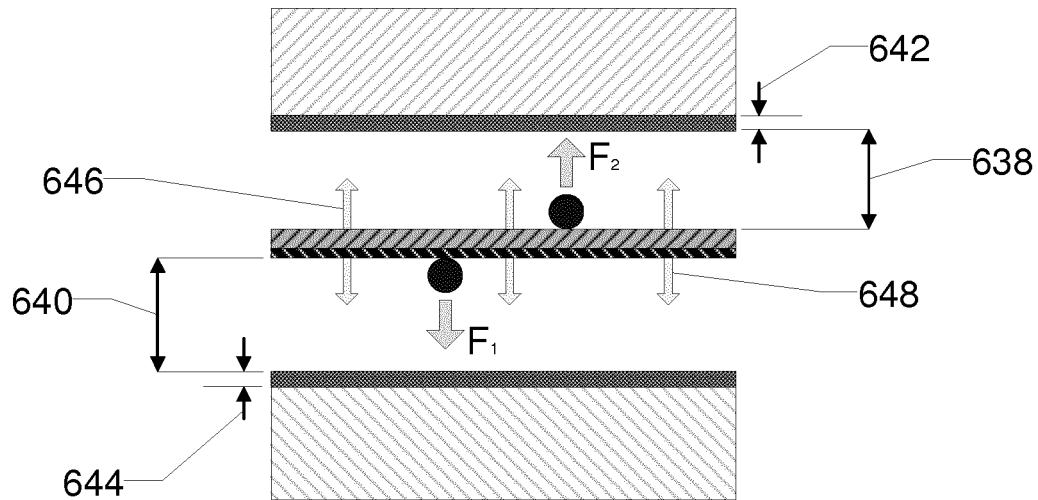

As shown in FIG. 7b, once particles 630, 632 have been transferred electrostatically to the collector electrodes 604, 606, the insulating coatings 634, 636 prevent charge leaking and reduces the risk of reverse transfer of particles from the collector electrodes 604, 606 to the membrane 211. Therefore the electrostatic attractive forces $F_1$, $F_2$ now push the particles 630, 632 onto the insulating coatings 634, 636, holding the particles 630, 632 in place unless the bias applied by the voltage supply 608 is removed. Once this biasing voltage is removed the particles 630, 632 will be bound to the insulating coatings 634, 636 via van der Waals interactions.

The membrane cleaning apparatus 600 shown in FIG. 6 provides an arrangement wherein particles 630, 632 can be removed from a membrane 211 using an electric field. In use, a membrane assembly 208 can be supported by the conducting support 602. The voltage source 608 and the two collector electrodes 604, 606 can be used to generate an electric field in the vicinity of the membrane 211 when supported by the conducting support 602 so as to dislodge particles 630, 632 from a surface of the membrane 211 and to transport such particles 630, 632 away from a surface of the membrane 211.

This embodiment of membrane cleaning apparatus 600 shown in FIG. 6 is particularly suitable for cleaning of a membrane 211, which may be sufficiently thin that it may be liable to rupture under sufficient lateral (out of the plane of the membrane) loading. For example, for a pellicle 15, the application of a lateral pressure of the order of 100 Pa or greater may result in the rupture of the membrane. Since two collector electrodes 604, 606 are provided on opposite sides of a plane of the membrane 211, it is possible to generate an electric field in the vicinity of two opposed surfaces of the membrane 211 simultaneously (when supported by the conducting support 602) such that the electric field in the vicinity of the two opposed surfaces of the membrane 211 are in opposite directions. Advantageously, this allows the pressure on the two sides of the membrane 211 to be at least partially equalised. In turn, this allows larger electric fields to be used, which can provide a greater level of cleaning.

In some embodiments, the membrane cleaning apparatus 600 may be arranged such that the magnitude of the electric field is substantially equal on both sides of the membrane 211 (with the direction of the electric field being different on opposite sides of the membrane 211).

In some embodiments, the membrane cleaning apparatus 600 may be arranged to generate an electric field in the vicinity of the membrane 211 that exceeds a typical electric field that may be experienced by a pellicle 15 within an EUV lithographic apparatus LA. For example, in an EUV lithographic apparatus (see FIG. 1), a patterning device MA may be attached to a support structure MT via an electrostatic clamp. A pellicle 15 may also be attached to the support structure MT such that it covers the patterning device MA. With such an arrangement, the electrostatic clamp may generate a clamping voltage of the order of 1-10 kV (for example 4 kV) and the pellicle 15 may be disposed at a distance of the order of 1-5 mm (for example 2 mm) from the patterning device MA. With such an arrangement, an electric field of the order of 2 to 20 MV/m may be generated in the vicinity of the pellicle 15. In turn, this may exert a force on any particles on the pellicle 15 which exceeds the binding forces (for example Van de Waals forces) that bind the particles to the pellicle 15, causing the particles to accelerate away from the pellicle 15 and towards the patterning device MA. In addition, within an EUV lithographic apparatus there may be a low pressure supply of gas (for example hydrogen) which may form an EUV plasma upon exposure to EUV radiation. Such an EUV-induced plasma may have a finite (non-zero) conductivity and may provide an electrical contact between the pellicle 15 and one or more parts of the electrostatic clamp that are biased up to few kV (relative to the pellicle 15) and may be provided with a thin, insulating coating. By cleaning the pellicle 15 using the membrane cleaning apparatus 600 shown in FIG. 6 and, in particular, generating an electric field in the vicinity of the pellicle that exceeds a typical electric field that may be experienced by the pellicle within an EUV lithographic apparatus LA, substantially all of the particles that could be transferred to the patterning device MA within the EUV lithographic apparatus may be removed before the pellicle 15 is used.

Therefore, in some embodiments the membrane cleaning apparatus 600 may be operable to generate an electric field strength of the order of 1-20 MV/m in the vicinity of the membrane 211. For example, this may be achieved by providing a distance between the membrane 211 and each of the collector electrodes 604, 606 of the order of 0.1-2 mm and providing a voltage supply 608 operable to generate a voltage across the electrical terminals of the voltage source 608 (resulting in a voltage across the conducting surface 209 of the membrane assembly 208 and the collector electrodes 604, 606) of the order of 0.1-40 kV.

The inventors have realised that it may be desirable to generate an electric fields in the vicinity of the membrane 211 that, if only generated on one side of the membrane, may cause the membrane to rupture. The membrane cleaning apparatus 600 shown in FIG. 6 avoids this by generating substantially equal and opposite electric fields on both sides of the membrane so as to at least partially balance the applied pressure.

In general, in some embodiments, any conducing components of the membrane cleaning apparatus 600 may be provided with rounded edges to reduce the risk of sparking or arching that may occur (particularly when large voltages are applied by voltage supply 608) in field concentrating (sharp) points or edges. For example, as can be seen in FIG. 6, the collector electrodes 604, 606 and, in particular the protruding portions 604b, 606b of the collector electrodes 604, 606, and the conducting support 602 are provided with rounded edges for this reason. In addition, the membrane assembly 208 can be additionally provided with a cover or wrap to conceal any sharp edges (for example on the frame 212) and/or metallization edges (omitted for simplicity).

It will be appreciated that although in this embodiment the two collection electrodes 604, 606 are in electrical contact (i.e., at substantially the same voltage), in alternative embodiments the collector electrodes may be not connected but still maintained at substantially equal voltages. In further alternative embodiments, the collector electrodes may not be connected and may be maintained at different voltages, which may be desirable, for example, if the two collector electrodes 604, 606 are positioned such that they are not equidistant from the membrane 211, so as to still ensure that electrostatic forces on both sides of the membrane 211 substantially balance.

It will be appreciated that although this embodiment comprises a conducting support 602, in alternative embodiments the first and second wires 622, 624 may connect directly to the membrane 211 or, alternatively, a conducting member may be provided which does not support the membrane assembly 208 (for example it may connect to an upper surface of the membrane frame 212).

Some embodiments of the present invention utilize an electric field generating mechanism which is operable to generate an electric field in the vicinity of at least one surface of a membrane to be cleaned in combination with a plasma generating mechanism which is operable to generate a plasma adjacent to said at least one surface of the membrane. The electric field generating mechanism is operable to reverse the direction of the electric field. Two examples of such embodiments are now described with reference to FIGS. 8a, 8b and 8c.

Figure 8A:
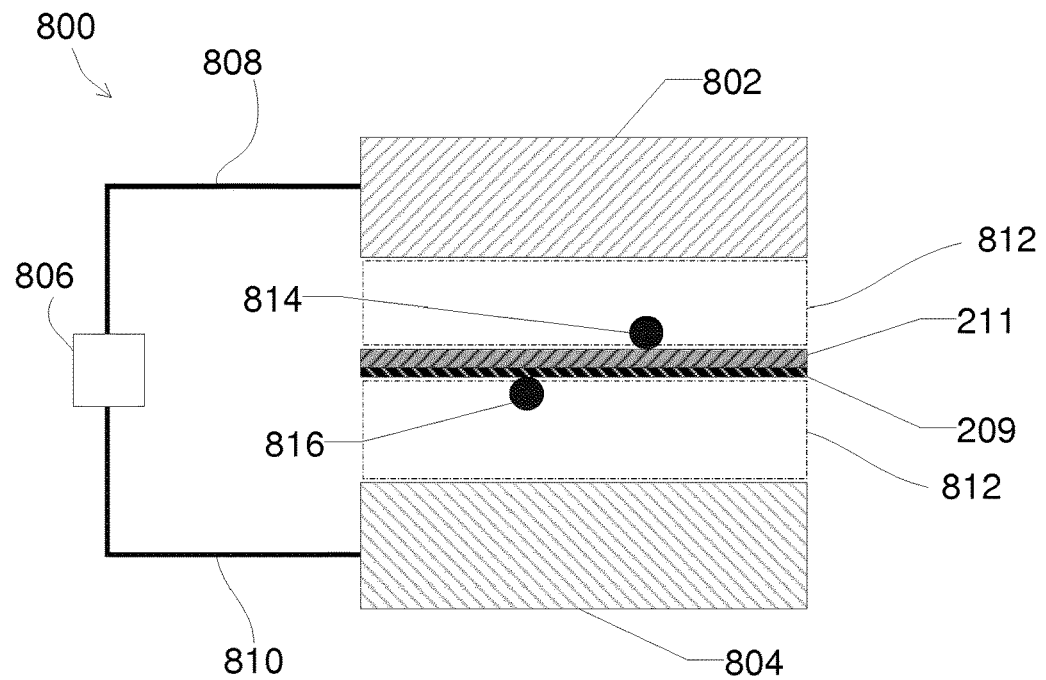
FIG. 8a shows a portion of a further embodiment of a membrane cleaning apparatus according to the invention, and a membrane.

FIG. 8a shows a cross-section of a portion of a cleaning apparatus 800, which comprises two electrodes 802, 804 and a voltage source 806. The voltage source 806 is connected to the two electrodes 802, 804 via wires 808, 810 and is arranged to apply a voltage across the two electrodes 802, 804.

The membrane 211 to be cleaned is disposed between the two electrodes 211. Although not shown, it will be appreciated that the membrane 211 may form part of a membrane assembly and may be supported by a membrane support. Such membrane assembly and membrane support may be generally of the form of the corresponding membrane assembly and membrane support described above for the other embodiments of the invention.

The membrane cleaning apparatus 800 also comprises a plasma generating mechanism which is operable to generate a plasma 812 adjacent to the two surfaces of the membrane 211.

Figure 8B:
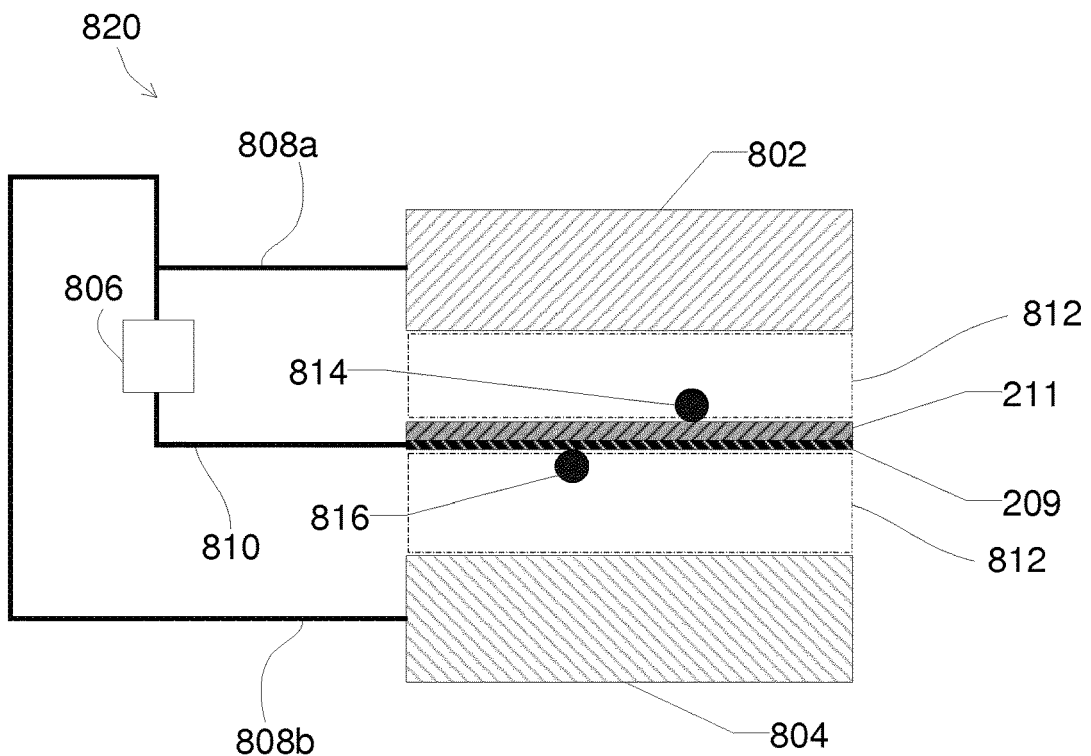
FIG. 8b shows a portion of a further embodiment of a membrane cleaning apparatus according to the invention, and a membrane.

FIG. 8b shows a cross-section of a portion of a cleaning apparatus 820, which also comprises two electrodes 802, 804 and a voltage source 806. In contrast to the cleaning apparatus 800 shown in FIG. 8a, the voltage source 806 of the cleaning apparatus 820 shown in FIG. 8b is connected such that one terminal of the voltage source 806 is connected to the two electrodes 802, 804 via wires 808a, 808b and the other terminal of the voltage source 806 is connected to the conductive portion 209 of the membrane 211 via wires 810.

The voltage source 806 is therefore arranged to apply a voltage across the membrane 211 and each of the electrodes 802, 804.

Again, although not shown, it will be appreciated that the membrane 211 may form part of a membrane assembly and may be supported by a membrane support (and that the electrical connection between the wire 808*b* and the membrane 211 may be via a conductive portion of such a membrane support). Such membrane assembly and membrane support may be generally of the form of the corresponding membrane assembly and membrane support described above for the other embodiments of the invention.

The membrane cleaning apparatus 820 also comprises a plasma generating mechanism which is operable to generate a plasma 812 adjacent to the two surfaces of the membrane 211.

Figure 8C:
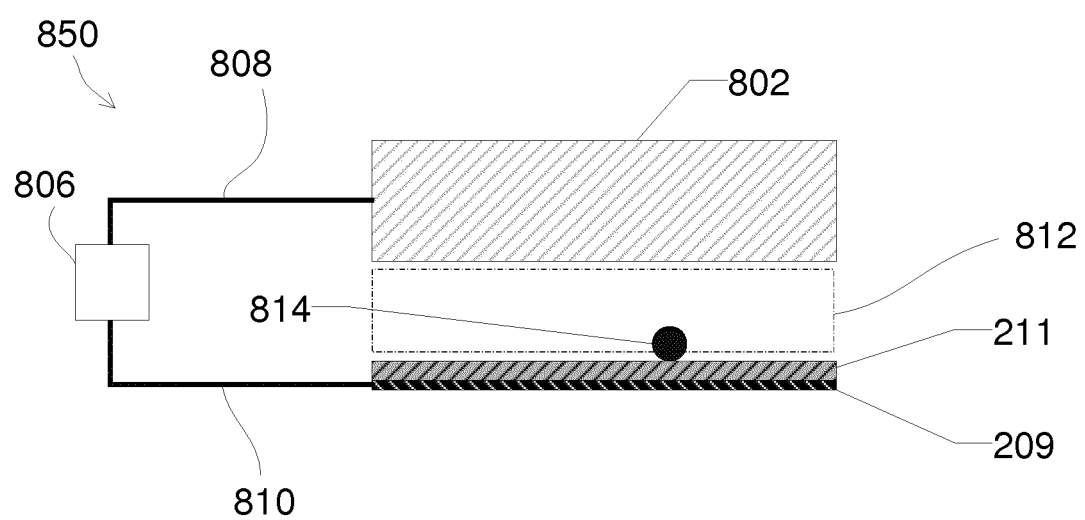
FIG. 8c shows a portion of a further embodiment of a membrane cleaning apparatus according to the invention, and a membrane.

FIG. 8*c* shows a cross-section of a portion of a cleaning apparatus 850, which comprises one electrode 802 and a voltage source 806. The voltage source 806 is connected to the electrodes 802 and a conductive portion 209 of the membrane 211 via wires 808, 810 and is arranged to apply a voltage across the electrode 802 and the membrane 211.

Again, although not shown, it will be appreciated that the membrane 211 may form part of a membrane assembly and may be supported by a membrane support (and that the electrical connection between the wire 810 and the membrane 211 may be via a conductive portion of such a membrane support). Such membrane assembly and membrane support may be generally of the form of the corresponding membrane assembly and membrane support described above for the other embodiments of the invention.

The cleaning apparatus 850 also comprises a plasma generating mechanism which is operable to generate a plasma 812 between the electrode 802 and the membrane 211 (i.e. adjacent to a surface of the membrane 211 which faces the electrode 802).

In each of the cleaning apparatus 800, 820, 850 shown in FIGS. 8*a*-8*c*, the plasma 812 may have a relatively low pressure. As used here, a relatively low pressure plasma 812 may mean that a density of the plasma is such that any applied bias between the membrane 211 and the electrode(s) 802, 804 does not result in sparking or other high current discharges (for example no discharges with currents exceeding 100 mA).

An advantage of the arrangement of a cleaning apparatus 800 as shown in FIG. 8*a* is that this arrangement does not require any electrical connection to the membrane 211 that is being cleaned.

An advantage of the arrangement of a cleaning apparatus 820 as shown in FIG. 8*b* is that this arrangement allows opposed electric fields to be generated on opposite sides of the membrane 211 (in a manner similar to the cleaning apparatus 600 as shown in FIG. 6). If the electric field strengths on opposite sides of the membrane 211 are substantially equal (but opposite) then the electrostatic pressure applied to the two opposed sides of the membrane can be substantially equal, which reduces the risk of rupturing the membrane and increases the amount of biasing voltage that can be applied by the voltage source 806.

In each of the cleaning apparatus 800, 820, 850 shown in FIGS. 8*a*-8*c*, due to the difference in mobility of the electrons and ions within the plasma 812, in the absence of a biasing voltage applied by the voltage source 806, all surfaces in contact with the plasma will become negatively charged. In particular surfaces of the membrane 211 will become negatively charged. This is a mechanism by which particles 814, 816 that are poorly conducting (and so may be poorly cleaned by the previously described embodiments of membrane cleaning apparatus 200, 500, 600) can be charged.

In some embodiments of the cleaning apparatus 800, 820, 850 shown in FIGS. 8*a*-8*c*, the voltage source 806 may be operable to apply a biasing voltage, which will generate an electric field in the vicinity of at least one surface of the membrane 211. There will therefore be a biasing voltage between the membrane 211 and electrodes 802, 804. This will cause a current through the finite conductivity plasma 812, which in turn will deposit a charge on the surface of poorly conducting particles 814, 816. Therefore, due to the finite (non-zero) electrical conductivity of the plasma 812, the membrane 211 and any particles 814, 816 on the membrane 211 obtain a potential (and corresponding charge), of the nearest biased electrode (802, 804). This is a way to provide an enhanced charge on particles 814, 816 that are poorly conducting and do not follow sufficiently well electric field on the membrane 211 and so are poorly cleaned by the previously described embodiments of membrane cleaning apparatus 200, 500, 600. This biasing voltage may be referred to as a charging voltage.

In each of the cleaning apparatus 800, 820, 850 shown in FIGS. 8*a*-8*c*, when a biasing voltage is applied by the voltage source 806, the plasma may be considered to form a virtual electrode adjacent to one or both surfaces of the membrane 211. This virtual electrode is provided by a plasma sheath adjacent to the surface of the membrane and it has the same polarity as the collector electrode 802, 804 which is facing that surface of the membrane 211.

The voltage source 806 is operable to provide a biasing voltage that forces particles 814, 816 which have received a charge from the plasma away from the membrane. This biasing voltage may be referred to as a releasing voltage. For embodiments wherein the charge was acquired from the plasma alone (in the absence of a biasing voltage from the voltage source 806) this is achieved by applying a biasing voltage that forces the (negatively charged) particles 814, 816 away from the membrane 211. For embodiments wherein the charge was acquired from the plasma in the presence of a biasing voltage from the voltage source 806 this is achieved by reversing the polarity of the biasing voltage. If the releasing bias is switched on sufficiently quickly then any particles 814, 816 disposed on the membrane 211 which have acquired a charge via the plasma 812 will be acted on by an electrostatic force that is directed away from the membrane 211 and towards the electrode 802, 804 which that particle 802, 804 is facing. For a sufficiently large biasing voltage, these forces will exceed the binding forces (for example Van de Waals forces) between the particles 814, 816 and the membrane 211 and the particles 814, 816 will accelerate away from the membrane 211 and towards the collector electrode 802, 804 facing the surface of the membrane 211 on which the particles 814, 816 are disposed. Optionally, prior to switching on the releasing voltage, the plasma generating mechanism may be arranged such that the plasma 812 is switched off. This may reduce effect of charge attenuation on the particle, following reversal of bias polarity.

Note that the distance between the membrane 211 and the electrodes 802, 804 for these embodiments will typically be larger than the distance between the membrane 211 and the collector electrodes of the other above-described embodiments in order to support a plasma 812 between the membrane 211 and the electrodes 802, 804. The membrane 211 may have an area of the order of 100 cm$^2$ and in order to create and support a plasma 812 between the membrane 211 and the electrodes 802, 804 a distance between the membrane 211 and the electrodes 802, 804 may be of the order of 30-300 mm. The required bias voltage for releasing particles is a function of the distance between the membrane 211 and the electrodes 802, 804 but may be in order of 100-1000 V for a distance between the membrane 211 and the electrodes 802, 804 of the order of 30-300 mm.

Since pellicles typically have a conductive layer, with this embodiment, the bias voltage can be directly applied to the pellicle (as in the membrane cleaning apparatus 820, 850 shown in FIGS. 8*b* and 8*c*). Alternatively a membrane 211 might be mounted between two electrodes 802, 804 and the bias voltage might be applied to one or both of these electrodes 802, 804 (for example, as in the membrane cleaning apparatus 800 shown in FIG. 8*a*). As previously mentioned, this latter scheme may reduce the risk of mechanical damage to the membrane 211 since no direct connection to the membrane 211 is required.

To minimize ion current flowing from the plasma 812 to the membrane 211 (which would result in in charge neutralization of the particles 814, 816), the release bias voltage should be switched on quickly, for example on a timescale of <0.1 ms.

For embodiments wherein the plasma 812 remains on while the biasing voltage is applied, particles released by the biasing voltage are trapped in the plasma 812 and can be transported elsewhere.

Under conditions whereby there is a plasma 812 and an applied voltage from the voltage source 806 there will be a current that flows through the membrane 211. The magnitude of the current will be dependent on both the applied voltage and the density of the plasma 812. In turn, this current will result in Joule heating of the membrane 211, which may be undesirable. The membrane 211 may have dimensions of the order of 10 cm by 10 cm and may have a thickness of the order of 100 nm. The membrane 211 may have a resistance of the order of 100Ω. The temporal extent of these conditions (having a plasma 812 and an applied voltage), may be limited such that the heat created by the current flowing through the membrane 211 can be dissipated without heating the membrane 211 to a temperature at which the membrane 211 will fail. This can be controlled by controlling the temporal extent of the applied voltages and/or controlling when the plasma 812 is switched on. It may be desirable to ensure that the temperature of the membrane does not exceed 500° C.

In some embodiments, in order to limit the Joule heating of the membrane 211, the biasing voltage may be applied as a pulsed voltage. Applying a pulsed voltage limits the time during which current flows through the membrane 211. In such a mode of operation, particles 814, 816 can be released with minimal heating and minimal charge neutralization by ions.

It will be appreciated that the duty cycle of the pulsed voltage may be limited to ensure that the heat created by the current flowing through the membrane 211 can be dissipated without heating the membrane 211 to a temperature at which the membrane 211 will fail. For example, the duty cycle may be 10% or less, for example 1% or less. The frequency of the pulsed voltage may be between 1 Hz and 10 kHz. Also to limit the Joule heating, the pulse duration of the pulsed voltage may be less than 1 ms. For example, the pulse duration of the pulsed voltage may be less than 10 us.

In some embodiments, to provide sufficient cleaning the electric field strength in the vicinity of the membrane is at least 10 kV/m, more preferably at least 100 kV/m. It will be appreciated that the electric field strength is dependent on the biasing voltage applied by the voltage supply 806 and the distance between the membrane 211 and the collector electrodes 802, 804. However, the electric field strength is also dependent on the plasma 812 (for example the type of plasma, the density of the plasma and so on) and the plasma 812 will, in general, reduce the voltage that should be applied to achieve a desired target electric field strength. In some embodiments, the magnitude of the pulsed voltage may be at least 100 V. For example, the magnitude of the pulsed voltage may be at least 1000 V.

In some embodiments, each pulse of the pulsed voltage may comprise a first portion having a first polarity (and which may be referred to as a charging voltage) and a second portion having a second, opposite polarity (and which may be referred to as a releasing voltage). Advantageously, with such an arrangement, during the first portion the plasma 812 will charge particles 814, 816, the charge corresponding to the polarity of the potential of the electrode 802, 804 facing that particle 814, 816. In the second portion the polarity of the biasing voltage is reversed. If this is done sufficiently quickly then any particles 814, 816 disposed on the membrane 211 which have acquired a charge via the plasma 812 will be acted on by an electrostatic force that is directed away from the membrane 211 and towards the electrode 802, 804 which that particle 814, 816 is facing.

Additionally or alternatively, the plasma 812 may be switched off prior to polarity reversal with a delay no more than 1 ms, preferably no more than 1 us.

For example, the plasma generating mechanism may be arranged such that the plasma 812 is switched on between subsequent pulses of the pulsed voltage and is switched off during pulses of the pulsed voltage.

By synchronising the plasma generating mechanism with the pulsed voltage in this way, in particular having the plasma 812 switched off during pulses of the pulsed voltage, the amount of current which flows through the membrane 211 can be limited. With such an arrangement any limitation on the magnitude and the temporal extent of the voltage pulses can be relaxed. It may be that with this arrangement there is no limitation on the magnitude and the temporal extent of the voltage pulses (for example, if the voltage is applied in a manner that ensures that the electrostatic pressure on opposite sides of the membrane is substantially balanced).

With such an arrangement, as the plasma 812 decays it can still charge poorly conducting particles 814, 816 on the membrane 211 but without causing high currents to flow through the membrane 211.

This procedure of introducing the biasing voltage to remove particles 814, 816 can be repeated at any convenient frequency. For example, the procedure of reversing the biasing voltage to remove particles 814, 816 can be repeated at a frequency of between around 1 Hz and 10 kHz. It has been found that such an arrangement can efficiently and quickly remove substantially all particles with dimensions of around 30 nm and larger. For example, it has been found that such an arrangement can efficiently and quickly remove >99% of particles with dimensions of around 30 nm and larger in a cleaning time of less than 1 second.

A membrane cleaning apparatus 900 according to a fifth embodiment of the invention is now described with reference to FIG. 9, which shows a cross-section through the membrane cleaning apparatus 900.

The membrane cleaning apparatus 900 shown in FIG. 9 shares several features in common with the membrane cleaning apparatus 500 shown in FIG. 5. Any features of the membrane cleaning apparatus 900 shown in FIG. 9 which generally correspond to, and may be generally the same as, features of the membrane cleaning apparatus 500 shown in FIG. 5 share common reference numerals therewith.

Only the differences between the membrane cleaning apparatus 900 shown in FIG. 9 and the membrane cleaning apparatus 500 shown in FIG. 5 will be discussed in detail below.

The membrane cleaning apparatus 900 comprises: a vacuum chamber 901, a window 912, wires 206a, 206b, and vacuum feedthroughs 207a, 207b, similarly to the membrane cleaning apparatus 500 shown in FIG. 5.

The membrane cleaning apparatus 900 also comprises: a support 904; two electrodes 902a, 902b; a voltage source 905; a laser 914; and a beam delivery system 918. In use, a membrane assembly 208 (comprising a membrane 211 and a generally rectangular frame 212) is disposed on the support 904.

The voltage source 905 may be generally of the same form as the voltage source 205 shown in FIG. 2. The voltage source 905 may be arranged to apply a time-varying voltage (for example, a time-varying voltage comprising a plurality of pluses).

A difference between the membrane cleaning apparatus 900 shown in FIG. 9 and the membrane cleaning apparatus 500 shown in FIG. 5 is that the membrane cleaning apparatus 900 shown in FIG. 9 comprises a different mechanism for inducing mechanical oscillations in the membrane 211.

Another difference between the membrane cleaning apparatus 900 shown in FIG. 9 and the membrane cleaning apparatus 500 shown in FIG. 5 is that the laser 914 and beam delivery system 918 of the membrane cleaning apparatus 900 are provided so as to control a temperature of at least a portion of the membrane 211.

Another difference between the membrane cleaning apparatus 900 shown in FIG. 9 and the membrane cleaning apparatus 500 shown in FIG. 5 is that an arrangement of the electrodes 902a, 902b is different from the arrangement of the electrode 502.

One terminal of the voltage source 905 is connected to the electrode 902a using the wire 206a which travels through vacuum feedthrough 207a. The opposite terminal of the voltage source 905 is connected to the electrode 902b using the wire 206b which travels through vacuum feedthrough 207b. The two electrodes 902a, 902b are adjacent to each other. The electrodes 902a, 902b are disposed on a same side of the membrane 211 of the membrane assembly 208. The two electrodes 902a, 902b may comprise a tapered portion having a smaller cross sectional area at an end thereof which is adjacent to, and facing, the membrane 211.

In use, the electric potential of the membrane 211 of the membrane assembly 208 may be floating (i.e., not fixed). Alternatively, the membrane 211 of the membrane assembly 208 may be held at a fixed electric potential (such as a fixed DC bias or ground). Having the membrane 211 at a floating electric potential may be preferred.

The electric potential of the membrane 211 may be controlled by connecting the membrane 211 to a voltage source (not shown). Alternatively, the electric potential of the membrane 211 may be controlled by connecting the support 904 to a voltage source (not shown). The conductive coating 209 of the membrane assembly 208 is in contact with the support 904, thereby ensuring electrical contact between the support 904 and the membrane 211. Charge may build-up on the membrane 211.

The two electrodes 902a, 902b are positionable proximate to a surface of the membrane 211 when supported by the support 904. In use, the electrodes 902a, 902b are disposed proximate to the membrane 211. The voltage source 905 applies a voltage across electrodes 902a, 902b. Therefore, electric charge can build up on the electrodes 902a, 902b. Whether the electric potential of the membrane 211 is fixed or floating, there may be a general electric potential difference (a bias) between the membrane 211 and the electrodes 902a, 902b.

As electric charge builds up on the electrodes 902a, 902b, an electric field exists in a vicinity of the electrodes 902a, 902b and the membrane 211. Electric charge carriers within the membrane 211 may shift such that an electric charge is induced in the membrane 211. A particle 210 present on the membrane 211 may also acquire an induced electric charge.

As electric charge builds up on the electrodes 902a, 902b (and on the membrane 211), there will be an electrostatic attractive force between each of the electrodes 902a, 902b and the membrane 211.

Since the membrane 211 is relatively thin and, therefore, flexible, the membrane 211 will be distorted by any attractive force between the membrane 211 and each of the electrodes 902a, 902b.

The build-up of electric charge, giving rise to electrostatic forces in the vicinity of a membrane assembly 208, is exploited in the current embodiment. Specifically, mechanical oscillations are induced in the membrane 211 by configuring temporal characteristics of said electrostatic forces. This is achieved according to the current embodiment of the invention by applying a time-varying voltage across the electrodes 902a, 902b and either by allowing the electric potential of the membrane 211 to float or by holding the membrane 211 at a fixed electric potential (i.e., a fixed voltage).

As described above in detail with reference to FIGS. 2, 3, and 4, pulsed electrostatic forces may induce oscillations in the membrane 211. A particle 210 and the membrane 211 on which it is disposed may act as a composite oscillating system, and, for a certain (resonant) frequency of oscillation of the membrane 211, a separation between the particle 210 and the membrane 211 may increase to such an extent that the particle 210 is no longer bound to the membrane 211. This principle of removing particles 210 from a membrane 211 by inducing oscillations in the membrane at a resonant frequency of the particle 210 is exploited in the membrane cleaning apparatus 900.

During the application of a time-varying voltage across the electrodes 902a, 902b, there may be a time-averaged net electric field between the membrane 211 and the electrodes 902a, 902b. As discussed above, any particle 210 removed from the membrane 211 may have acquired an electric charge. This electric charge of the particle 210 and said net electric field between the membrane 211 and the electrodes 902a, 902b may be such that any particle 210 removed from the membrane 211 using the membrane cleaning apparatus 900 may be attracted towards the electrodes 902a, 902b.

The electrodes 902a, 902b are used to induce oscillations in the membrane 211. Hence, the electrodes 902a, 902b may be referred to as excitation electrodes. After being removed from the membrane 211, a particle 210 may be attracted to one or both of the electrodes 902a, 902b, depending on the electric charge of the particle 210 and on the polarity of each of the electrodes 902a, 902b. Hence, the electrodes 902a, 902b may be referred to as collector electrodes.

A side of the membrane 211 which faces a patterning device (such as the patterning device MA) when used in a lithographic apparatus (such as the lithographic apparatus LA) may be referred to as a "critical side" of the membrane 211, as it is from this critical side that particles 210 disposed on the membrane 211 may be transported to the patterning device MA and impact lithographic performance. The opposite side of the membrane 211, which faces away from a patterning device when used in a lithographic apparatus, may be referred to as a "non-critical side".

In the membrane cleaning apparatus 900 shown in FIG. 9, the electrodes 902a, 902b are arranged relative to the membrane 211 such that the electrodes 902a, 902b face the critical side of the membrane 211. With such an arrangement, it may be beneficial to arrange the application of a time-varying voltage across the electrodes 902a, 902b such that there is a time-averaged net electric field between the membrane 211 and the electrodes 902a, 902b. This net electric field may ensure that any particle 210 removed from (the critical side of) the membrane 211 using the membrane cleaning apparatus 900 may be attracted towards the electrodes 902a, 902b.

An arrangement of the electrodes 902a, 902b relative to the membrane 211 may be different to that shown in FIG. 9. The electrodes 902a, 902b may instead be arranged such that the electrodes 902a, 902b face the non-critical side of the membrane 211. For example, the membrane assembly 208 may be placed on the support 904 at a different orientation to the orientation shown in FIG. 9, and/or the electrodes 902a, 902b may be disposed in a different area of the vacuum chamber 901 to the area shown in FIG. 9.

In an arrangement wherein the electrodes 902a, 902b face the non-critical side of the membrane 211, there will be an electric field present between the electrodes 902a, 902b and the membrane 211, but this electric field will generally not extend past the membrane 211. There will generally be no electric field proximate to the critical side of the membrane 211. In such an arrangement, oscillations may be induced in the membrane 211 and particles 210 disposed on the membrane 211 may be removed from the membrane 211 as described above with reference to FIG. 9. However, in such an arrangement, particles 210 which are removed from the critical side of the membrane 211 may be transported away from the membrane 211 as a result of momentum of said particles 210 after being effectively 'launched' from the membrane 211. That is, an electric field may not have an effect on transporting particles 210 away from the critical side of the membrane 211 after said particles are removed from the critical side of the membrane 211. Further, the electrodes 902a, 902b and the membrane 211 may be arranged relative to each other such that a force of gravity also helps to remove particles away from the membrane 211 after said particles are removed from the critical side of the membrane 211 (by the induced oscillations).

It will be appreciated that this modification of the membrane cleaning apparatus 900 (wherein the electrodes 902a, 902b face the non-critical side of the membrane 211) may be described as comprising: a membrane support for supporting the membrane 211; and an electric field generating mechanism for generating an electric field in the vicinity of the membrane 211 when supported by the membrane support.

It will be further appreciated that this modification of the membrane cleaning apparatus 900 may be described as comprising a mechanism for inducing mechanical oscillations in the membrane 211 when supported by the membrane support.

Oscillations are induced in the membrane 211 using the membrane cleaning apparatus 900 in a similar way to the way in which oscillations are induced in the membrane 211 using the membrane cleaning apparatus 200. Particularly, both the membrane cleaning apparatus 900 and the membrane cleaning apparatus 200 induce oscillations in the membrane using time-varying (e.g., pulsed) electrostatic forces between one or more electrodes and the membrane 211. In the membrane cleaning apparatus 900, said time-varying or pulsed electrostatic force between the membrane 211 and an electrode 902a, 902b arises as a result of the application of the time-varying or pulsed voltage from the voltage source 905.

The time-varying voltage utilised for inducing oscillations in the membrane 211 may comprise a plurality of temporally spaced pulses. Similarly to the pulsed voltage provided by voltage source 205 of the membrane cleaning apparatus 200 shown in FIG. 2, temporal features of the voltage supplied by voltage source 905 may be configured to induce a desired range of frequencies of oscillation of the membrane 211 (i.e., a desired excitation spectrum). As described in detail above with reference to FIG. 4, resonant frequencies of a particle 210 may vary with the size of said particle 210 due to mass dependency of the fundamental (or eigen) frequency, $v_0$. In order to remove particles 210 that have a range of sizes, the pulsed voltage provided by voltage source 905 may be configured to create an excitation spectrum which is tailored to remove particles 210 having a size within a predetermined range.

It will be appreciated that, as described thus far, the membrane cleaning apparatus 900 (FIG. 9) removes particles 210 from the membrane 211 using substantially the same method as the membrane cleaning apparatus 200 (FIG. 2). The arrangement of electrodes 902a, 902b in FIG. 9 is different to that of electrode 202 in FIG. 2. The arrangement of electrodes 902a, 902b in FIG. 9 may allow for a more spatially localised excitation of the membrane 211 compared with the arrangement of the electrode 202 in FIG. 2. Advantageously, this arrangement of electrodes 902a, 902b in FIG. 9 may require lower energy to be operated than an electrode which is large enough so as to induce oscillations across a larger area of the membrane 211 (such as the electrode 202 in FIG. 2). This may be described as improving the efficiency of the membrane cleaning apparatus 900. Further, the arrangement of electrodes 902a, 902b in FIG. 9 may induce a greater amplitude of oscillation of a portion of the membrane 211 than that induced by the electrode 202 in FIG. 2 (for a given amplitude of the applied voltage). This may be described as improving membrane cleaning efficacy.

The membrane cleaning apparatus 900 is configured to control a temperature of at least a portion of the membrane 211 The membrane cleaning apparatus 900 is configured to control a temperature of at least a portion of the membrane 211 during the induction of mechanical oscillations of the membrane 211. The membrane cleaning apparatus 900 is configured to increase a temperature of (i.e., heat) at least a portion of the membrane 211. In particular, the membrane cleaning apparatus 900 may heat a portion of the membrane 211 at the same time as said portion of the membrane 211 is undergoing mechanical oscillations. Heating said portion of the membrane 211 which is undergoing mechanical oscillations may result in expansion of said portion of the membrane 211. This may cause a reduction in local tension in said portion of the membrane 211. The tension of the membrane 211 may alternatively be referred to as the pre-tension of the membrane 211. The mechanism by which the membrane 211 is heated is now described.

The laser 914 comprises a laser source 915. The beam delivery system 918 comprises optics 920. In use, the laser source 915 produces a laser beam 916. The optics 920 of the beam delivery system 918 are arranged such that the laser beam 916 is shaped by the beam delivery system 918 so as to propagate through the window 912 and so as to be incident on a surface of the membrane 211.

A portion of the membrane 211 on which the laser beam 916 is incident may be described as a "laser spot region". The beam delivery system 918 may shape the laser beam 916 such that the laser spot region covers a desired fraction of the surface of the membrane 211 (such as the portion shown schematically in FIG. 9). Alternatively, the beam delivery system 918 may shape the laser beam 916 such that the laser spot region covers the entirety of the membrane 211 within the frame 212. The beam delivery system 918 may be configured to control a spatial intensity profile of the laser beam 916. For example, the beam delivery system 918 may shape the spatial intensity profile of the laser beam 916 such that it is flat (i.e., a 'top hat').

When the laser beam 916 is incident on the surface of the membrane 211, a portion of the (radiative) energy will be received by the surface of the membrane 211. This may increase a temperature of the membrane 211 within the laser spot region of the membrane 211. Any portion of the membrane 211 which increases in temperature may consequently undergo thermal expansion. Thermal expansion of a portion of the membrane 211 may alter the tension of the membrane 211, σ. In particular, said thermal expansion may decrease the tension of the membrane 211, σ.

The frame 212 of the membrane assembly 208 is generally not heated. In particular, the frame 212 is generally not heated by the laser beam 916. Therefore, the membrane 211 may undergo thermal expansion whilst the frame 212 may not. This may be described as the membrane 211 undergoing thermal expansion within a fixed frame 212. This may lead to what may be described as a 'sagging' of the membrane 211 within the frame 212.

As discussed above, the fundamental frequency of oscillators, $v_0$, may be described by the following equation:

$$v_0 \cong \sqrt{\sigma \frac{\hbar}{2\pi M \ln(d)}}.$$

The fundamental frequency, $v_0$, is proportional to $\sqrt{\sigma}$. Therefore, for a particle 210 of fixed mass, M, (which may be assumed to correspond to a particle 210 having a fixed size) a reduction in membrane 211 tension lowers the fundamental frequency of the oscillating system defined by the membrane 211 and the particle 210.

An excitation spectrum arises in the membrane 211 as a result of the time-varying voltage being applied across the electrodes 902a, 902b by the voltage source 905. The voltage source 905 may generally correspond to a commercially available pulsed voltage source. Such a voltage source may have an upper limit of the frequency at which voltage pulses may be provided. As may be seen in the equation given in the previous paragraph, this corresponds to there being a lower limit for the mass (and consequently size) of particles that may be removed by inducing mechanical oscillations of the membrane 211.

Increasing the frequency at which oscillations are induced in the membrane 211 would enable the removal of smaller particles 210 from the membrane 211, but this may not be possible due to the aforementioned upper frequency limit of the voltage source 905. However, by reducing the tension of the membrane 211 (e.g., by using the laser beam 916 as described above to locally heat the membrane 211 in a vicinity of the particle 210), the fundamental frequency of oscillations of particles 210 on the portion of the membrane with reduced tension is also reduced. The upper frequency limit of the voltage source 905 will thus correspond to a fundamental frequency of particles 210 with a lower mass than if the tension of the membrane 211 were not reduced. Therefore, advantageously, reducing the pre-tension of the membrane 211 (e.g., by using the laser beam 916 as described above) enables smaller particles 210 to be cleaned from the membrane 211 than if the tension of the membrane 211 were not reduced.

The membrane cleaning apparatus 900 exemplifies an embodiment of the present invention in which time-varying or pulsed electrostatic attraction is used to remove particles 210 from the membrane 211 and in which a laser beam 916 is used to heat at least a portion of the membrane 211, thereby advantageously increasing a range of size of particles 210 that may be removed from the membrane 211.

Heating only a portion of the membrane 211 may result in redistribution of tension within the membrane 211. This may limit efficacy of reducing tension in an irradiated portion of the membrane 211 by using the laser 914. Configuring the beam delivery system 918 such that the laser spot region covers the entirety of the membrane 211 within the frame 212 may be beneficial as this may limit any redistribution of tension within the membrane 211. The laser spot region may cover substantially all of the surface of the membrane 211 within the frame 212. The laser spot region may cover approximately 50% of the surface of the membrane 211 within the frame 212. The laser spot region may cover less than 50% of the surface of the membrane 211 within the frame 212. The laser spot region may cover approximately 10% of the surface of the membrane 211 within the frame 212. The laser spot region may cover less than 10% of the surface of the membrane 211 within the frame 212.

In some embodiments, the laser source 915 may be configured to provide a laser beam 916 having a power between 1 W and 100 W. As discussed above, the laser spot region may cover a portion of the surface of the membrane 211 (such as the portion shown schematically in FIG. 9). In some embodiments, the optics 920 of the beam delivery system 918 may shape the laser spot region such that a power density of the laser beam 916 on the membrane 211 is between 1 W cm$^{-2}$ and 10 W cm$^{-2}$. In some embodiments, a temperature of a portion of the membrane 211 may be increased by between 100° C. and 1000° C. In some embodiments, a temperature of a portion of the membrane 211 may be increased by between 200° C. and 500° C. In some embodiments, tension of an irradiated portion of the membrane 211 may be reduced by a factor of between 10 and 100.

In some embodiments, a lateral separation 922 between a particle 210 and the nearest electrode 902b may be less than 10 mm. In some embodiments, a lateral separation 922 between a particle 210 and an electrode 902b may be less than 1 mm. In some embodiments, a separation 924 between the membrane 211 and an electrode 902b may be less than 1 mm. In some embodiments, a separation 924 between the membrane 211 and an electrode 902b may be less than 0.1 mm.

It has been described above how a laser beam 916 is used to heat at least a portion of the membrane 211, thereby advantageously increasing a range of size of particles 210 that may be removed from the membrane 211. In use, it may be desirable to remove particles 210 having a range of sizes from the membrane 211.

Removing particles 210 having a range of sizes from the membrane 211 may be achieved in the membrane cleaning apparatus 900 by varying (sweeping) the tension of an irradiated portion of the membrane 211 (e.g., by varying a power of the laser beam 916) whilst the voltage source 905 and electrodes 902a, 902b induce oscillations in the membrane. A frequency at which oscillations are induced in the membrane 211 may be fixed during said sweeping of tension.

Removing particles 210 having a range of sizes from the membrane 211 may be achieved in the membrane cleaning apparatus 900 by varying (sweeping) the frequency at which oscillations are induced in the membrane 211 (e.g., by varying a frequency at which individual pulses of a pulsed voltage generated by the voltage source 905 are provided) whilst the laser beam 916 is used to provide a relatively low tension of an irradiated portion of the membrane 211. A power of the laser beam 916 may be fixed during said sweeping of frequency.

In use, the membrane assembly 208 may be moved relative to the electrodes 902a, 902b such that different portions of the membrane 211 may be cleaned using the membrane cleaning apparatus 900. The two electrodes 902a, 902b may be movable relative to the support 904 such that they can scan across the surface of the membrane 211 when supported by the support 904. In use, the membrane assembly 208 may be moved relative to the laser spot region such that different portions of the membrane 211 may be irradiated using the laser beam 916 of the membrane cleaning apparatus 900. In use, the beam delivery system 918 may be configured to control a position of the laser spot region on the surface of the membrane 211.

Advantageously, in any embodiment of membrane cleaning apparatus which is configured to heat at least a portion of the membrane 211, a resonant frequency for a particle 210 of fixed mass disposed on the membrane 211 is reduced, thereby enabling smaller particles 210 to be removed from the membrane 211 than if the membrane 211 were not heated.

It will be appreciated that several features have been introduced in the membrane cleaning apparatus 900 but these features need not be used together in a single embodiment. It will be further appreciated that features of the membrane cleaning apparatus 900 may be used in combination with features of other embodiments (for example, features of the membrane cleaning apparatus 200).

The method of heating the membrane 211 whilst inducing mechanical oscillations in the membrane 211 (as described above with reference to FIG. 9) may be used in a different setup of apparatus to that shown in FIG. 9. For example, a membrane cleaning apparatus may comprise the laser 914 and the beam delivery system 918 of FIG. 9 (for heating the membrane 211), and may also comprise the combined excitation/collector electrode 202 of FIG. 2 (for removing particles 210 from the membrane 211).

Alternative means of heating the membrane 211 may be used. For example, a membrane cleaning apparatus may comprise an inductive heating apparatus (for heating the membrane 211) and the combined excitation/collector electrode 202, the electrodes 902a, 902b, or an entirely different arrangement of electrodes which is configured to induce mechanical oscillations in the membrane 211. In some embodiments, an antenna of the inductive heating apparatus may be dimensioned such that the antenna is smaller than or approximately equal to the size of the frame 212. In some embodiments, the antenna and membrane 211 may be separated by less than 10 cm. In some embodiments, the antenna and membrane 211 may be separated by less than 1 cm.

A membrane cleaning apparatus 1000 according to a sixth embodiment of the invention is now described with reference to FIG. 10a, which shows a cross-section through the membrane cleaning apparatus 1000.

Figure 10A:
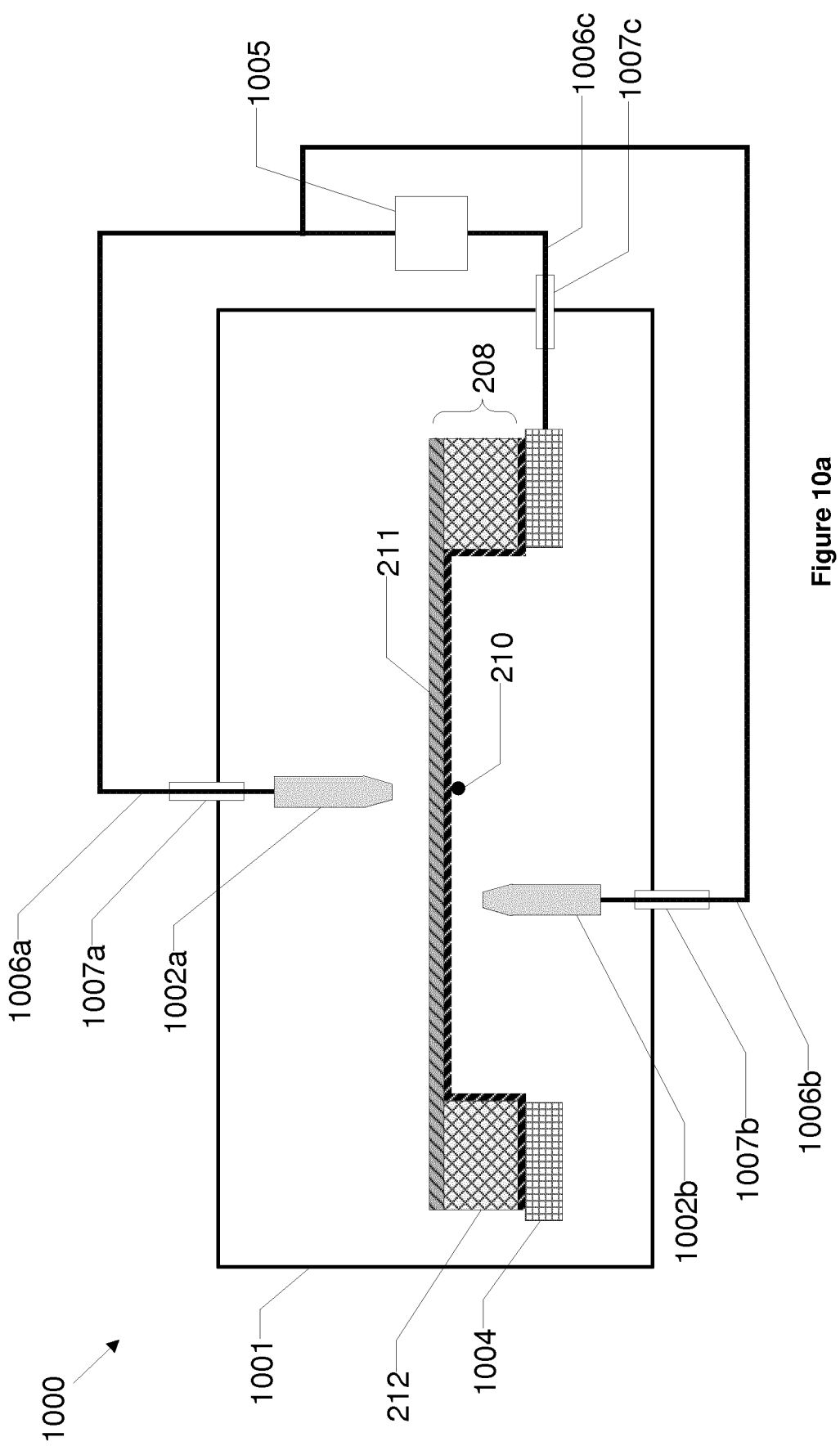
FIG. 10a shows a portion of a further embodiment of a membrane cleaning apparatus according to the invention, and a membrane.

The membrane cleaning apparatus 1000 shown in FIG. 10a shares several features in common with other membrane cleaning apparatus described herein. Any features of the membrane cleaning apparatus 1000 shown in FIG. 10 which generally correspond to, and may be generally the same as, features of other membrane cleaning apparatus described herein share common reference numerals therewith.

Only the differences between the membrane cleaning apparatus 1000 shown in FIG. 10a and other membrane cleaning apparatus described herein will be discussed in detail below.

The membrane cleaning apparatus 1000 comprises: a vacuum chamber 1001; wires 1006a, 1006b, 1006c; vacuum feedthroughs 1007a, 1007b, 1007c; a conducting support 1004; two electrodes 1002a, 1002b; and a voltage source 1005. In use, a membrane assembly 208 (comprising a membrane 211 and a generally rectangular frame 212) is disposed on the conducting support 1004.

The two electrodes 1002a, 1002b are disposed on opposite sides of the plane of the membrane 211. The electrodes 1002a, 1002b are disposed proximate to opposite surfaces of the membrane 211. The two electrodes 1002a, 1002b do not extend adjacent to the entire membrane 211. The two electrodes 1002a, 1002b may comprise a tapered portion having a smaller cross sectional area at an end thereof which is adjacent to, and facing, the membrane 211. Each of the two electrodes 1002a, 1002b are disposed proximate to a portion of the membrane 211 (said portion may, for example, correspond to a portion which overlaps with a cross section of the tapered portion of the electrode 1002a, 1002b). The portion of the membrane 211 that each electrode 1002a, 1002b is adjacent to is dependent on a position of each electrode 1002a, 1002b in a plane parallel to the plane of the membrane 211. In this embodiment, the position of electrode 1002a in a plane parallel to the plane of the membrane 211 does not align with the position of electrode 1002b. That is, although on opposite sides of the membrane 211 the electrodes 1002a, 1002b may be described as being laterally offset from each other. The electrodes 1002a, 1002b may be positioned such that a maximum distance between the electrodes 1002a, 1002b, in a plane parallel to the plane of the membrane 211, is 1 cm. This distance may be referred to as a lateral offset. The electrodes 1002a, 1002b may be positioned such that a maximum distance between the electrodes 1002a, 1002b, in a plane parallel to the plane of the membrane 211, is 1 mm. As described above, an area of each of the electrodes 1002a, 1002b closest to the membrane 211 (for example an area of the tapered portion), in a cross-section parallel to the plane of the membrane 211, is smaller than the area of the membrane 211. An area of each of the electrodes 1002a, 1002b closest to the membrane 211, in a cross-section parallel to the plane of the membrane 211, may be less than or equal to 1 cm$^2$, for example less than or equal to 10 mm$^2$. A largest dimension of each of the electrodes 1002a, 1002b is aligned generally perpendicular to the plane of the membrane 211.

Electrodes 1002a, 1002b are connected, via wires 1006a, 1006b and vacuum feedthroughs 1007a, 1007b, to a common terminal of the voltage source 1005. Conducting support 1004 is connected, via wire 1006c and vacuum feedthrough 1007c, to the opposite terminal of the voltage source 1005. In a variation of the current embodiment, said opposite terminal of the voltage source 1005 may instead be connected directly to the membrane assembly 208. In such a variation, it may be that the conducting support 1004 is replace by a non-conducting membrane support.

The voltage source 1005 may be generally of the same form as the voltage source 608 shown in FIG. 6. In use, each of the electrodes 1002a, 1002b may be held at a substantially equal voltage, and the membrane 211 may be held at a voltage the polarity of which is opposite the polarity of the voltage at which the electrodes 1002a, 1002b are held. The magnitude of the electric field may be substantially equal on both sides of the membrane 211. The voltage applied across the terminals of the voltage source 1005 may be configured so as to achieve this result. In particular, the voltage applied across the terminals of the voltage source 1005 may be configured such that the electric field in the vicinity of the two opposed surfaces of the membrane 211 has a magnitude of at least 100 kV/m. The voltage applied across the terminals of the voltage source 1005 may be configured such that the electric field in the vicinity of the two opposed surfaces of the membrane has a magnitude of at least 1 MV/m. At least a portion of one or more of the electrodes 1002a, 1002b may be provided with an insulating coating.

The membrane cleaning apparatus 1000 (FIG. 10a) may remove particles 210 from the membrane 211 using substantially the same method as the membrane cleaning apparatus 600 (FIG. 6), which is described in detail above. That is, the electrodes 1002a, 1002b may generate an electric field which attracts particles 210 away from the membrane 211. The arrangement of electrodes 1002a, 1002b in FIG. 10a is different to that of electrodes 604, 606 in FIG. 6. The arrangement of electrodes 1002a, 1002b in FIG. 10a may allow for a relatively spatially localised deformation of the membrane 211. Advantageously, this arrangement of electrodes 1002a, 1002b in FIG. 10a may require lower energy to be operated than the energy required to operate the relatively large electrodes 604, 606 of FIG. 6 (in order to achieve an electric field of the same magnitude in the vicinity of the two opposed surfaces of the membrane 211). This may be described as improving the efficiency of the membrane cleaning apparatus 1000.

The membrane cleaning apparatus 1000 may comprise a mechanism for controlling a position of the membrane assembly 208 relative to the electrodes 1002a, 1002b. In use, the membrane assembly 208 may be moved relative to the electrodes 1002a, 1002b such that different portions of the membrane 211 may be cleaned using the membrane cleaning apparatus 1000. Additionally or alternatively, the two electrodes 1002a, 1002b may be movable relative to the conducting support 1004 such that they can scan across the surface of the membrane 211 when supported by the conducting support 1004.

It will be appreciated that the electrodes 1002a, 1002b, when used as described above with reference to FIG. 10a, may be described as collector electrodes.

Alternatively, the voltage source 1005 may be generally of the same form as the voltage source 205 shown in FIG. 2. The voltage source 1005 may be arranged to apply a time-varying voltage (for example, a time-varying voltage comprising a plurality of pluses). In use, a time-varying voltage may be applied across the electrodes 1002a, 1002b and the conducting support 1004. This time-varying voltage may be applied such that the electrodes 1002a, 1002b are held at voltages which are substantially equal in magnitude and of the same polarity, and the membrane 211 may be held at a voltage which is opposite the polarity of the voltage at which the electrodes 1002a, 1002b are held.

The membrane cleaning apparatus 1000 (FIG. 10a) may remove particles 210 from the membrane 211 using substantially the same method as the membrane cleaning apparatus 200 (FIG. 2), which is described in detail above. That is, oscillations may be induced in the membrane 211 using the membrane cleaning apparatus 1000 in a similar way to the way in which oscillations are induced in the membrane 211 using the membrane cleaning apparatus 200. Particularly, both the membrane cleaning apparatus 1000 and the membrane cleaning apparatus 200 induce oscillations in the membrane using time-varying (e.g., pulsed) electrostatic forces between one or more electrodes and the membrane 211. In the membrane cleaning apparatus 1000, said time-varying or pulsed electrostatic force between the membrane 211 and each of the electrodes 1002a, 1002b arises as a result of the application of the time-varying or pulsed voltage from the voltage source 1005. In contrast to membrane cleaning apparatus 200, adjacent portions of the membrane 211 are attracted to electrodes 1002a, 1002b in opposite directions due to the arrangement of the electrodes 1002a, 1002b and the voltages applied thereto. That is, a portion of the membrane 211 proximate to electrode 1002a will be attracted to electrode 1002a and a portion of the membrane 211 proximate to electrode 1002b will be attracted to electrode 1002b.

The time-varying voltage utilised for inducing oscillations in the membrane 211 may comprise a plurality of temporally spaced pulses. Pulses of the time-varying voltage across electrode 1002a occur in phase with pulses of the time-varying voltage across electrode 1002b. Therefore, attraction of a portion of the membrane 211 to electrode 1002a occurs in phase with attraction of an adjacent portion of the membrane 211 to electrode 1002b. Similarly to the pulsed voltage provided by voltage source 205 of the membrane cleaning apparatus 200 shown in FIG. 2, temporal features of the voltage supplied by voltage source 1005 may be configured to induce a desired range of frequencies of oscillation of the membrane 211 (i.e., a desired excitation spectrum). As described in detail above with reference to FIGS. 2, 3, and 4, the pulsed voltage provided by voltage source 1005 may be configured to create an excitation spectrum which is tailored to remove particles 210 having a size within a predetermined range.

A membrane cleaning apparatus 1020 according to a seventh embodiment of the invention is now described with reference to FIG. 10b, which shows a cross-section through the membrane cleaning apparatus 1020.

Figure 10B:
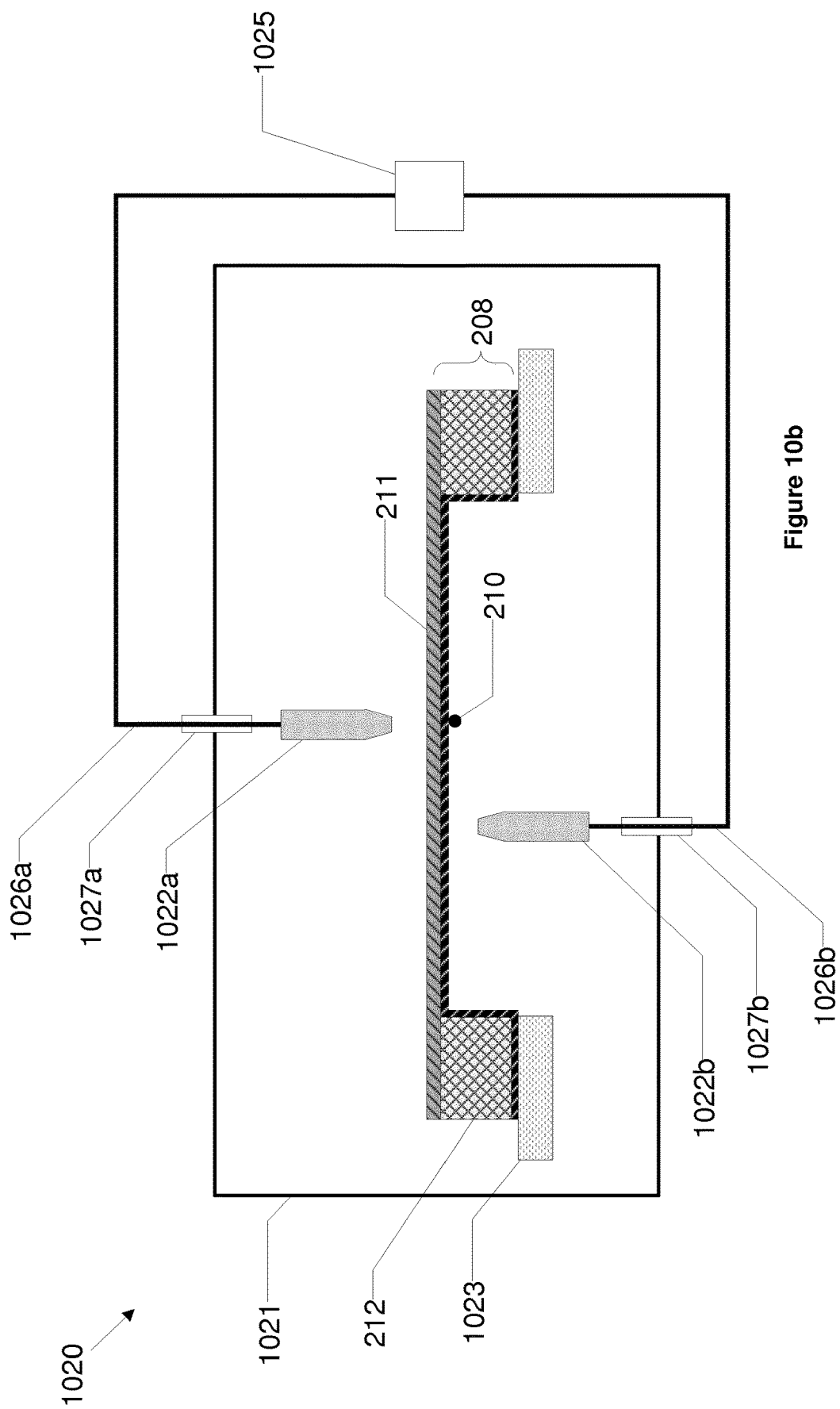
FIG. 10b shows a portion of a further embodiment of a membrane cleaning apparatus according to the invention, and a membrane.

The membrane cleaning apparatus 1020 shown in FIG. 10b shares several features in common with membrane cleaning apparatus 1000 shown in FIG. 10a. Only the differences between the membrane cleaning apparatus 1020 shown in FIG. 10b and membrane cleaning apparatus 1000 shown in FIG. 10a will be discussed in detail below.

The membrane cleaning apparatus 1020 comprises: a vacuum chamber 1021; wires 1026a, 1026b; vacuum feedthroughs 1027a, 1027b; a support 1023; two electrodes 1022a, 1022b; and a voltage source 1025. In use, a membrane assembly 208 (comprising a membrane 211 and a generally rectangular frame 212) is disposed on the conducting support 1023. The electrodes 1022a, 1022b are arranged within the vacuum chamber 1021 similarly to the electrodes 1002a, 1002b within the vacuum chamber 1001 of membrane cleaning apparatus 1000 (FIG. 10a).

A principal difference between membrane cleaning apparatus 1000 (FIG. 10a) and membrane cleaning apparatus 1020 (FIG. 10b) is how the voltage sources are connected to the electrodes 1022a, 1022b and membrane assembly 208. In the membrane cleaning apparatus 1000 of FIG. 10a, both electrodes 1002a, 1002b are connected to the same terminal of the voltage source 1005 (and are therefore held at the same voltage) and the membrane 211 is (directly or indirectly) connected to the opposite terminal of the voltage source 1005. Whereas, in the membrane cleaning apparatus 1020 of FIG. 10*b*, electrode 1022*a* is connected, via wire 1026*a* and vacuum feedthrough 1027*a*, to a first terminal of the voltage source 1025, and electrode 1022*b* is connected, via wire 1026*b* and vacuum feedthrough 1027*b*, to an opposite terminal of the voltage source 1025. The membrane assembly 208 may be not electrically connected to a component having a defined voltage, and the membrane assembly 208 (and the membrane 211) may consequently be described as 'floating'.

Aside from how the voltage sources are connected to the electrodes and membrane assembly 208 in membrane cleaning apparatus 1000 (FIG. 10*a*) and membrane cleaning apparatus 1020 (FIG. 10*b*), the two membrane cleaning apparatus 1000, 1020 may be otherwise similar, and may work in similar ways.

The membrane cleaning apparatus 1020 (FIG. 10*b*) may remove particles 210 from the membrane 211 using substantially the same method as the pulsed electrostatic cleaning method described in detail above with reference to FIG. 10*a*. In contrast to membrane cleaning apparatus 1000, the membrane 211 is not held at a voltage which is opposite a voltage at which the electrodes 1022*a*, 1022*b* are held. Rather, the electrodes 1022*a*, 1022*b* are held at voltages which are substantially equal in magnitude and opposite in polarity, and the membrane assembly 208 (and the membrane 211) is floating. Adjacent portions of the membrane 211 are however still attracted to electrodes 1022*a*, 1022*b* in opposite directions due to the arrangement of the electrodes 1022*a*, 1022*b* (in particular, due to the lateral offset between the two electrodes 1022*a*, 1022*b*) and the voltages applied thereto. That is, a portion of the membrane 211 proximate to electrode 1022*a* will be attracted to electrode 1022*a* and a portion of the membrane 211 proximate to electrode 1022*b* will be attracted to electrode 1002*b*.

The time-varying voltage utilised for inducing oscillations in the membrane 211 may comprise a plurality of temporally spaced pulses. Pulses of the time-varying voltage across electrode 1022*a* occur in phase with pulses of the time-varying voltage across electrode 1022*b*. Therefore, attraction of a portion of the membrane 211 to electrode 1022*a* occurs in phase with attraction of an adjacent portion of the membrane 211 to electrode 1022*b*. Similarly to the pulsed voltage provided by voltage source 205 of the membrane cleaning apparatus 200 shown in FIG. 2, temporal features of the voltage supplied by voltage source 1005 may be configured to induce a desired range of frequencies of oscillation of the membrane 211 (i.e., a desired excitation spectrum). As described in detail above with reference to FIGS. 2, 3, and 4, the pulsed voltage provided by voltage source 1025 may be configured to create an excitation spectrum which is tailored to remove particles 210 having a size within a predetermined range.

The membrane cleaning apparatus 1020 may comprise a mechanism for controlling a position of the membrane assembly 208 relative to the electrodes 1022*a*, 1022*b*. In use, the membrane assembly 208 may be moved relative to the electrodes 1022*a*, 1022*b* such that different portions of the membrane 211 may be cleaned using the membrane cleaning apparatus 1020. Additionally or alternatively, the two electrodes 1022*a*, 1022*b* may be movable relative to the support 1023 such that they can scan across the surface of the membrane 211 when supported by the support 1023.

A membrane cleaning apparatus 1040 according to an eighth embodiment of the invention is now described with reference to FIG. 10*c*, which shows a cross-section through the membrane cleaning apparatus 1040.

Figure 10C:
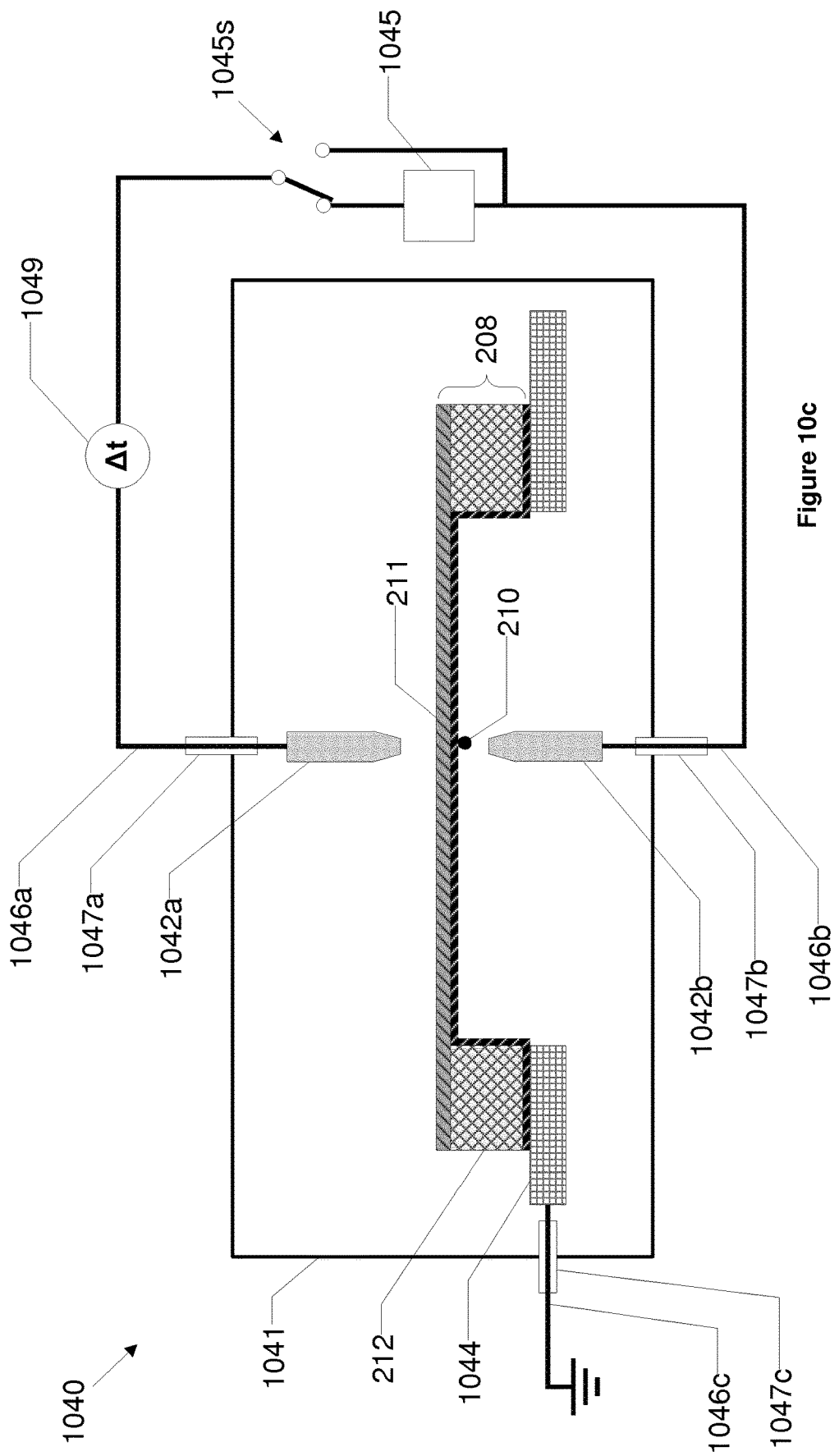
FIG. 10c shows a portion of a further embodiment of a membrane cleaning apparatus according to the invention, and a membrane.

The membrane cleaning apparatus 1040 shown in FIG. 10*c* shares several features in common with membrane cleaning apparatus 1000 shown in FIG. 10*a*. Only the differences between the membrane cleaning apparatus 1040 shown in FIG. 10*c* and membrane cleaning apparatus 1000 shown in FIG. 10*a* will be discussed in detail below.

The membrane cleaning apparatus 1040 comprises: a vacuum chamber 1041; wires 1046*a*, 1046*b*, 1046*c*; vacuum feedthroughs 1047*a*, 1047*b*, 1047*c*; a conducting support 1044; two electrodes 1042*a*, 1042*b*; and a voltage source 1045. In use, a membrane assembly 208 (comprising a membrane 211 and a generally rectangular frame 212) is disposed on the conducting support 1044. The electrodes 1042*a*, 1042*b* are arranged within the vacuum chamber 1041 such that they are disposed proximate to opposite surfaces of the membrane 211. A position of electrode 1042*a*, in a plane parallel to the plane of the membrane 211, generally aligns with a position of electrode 1042*b*. That is, in this embodiment there is substantially no lateral offset between the two electrodes 1042*a*, 1042*b* on the opposite sides of the membrane 211.

A principal difference between membrane cleaning apparatus 1000 (FIG. 10*a*) and membrane cleaning apparatus 1040 (FIG. 10*c*) is that, as will be discussed further below, the membrane cleaning apparatus 1040 of FIG. 10*c* applies temporally offset voltages to two laterally aligned electrodes 1042*a*, 1042*b*. This is in contrast to applying substantially the same voltage (which may be a time-varying voltage) to two laterally offset electrodes 1002*a*, 1002*b* (as in the embodiment of FIG. 10*a*).

Another difference between membrane cleaning apparatus 1000 (FIG. 10*a*) and membrane cleaning apparatus 1040 (FIG. 10*c*) is how the voltage sources are connected to the electrodes and membrane assembly 208. In membrane cleaning apparatus 1000, both electrodes 1002*a*, 1002*b* are connected to the same terminal of the voltage source 1005 and are therefore held at the same voltage, and the membrane 211 is (directly or indirectly) connected to the opposite terminal of the voltage source 1005. Whereas, in membrane cleaning apparatus 1040, electrode 1042*b* is connected, via wire 1046*b* and vacuum feedthrough 1047*b*, to one terminal of the voltage source 1045, and electrode 1042*a* is connected, via wire 1046*a* and vacuum feedthrough 1047*a*, to either the same terminal or to the opposite terminal of the voltage source 1045. The fact that the electrodes 1042*a*, 1042*b* may be connected to a same terminal of the voltage source 1045 (and may consequently be held at voltages of the same polarity) or to opposite terminals of the voltage source 1045 (and may consequently be held at voltages of opposite polarities) is schematically demonstrated in FIG. 10*c* by a switch 1045*s*. It will be appreciated that the switch 1045*s* is included solely for demonstration of this concept, and may or may not be included in a physical embodiment of the invention.

Conducting support 1044 is connected, via wire 1046*c* and vacuum feedthrough 1047*c*, to ground. In a variation of the current embodiment, ground may instead be connected directly to the membrane assembly 208. In such a variation, the conducting support 1044 may be not used, and a non-conducting membrane support may instead be used. In another variation of the current embodiment, the membrane assembly 208 may be directly (e.g., via a wire 1046*c*) or indirectly (e.g., via conducting support 1044) connected to a voltage which is close to ground. In any case, the membrane cleaning apparatus 1040 may be said to comprise a mechanism to hold the membrane 211 at a voltage close to or equal to ground.

Aside from how the voltage sources are connected to the electrodes and membrane assembly 208 in membrane cleaning apparatus 1000 (FIG. 10*a*) and membrane cleaning apparatus 1040 (FIG. 10*c*), the two membrane cleaning apparatus 1000, 1040 may be otherwise similar, and may work in similar ways.

The membrane cleaning apparatus 1040 (FIG. 10*c*) may remove particles 210 from the membrane 211 using a similar method to the pulsed electrostatic cleaning method described in detail above with reference to FIG. 10*a*. That is, a time-varying voltage may be applied to each of the electrodes 1042*a*, 1042*b* in order to induce oscillations in the membrane 211. The time-varying voltage may comprise a plurality of temporally spaced pulses. However, in contrast to membrane cleaning apparatus 1000, the membrane 211 is not held at a voltage which is opposite a voltage at which the electrodes 1042*a*, 1042*b* are held. Rather, the electrodes 1042*a*, 1042*b* are held at voltages which are substantially equal in magnitude (and of wither the same polarity or of opposite polarities) and the membrane assembly 208 (and the membrane 211) is held at (electrical) ground. Further, in a plane parallel to the plane of the membrane 211, the electrodes 1042*a*, 1042*b* are generally aligned. That is, there is no lateral offset between the two electrodes 1042*a*, 1042*b*.

When a voltage is applied to either the electrode 1042*a* or the electrode 1042*b*, a portion of the membrane 211 proximate to that electrode 1042*a*, 1042*b* is attracted to that electrode. As the electrodes 1042*a*, 1042*b* are generally co-aligned, if a voltage is applied to both of the electrodes 1042*a*, 1042*b* at the same time, electrostatic attractive forces exerted on the membrane 211 by each of the electrodes 1042*a*, 1042*b* may generally balance and the membrane 211 may not be deformed. Consequently, oscillations may not be induced in the membrane 211.

Advantageously, pulses of the time-varying voltage applied to electrode 1042*a* undergo a time delay 1049 (relative to pulses of the time-varying voltage applied to electrode 1042*b*). That is, regardless of whether the polarities of the time-varying voltages applied to the two electrodes 1042*a*, 1042*b* are equal or opposite, pulses of the time-varying voltage applied to electrode 1042*a* occur substantially out-of-phase with pulses of the time-varying voltage applied to electrode 1042*b*. Therefore, attraction of a portion of the membrane 211 proximate to electrode 1042*a* occurs substantially out-of-phase with attraction of that same portion of the membrane 211 to electrode 1042*b*. Hence, in a single voltage 'pulse' generated by the voltage source 1045, a portion of the membrane 211 proximate to electrode 1042*b* is attracted to the electrode 1042*b*, and then, subsequently (after time delay 1049), that same portion of the membrane 211 is attracted to electrode 1042*a*. It will be appreciated that the component 1049 is included in FIG. 10*c* solely for a schematic demonstration of the time delay between a voltage applied to electrode 1042*a* and a voltage applied to electrode 1042*b*. In particular, a mechanism for controlling this time delay may form part of the voltage source 1045.

Similarly to the pulsed voltage provided by voltage source 205 of the membrane cleaning apparatus 200 shown in FIG. 2, temporal features of the voltage supplied by voltage source 1045 may be configured to induce a desired range of frequencies of oscillation of the membrane 211 (i.e., a desired excitation spectrum). As described in detail above with reference to FIGS. 2, 3, and 4, the pulsed voltage provided by voltage source 1045 may be configured to create an excitation spectrum which is tailored to remove particles 210 having a size within a predetermined range.

The membrane cleaning apparatus 1040 may comprise a mechanism for controlling a position of the membrane assembly 208 relative to the electrodes 1042*a*, 1042*b*. In use, the membrane assembly 208 may be moved relative to the electrodes 1042*a*, 1042*b* such that different portions of the membrane 211 may be cleaned using the membrane cleaning apparatus 1040. Additionally or alternatively, the two electrodes 1042*a*, 1042*b* may be movable relative to the conducting support 1044 such that they can scan across the surface of the membrane 211 when supported by the conducting support 1044.

A membrane cleaning apparatus 1060 according to a ninth embodiment of the invention is now described with reference to FIG. 10*d*, which shows a cross-section through the membrane cleaning apparatus 1060.

Figure 10D:
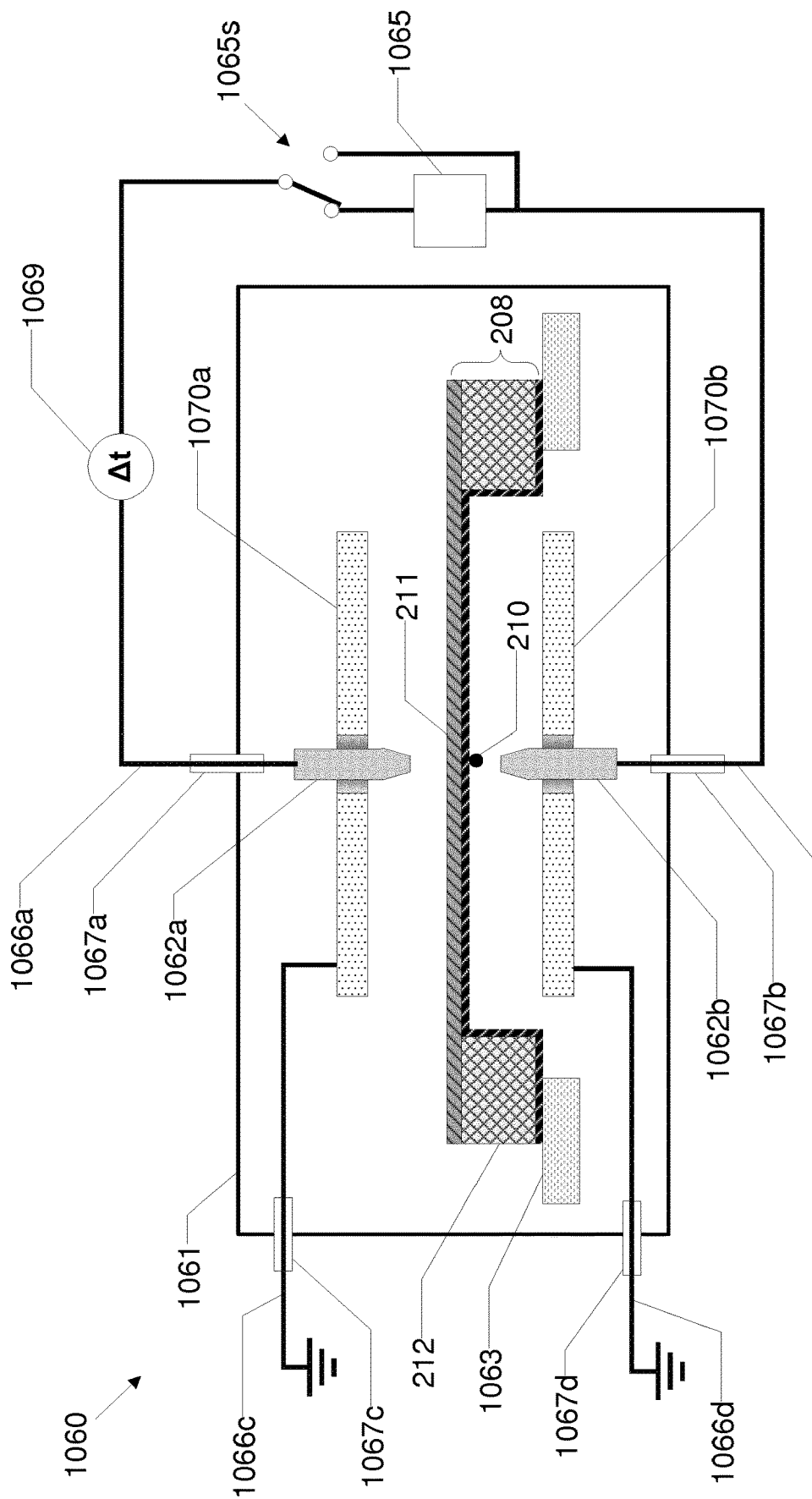
FIG. 10d shows a portion of a further embodiment of a membrane cleaning apparatus according to the invention, and a membrane.

The membrane cleaning apparatus 1060 shown in FIG. 10*d* shares several features in common with membrane cleaning apparatus 1040 shown in FIG. 10*c*. Only the differences between the membrane cleaning apparatus 1060 shown in FIG. 10*d* and membrane cleaning apparatus 1040 shown in FIG. 10*c* will be discussed in detail below.

The membrane cleaning apparatus 1060 comprises: a vacuum chamber 1061; wires 1066*a*, 1066*b*, 1066*c*, 1066*d*; vacuum feedthroughs 1067*a*, 1067*b*, 1067*c*, 1067*d*; a support 1063; two electrodes 1062*a*, 1062*b*; a voltage source 1065; and two auxiliary electrodes 1070*a*, 1070*b*. In use, a membrane assembly 208 (comprising a membrane 211 and a generally rectangular frame 212) is disposed on the support 1063. The electrodes 1062*a*, 1062*b* are arranged within the vacuum chamber 1061 in the same, co-aligned configuration as the electrodes 1042*a*, 1042*b* are arranged within the vacuum chamber 1041.

A principal difference between membrane cleaning apparatus 1040 (FIG. 10*c*) and membrane cleaning apparatus 1060 (FIG. 10*d*) is that, although both membrane cleaning apparatus 1040, 1060 comprise a mechanism to hold the membrane 211 at a voltage close to or equal to ground, those mechanisms are different. In contrast to membrane cleaning apparatus 1040, the membrane 211 when disposed on the support 1063 is not (either directly or indirectly) physically connected to ground or a low voltage. In further contrast to membrane cleaning apparatus 1040, membrane cleaning apparatus 1060 comprises two auxiliary electrodes 1070*a*, 1070*b*.

The auxiliary electrodes 1070*a*, 1070*b* are disposed proximate to opposite surfaces of the membrane 211. The auxiliary electrodes 1070*a*, 1070*b* may be generally flat or planar and may extend adjacent to a majority of the area of the membrane 211. The auxiliary electrodes 1070*a*, 1070*b* may be arranged so as to be generally parallel to the plane of the membrane 211. The auxiliary electrodes 1070*a*, 1070*b* may each comprise an aperture. Auxiliary electrode 1070*a* may be arranged such that electrode 1062*a* protrudes through the aperture of auxiliary electrode 1070*a*. Auxiliary electrode 1070*b* may be arranged such that electrode 1062*b* protrudes through the aperture of auxiliary electrode 1070*b*. In the example embodiment of membrane cleaning apparatus 1060 shown in FIG. 10*d*, each of the auxiliary electrodes 1070*a*, 1070*b* are connected, via wires 1066*c*, 1066*d* and vacuum feedthroughs 1067*c*, 1067*d* respectively, to ground. In a variation of the current embodiment, the auxiliary electrodes 1070*a*, 1070*b* may be connected to a voltage which is close to ground. In another variation of the current embodiment, more than one auxiliary electrode may be provided proximate to each of the two surfaces of the membrane 211. The mechanism to hold the membrane 211 at a voltage close to or equal to ground may therefore be described as comprising one or more auxiliary electrodes proximate to each side of the plane of the membrane 211, wherein the one or more auxiliary electrodes are maintained at a voltage close to or equal to ground.

The membrane 211 (when the membrane assembly 208 is provided in the membrane cleaning apparatus 1060) may be described as floating (i.e., it is not physically electrically connected to any component with a pre-defined voltage). There may be capacitive coupling between the auxiliary electrodes 1070a, 1070b and the membrane 211. The auxiliary electrodes 1070a, 1070b may act to hold the membrane 211 at a voltage close to or equal to ground via this capacitive coupling. In particular, the auxiliary electrodes 1070a, 1070b, the electrodes 1062a, 1062b and the voltage source 1065 may be configured such that the magnitude of an electric field between the membrane 211 and an electrode 1062a, 1062b is at least a factor of ten greater than the magnitude of an electric field between the membrane 211 and an auxiliary electrode 1070a, 1070b. The auxiliary electrodes 1070a, 1070b, the electrodes 1062a, 1062b and the voltage source 1065 may be configured such that the magnitude of an electric field between the membrane 211 and an electrode 1062a, 1062b is at least a factor of one hundred greater than the magnitude of an electric field between the membrane 211 and an auxiliary electrode 1070a, 1070b.

It will be appreciated that the magnitudes of: the electric field between the membrane 211 and an electrode 1062a, 1062b; and the electric field between the membrane 211 and an auxiliary electrode 1070a, 1070b are dependent on the capacitive couplings between the membrane 211 and: the electrodes 1062a, 1062b; and the auxiliary electrodes 1070a, 1070b respectively. It will be further appreciated that the capacitive coupling between the membrane 211 and an electrode 1062a, 1062b, 1070a, 1070b will, in general, be dependent on an overlap area and a separation between the membrane 211 and the electrode 1062a, 1062b, 1070a, 1070b.

It may be desirable to maintain a voltage of the membrane 211, when being cleaned in a membrane cleaning apparatus, close to or equal to ground. However, it may be difficult to achieve good electrical contact between the membrane 211 and another component due to, for example, the fragility of the membrane 211 and/or a relatively non-conductive layer which builds up on the membrane assembly 208. Further, the process of electrically connecting the membrane assembly 208 to another component may itself generate contaminant particles 210, which is disadvantageous. Advantageously, the mechanism to hold the membrane 211 at a voltage close to or equal to ground described in FIG. 10d (the auxiliary electrodes 1070a, 1070b) does not require any physical contact between the membrane assembly and any other assembly, thereby overcoming the issues described above.

The auxiliary electrodes 1070a, 1070b and the membrane 211 may be considered to form a capacitive divider.

The auxiliary electrodes 1070a, 1070b provide further advantages. In particular, the capacitive coupling between the auxiliary electrodes 1070a, 1070b and the membrane 211 may concentrate the electric field generated by the electrodes 1062a, 1062b to a particularly localised area of the membrane 211. This, advantageously, may result in a more precise, and more efficient, spatial localisation of membrane cleaning using the membrane cleaning apparatus 1060.

The voltage source 1065, switch 1065s, time delay 1069, wires 1066a, 1066b, vacuum feedthroughs 1067a, 1067b, and electrodes 1062a, 1062b may be of the same type as, and may carry out identical functions to, the voltage source 1045, switch 1045s, time delay 1049, wires 1046a, 1046b, vacuum feedthroughs 1047a, 1047b, and electrodes 1042a, 1042b of membrane cleaning apparatus 1040 (FIG. 10c), respectively.

The membrane cleaning apparatus 1060 (FIG. 10d) may remove particles 210 from the membrane 211 using a similar method to the pulsed electrostatic cleaning method described in detail above with reference to the membrane cleaning apparatus 1040 of FIG. 10c. That is, a time-varying voltage may be applied across the electrodes 1062a, 1046b in order to induce oscillations in the membrane 211.

When a voltage is applied to either the electrode 1042a or the electrode 1042b, a portion of the membrane 211 proximate to that electrode 1042a, 1042b is attracted to that electrode. As the electrodes 1042a, 1042b are generally co-aligned, if a voltage is applied to both of the electrodes 1042a, 1042b at the same time, electrostatic attractive forces exerted on the membrane 211 by each of the electrodes 1042a, 1042b may generally balance and the membrane 211 may not be deformed. Consequently, oscillations may not be induced in the membrane 211.

Regardless of whether the polarities of the time-varying voltage across the two electrodes 1062a, 1062b are equal or opposite, pulses of the time-varying voltage applied to electrode 1062a occur substantially out-of-phase with pulses of the time-varying voltage applied to electrode 1062b. Therefore, attraction of a portion of the membrane 211 proximate to electrode 1062a occurs substantially out-of-phase with attraction of that same portion of the membrane 211 to electrode 1062b.

Similarly to the pulsed voltage provided by voltage source 205 of the membrane cleaning apparatus 200 shown in FIG. 2, temporal features of the voltage supplied by voltage source 1065 may be configured to induce a desired range of frequencies of oscillation of the membrane 211 (i.e., a desired excitation spectrum). As described in detail above with reference to FIGS. 2, 3, and 4, the pulsed voltage provided by voltage source 1065 may be configured to create an excitation spectrum which is tailored to remove particles 210 having a size within a predetermined range.

The membrane cleaning apparatus 1060 may comprise a mechanism for controlling a position of the membrane assembly 208 relative to the electrodes 1062a, 1062b. In use, the membrane assembly 208 may be moved relative to the electrodes 1062a, 1062b such that different portions of the membrane 211 may be cleaned using the membrane cleaning apparatus 1060. Additionally or alternatively, the two electrodes 1062a, 1062b may be movable relative to the support 1063 such that they can scan across the surface of the membrane 211 when supported by the conducting support 1063.

Arrangements of electrodes connected to a voltage source, according to the embodiments described above with reference to FIGS. 10a-10d, may be described as an electric field generating mechanism which is operable to generate an electric field in the vicinity of two opposed surfaces of the membrane 211 when supported by a membrane support. The electric field in the vicinity of the two opposed surfaces of the membrane 211 is generally in opposite directions.

A magnitude of an electric field, according to the embodiments described above with reference to FIGS. 10a-10d, may be substantially equal on both sides of the membrane 211.

An electric field, according to the embodiments described above with reference to FIGS. 10a-10d, may have a magnitude of at least 100 kV/m. The magnitude may be at least 1 MV/m.

An electrostatic pressure applied to the two opposed surfaces of the membrane 211, according to the embodiments described above with reference to FIGS. 10a-10d, averaged across a plurality of temporally spaced pulses, may be similar in magnitude and opposite in direction. In particular, there may be at most a 50% percentage difference between the time-averaged magnitudes of electrostatic pressure applied to the two opposed surfaces of the membrane 211. There may be at most a 10% percentage difference between the time-averaged magnitudes of electrostatic pressure applied to the two opposed surfaces of the membrane 211. An electrostatic pressure applied to a portion of the membrane 211, averaged over time, may be substantially zero. An electrostatic pressure applied to a portion of the membrane 211, averaged over a time period of between 10 us and 10 ms, may be substantially zero.

Individual voltage pulses, according to embodiments described above which make use of pulsed electrostatic cleaning of membranes, may be shorter than 10 us. Individual voltage pulses may be shorter than 1 us. This may result in efficient induction of oscillations in the membrane 211. This may, advantageously, result in efficient particle 210 removal.

A train of voltage pulses, according to embodiments described above which make use of pulsed electrostatic cleaning of membranes, may be shorter than 10 ms. A train of voltage pulses may be shorter than 1 ms. A train of voltage pulses may also be described as a 'burst' of pulses. A duty cycle of a burst of voltage pulses may be below 50%. A duty cycle of a burst of voltage pulses may be below 10%. By providing pulses in such bursts, undesirable heating of the membrane 211 may be prevented. Advantageously, this may prevent rupture of the membrane 211. In some embodiments, the duty cycle of trains of voltages pulses may be limited so to avoid power dissipation above 0.3 to 30 W/cm$^2$ at the membrane 211, for example on a time scale of the order of 0.1 to 10 ms. Continuous pulse application at relatively high frequency will heat up the membrane 211 and may cause damage (either directly or via tension loss due to thermal expansion). Advantageously, using trains (or bursts) of pulses may allow mechanical oscillations in the membrane 211 to be excited without causing excessive heating of the membrane 211.

In some embodiments, the time-varying voltage may comprise multiple sequential trains of temporally spaced pulses and a repetition frequency of pulses within such trains may be varied within a range, for example swept through said range.

Embodiments of membrane cleaning apparatus, described above with reference to FIGS. 9, 10b-10d, may be configured so as to maintain a voltage of the membrane 211 at a voltage close to or equal to ground. For example, embodiments of membrane cleaning apparatus, described above with reference to FIGS. 9, 10b-10d, may be configured so as to maintain a voltage of the membrane 211 between −100 V and +100 V. Said embodiments of membrane cleaning apparatus may be configured so as to maintain a voltage of the membrane 211 between −10 V and +10 V.

Electrodes (other than auxiliary electrodes of FIG. 10d), according to embodiments of the present invention described herein (for example the embodiments described above with reference to FIGS. 10a-10d), may be positioned such that a maximum distance between an electrode and the membrane 211 is 5 mm. Electrodes may be positioned such that a maximum distance between an electrode and the membrane 211 is 0.5 mm.

An environment within a vacuum chamber, according to the embodiments of membrane cleaning apparatus described herein, may be maintained at a relatively low pressure. A pressure proximate to the membrane 211 may be maintained at a relatively low pressure. A pressure proximate to the membrane 211 may be maintained lower than 10$^{-3}$ mBar. A pressure proximate to the membrane 211 may be maintained lower than 10$^{-5}$ mBar.

Electrostatic pressure may define a membrane cleaning efficacy. That is, a higher electrostatic pressure applied to the membrane 211 may correspond to a higher membrane cleaning efficacy. It may therefore be desirable for a membrane cleaning apparatus to apply a relatively high electrostatic pressure to the membrane. However, the larger a force applied to the membrane 211, the higher a risk of rupturing the membrane 211. It may therefore be desirable to construct a membrane cleaning apparatus which applies a relatively high pressure on the membrane 211, whilst only exerting a relatively low force on the membrane 211. The inventors have realised that this may be achieved by using electrodes having a relatively small size proximate to the membrane (such as those described above with reference to FIGS. 10a-10d). A further advantage of using such electrodes is that using such electrodes to induce oscillations in the membrane 211 may result in a relatively low amount of heating of the membrane 211 (compared with using a large electrode in induce oscillations in the membrane 211). This may, advantageously, maximise a redistribution of tension in the membrane 211 during cleaning, which may maximise a cleaning efficacy of a membrane cleaning apparatus. In some embodiments (such as those described above with reference to FIGS. 10a-10d), an area of a surface of each electrode (for example, electrodes 1002a, 1002b; 1022a, 1022b; 1042a, 1042b; 1062a, 1062b) closest to the membrane 211 may be smaller than an area of the membrane 211. An area of a surface of each electrode (for example, electrodes 1002a, 1002b; 1022a, 1022b; 1042a, 1042b; 1062a, 1062b) closest to the membrane 211 may be less than or equal to 1 cm$^2$, for example less than or equal to 10 mm$^2$.

In the embodiments described above with reference to FIGS. 10a-10d, the repetition rate of the pulsed voltages applied to the electrodes (for example, electrodes 1002a, 1002b; 1022a, 1022b; 1042a, 1042b; 1062a, 1062b) may be in the range 30 kHz to 30 MHz.

In the embodiments described above with reference to FIGS. 10a-10d, electrodes 1002a, 1002b; 1022a, 1022b; 1042a, 1042b; 1062a, 1062b act as excitation electrodes. In some embodiments, these electrodes 1002a, 1002b; 1022a, 1022b; 1042a, 1042b; 1062a, 1062b may also act as collector electrodes.

It will be appreciated that any wiring shown in figures is merely to demonstrate principles of invention and is in no way limiting. When constructing a membrane cleaning apparatus according to present invention, modifications may be made to the wiring shown whilst adhering to the principles of the invention and falling within the scope of the invention as defined by the claims.

It will be appreciated that the terms "particle size" and "particle mass" may have been used interchangeably above.

A particle which is more massive will generally correspond to a particle which is larger, and no distinction between these terms is generally intended.

It will be appreciated that in any of the above-described membrane cleaning apparatus 200, 500, 600, 800, 820, 850, 900, 1000, 1020, 1040, 1060 the membrane assembly 208 may be a pellicle for use in an EUV lithographic apparatus. In particular, the membrane assembly 208 may comprise the pellicle 15 (which comprises a thin membrane 16 mounted on a frame 17) shown in FIG. 1.

It will be appreciated that in any of the above-described membrane cleaning apparatus 200, 500, 600, 800, 820, 850, 900, 1000, 1020, 1040, 1060 the membrane 211 of the membrane assembly 208 may optionally be provided with a high conductivity coating 209. The high conductivity coating 209 may, for example, comprise a metallic or electrically conducting ceramic coating. The high conductivity coating 209 may be applied on at least one side of the membrane 211. It will be appreciated that the high conductivity coating 209 may be applied to either side of the membrane 211. It will be further appreciated that in some embodiments the membrane 211 may have no such high conductivity coating 209. For example, the membrane 211 itself may be a sufficiently good conductor (for example, the membrane 211 may be formed from a material with non-zero electrical conductivity, such as doped polycrystalline silicon).

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the clauses set out below:

1. A membrane cleaning apparatus for removing particles from a membrane, the apparatus comprising:
   a membrane support for supporting the membrane; and
   an electric field generating mechanism for generating an electric field in the vicinity of the membrane when supported by the membrane support.
2. The apparatus of clause 1, wherein the electric field generating mechanism comprises:
   one or more collector electrodes; and
   a mechanism for applying a voltage across a membrane supported by the membrane support and the or each of the one or more collector electrodes.
3. The apparatus of clauses 1 or 2, comprising a mechanism for inducing mechanical oscillations in the membrane when supported by the membrane support.
4. The apparatus of clause 3, wherein the mechanism for inducing mechanical oscillations in the membrane when supported by the membrane support comprises:
   an excitation electrode; and
   a mechanism for applying a time-varying voltage across the excitation electrode and the membrane supported by the membrane support.
5. The apparatus of clause 3, wherein the mechanism for inducing mechanical oscillations in the membrane when supported by the membrane support comprises:
   two electrodes positionable proximate to a surface of the membrane when supported by the membrane support; and
   a mechanism for applying a time-varying voltage across the two electrodes.
6. The apparatus of clause 4 or clause 5, wherein the time-varying voltage comprises a plurality of temporally spaced pulses.
7. The apparatus of any one of clauses 4 to 6, wherein the time-varying voltage comprises a voltage waveform having a general shape and having one or more parameters which can be chosen (and varied) to achieve a desired excitation spectrum.
8. The apparatus of any one of clauses 4 to 7, wherein the time-varying voltage comprises two sequential trains of temporally spaced pulses, a polarity of the two trains of pulses being reversed.
9. The apparatus of any one of clauses 4 to 8 wherein the mechanism for applying a time-varying voltage is operable to generate a time-varying electric field in the vicinity of the membrane having a magnitude of at least 10 kV/m.
10. The apparatus of any one of clauses 4 to 9 wherein the time-varying voltage has a duty cycle of less than 10%.
11. The apparatus of clause 3, wherein the mechanism for inducing mechanical oscillations in the membrane when supported by the membrane support comprises:
   a radiation source operable to produce a pulsed radiation beam which is incident on at least a portion of the membrane supported by the membrane support.
12. The apparatus of any one of clauses 3 to 11, wherein the mechanism for inducing mechanical oscillations is operable to induce oscillations only in a localised portion of the membrane.
13. The apparatus of any one of clauses 3 to 12, wherein the mechanism for inducing mechanical oscillations is operable to induce oscillations at a range of frequencies.
14. The apparatus of any one of clauses 3 to 13, wherein the mechanism for inducing mechanical oscillations is operable to induce oscillations between 30 kHz and 30 MHz
15. The apparatus of any one of clauses 3 to 14, wherein the mechanism for inducing mechanical oscillations is operable to remove particles with a dimension between 0.5 and 5 um from the membrane.
16. The apparatus of any preceding clause, further comprising a mechanism for controlling a temperature of at least a portion of the membrane.
17. The apparatus of clause 16, wherein the mechanism for controlling a temperature of the at least a portion of the membrane comprises a radiation source which is operable to provide radiation to the membrane.
18. The apparatus of clause 16, wherein the mechanism for controlling a temperature of the at least a portion of the membrane comprises an induction heater which is operable to heat the membrane.
19. The apparatus of clauses 1 or 2, wherein the electric field generating mechanism is operable to generate an electric field in the vicinity of two opposed surfaces of the membrane when supported by the membrane support, the electric field in the vicinity of the two opposed surfaces of the membrane being in opposite directions.

20. The apparatus of clause 19, wherein the electric field is created by two collector electrodes disposed on opposite sides of the plane of the membrane.

21. The apparatus of clause 19 or clause 20, wherein the magnitude of the electric field is substantially equal on both sides of the membrane.

22. The apparatus of any one of clauses 19 to 21 wherein the electric field in the vicinity of the two opposed surfaces of the membrane has a magnitude of at least 100 kV/m.

23. The apparatus of any one of clauses 19 to 22 when dependent on clause 2 wherein at least a portion of one or more collector electrodes is provided with an insulating coating.

24. The apparatus of clauses 1, 2 or 19 to 23, further comprising a plasma generating mechanism.

25. The apparatus of clause 24 when either directly or indirectly dependent on clause 2, wherein the plasma generating mechanism is operable to generate a plasma between a membrane supported by the membrane support and the or each of the one or more collector electrodes.

26. The apparatus of clause 25, wherein the mechanism for applying a voltage across the membrane supported by the membrane support and the or each of the one or more collector electrodes is arranged to apply a pulsed voltage across the membrane supported by the membrane support and the or each of the one or more collector electrodes.

27. The apparatus of clause 26 wherein the pulsed voltage has a duty cycle of 1% of less.

28. The apparatus of clause 26 or clause 27 wherein the pulsed voltage has a frequency of between 1 Hz and 10 kHz.

29. The apparatus of any one of clauses 26 to 28 wherein the pulse duration of the pulsed voltage is less than 1 ms.

30. The apparatus of any one of clauses 26 to 29 wherein the magnitude of the pulsed voltage is at least 100 V.

31. The apparatus of any one of clauses 26 to 30 wherein each pulse of the pulsed voltage comprises a first portion having a first polarity and a second portion having a second, opposite polarity.

32. The apparatus of any one of clauses 26 to 31 wherein the plasma generating mechanism is arranged such that the plasma is switched on between subsequent pulses of the pulsed voltage and is switched off during pulses of the pulsed voltage.

33. The apparatus of any preceding clause further comprising a chamber and a pump apparatus operable to control a pressure of the interior of the chamber and wherein the membrane support is disposed within the chamber.

34. A method for removing particles from a membrane, the method comprising:
 inducing mechanical oscillations in the membrane; and
 generating an electric field in the vicinity of the membrane using a collector electrode so as to exert an electrostatic force between the particles on the membrane and the collector electrode.

35. The method of clause 34, wherein inducing mechanical oscillations in the membrane comprises: applying a time-varying voltage across the membrane supported and an excitation electrode.

36. The method of clause 34, wherein inducing mechanical oscillations in the membrane comprises: applying a time-varying voltage across two electrodes positioned proximate to a surface of the membrane.

37. The method of clause 35 or clause 36 wherein the time-varying voltage has a duty cycle of less than 10%.

38. The method of clause 34, wherein the inducing mechanical oscillations in the membrane comprises: irradiating at least a portion of the membrane with a pulsed radiation beam.

39. The method of any one of clauses 34 to 38, wherein the mechanical oscillations induced comprise oscillations at a range of frequencies.

40. The method of any one of clauses 34 to 39, wherein the mechanical oscillations induced comprise oscillations between 30 kHz and 30 MHz 41. The method of any one of clauses 34 to 39, wherein the mechanical oscillations induced are suitable for removing particles with a dimension between 0.5 and 5 um from the membrane.

42. The method of any one of clauses 34 to 41, further comprising controlling a temperature of at least a portion of the membrane.

43. The method of clause 42, further comprising varying a temperature of at least a portion of the membrane over time.

44. The method of clause 42 or clause 43, wherein controlling the temperature of the at least a portion of the membrane is achieved by irradiating the at least a portion using radiation.

45. The method of any one of clauses 34 to 44 wherein the method uses the apparatus of any one of clauses 1 to 18.

46. A method for removing particles from a membrane, the method comprising:
 generating an electric field in the vicinity of two opposed surfaces of the membrane, the electric field in the vicinity of the two opposed surfaces of the membrane being in opposite directions.

47. The method of clause 46 wherein the method uses the apparatus of any one of clauses 19 to 33.

48. A method for removing particles from a membrane, the method comprising:
 providing a plasma adjacent to the at least one surface of the membrane so as to charge the particles; and
 generating an electric field in the vicinity of at least one surface of the membrane so as to force these charged particles away from the membrane.

49. The method of clause 48 wherein the electric field is generated using one or more electrodes and applying a biasing voltage to said one or more electrodes.

50. The method of clause 49 wherein the biasing voltage is a pulsed biasing voltage.

51. The method of clause 50 wherein each pulse of the pulsed voltage comprises a first portion having a first polarity and a second portion having a second, opposite polarity.

52. The method of clause 50 or clause 51 wherein providing the plasma adjacent to the at least one surface of the membrane is such that the plasma is switched on between subsequent pulses of the pulsed voltage and is switched off during pulses of the pulsed voltage.

53. The method of any one of clauses 48 to 52 wherein the method uses the apparatus of any one of clauses 24 to 33.

The invention claimed is:

1. A membrane cleaning apparatus for removing particles from a membrane, the apparatus comprising:
 a membrane support configured to support the membrane; and
 an electric field generating mechanism configured to generate an electric field in the vicinity of the membrane when supported by the membrane support, wherein the electric field is configured to induce mechanical oscillations or deformation in the membrane when supported by the membrane support.

2. The apparatus of claim 1, wherein the electric field generating mechanism comprises:
one or more electrodes; and
a mechanism configured to apply a voltage across a membrane when supported by the membrane support and the or each of the one or more electrodes.

3. The apparatus of claim 1, wherein the electric field generating mechanism comprises:
an excitation electrode; and
a mechanism configured to apply a time-varying voltage across the excitation electrode and the membrane when supported by the membrane support.

4. The apparatus of claim 3, wherein the time-varying voltage comprises a plurality of temporally spaced pulses.

5. The apparatus of claim 3, wherein the time-varying voltage comprises a voltage waveform having a general shape and having one or more parameters which can be chosen to achieve a desired excitation spectrum.

6. The apparatus of claim 3, wherein the time-varying voltage comprises two sequential trains of temporally spaced pulses, a polarity of the two trains of pulses being reversed.

7. The apparatus of claim 1, further comprising a radiation source configured to provide a radiation beam which is incident on at least a portion of the membrane when supported by the membrane support.

8. The apparatus of claim 1, wherein the electric field generating mechanism is configured to induce oscillations only in a localised portion of the membrane.

9. The apparatus of claim 1, wherein the electric field generating mechanism is configured to generate an electric field in the vicinity of two opposed surfaces of the membrane when supported by the membrane support, the electric field in the vicinity of the two opposed surfaces of the membrane being in opposite directions.

10. The apparatus of claim 9, wherein the electric field is created by two electrodes, each disposed on an opposite side of a plane of the membrane.

11. The apparatus of claim 9, wherein the magnitude of the electric field is substantially equal on both sides of the membrane.

12. The apparatus of claim 2, wherein at least a portion of one or more electrodes has an insulating coating.

13. The apparatus of claim 1, further comprising a plasma generating mechanism.

14. The apparatus of claim 1, further comprising a chamber and a pump apparatus configured to control a pressure of an interior of a chamber and wherein the membrane support is disposed within the chamber.

15. The apparatus of claim 13, wherein the electric field generating mechanism comprises one or more electrodes, and wherein the plasma generating mechanism is configured to generate a plasma between the membrane when supported by the membrane support and the or each of the one or more electrodes.

16. The apparatus of claim 1, wherein the electric field generating mechanism comprises one or more electrodes and a mechanism configured to apply a voltage across a membrane when supported by the membrane support and the or each of the one or more electrodes and wherein the mechanism configured to apply the voltage is configured to apply a pulsed voltage across the membrane when supported by the membrane support and the or each of the one or more electrodes.

17. A method comprising: operating a membrane cleaning apparatus for removing particles from a membrane, the operating comprising: supporting the a membrane using a membrane support of the a membrane cleaning; and generating an electric field in the vicinity of the membrane when supported by the membrane support using an electric field generating mechanism of the membrane cleaning apparatus, wherein the electric field is configured to induce mechanical oscillations or deformation in the membrane when supported by the membrane support.

18. The apparatus of claim 1, wherein the electric field generating mechanism comprises at least two electrodes and each of the electrodes has a surface area facing toward a surface of the membrane that is less than the area of the surface of the membrane.

19. The apparatus of claim 18, wherein a first electrode of the at least two electrodes is disposed at a first side of a major surface of the membrane and a second electrode of the at least two least electrodes is disposed at a second, opposite side of the major surface of the membrane.

20. The apparatus of claim 19, wherein the first electrode is offset from the second electrode in a direction generally parallel to the major surface of the membrane.

* * * * *